(12) United States Patent
Salcedo et al.

(10) Patent No.: US 9,275,991 B2
(45) Date of Patent: Mar. 1, 2016

(54) APPARATUS FOR TRANSCEIVER SIGNAL ISOLATION AND VOLTAGE CLAMP

(71) Applicant: Analog Devices, Inc., Norwood, MA (US)

(72) Inventors: Javier Alejandro Salcedo, North Billerica, MA (US); Juan Luo, San Jose, CA (US)

(73) Assignee: ANALOG DEVICES, INC., Norwood, MA (US)

(*) Notice: Subject to any disclaimer, the term of this patent is extended or adjusted under 35 U.S.C. 154(b) by 207 days.

(21) Appl. No.: 13/766,541

(22) Filed: Feb. 13, 2013

(65) Prior Publication Data
US 2014/0225228 A1    Aug. 14, 2014

(51) Int. Cl.
*H01L 29/66* (2006.01)
*H01L 23/62* (2006.01)
*H01L 27/02* (2006.01)
*H01L 27/06* (2006.01)
*H01L 27/092* (2006.01)

(52) U.S. Cl.
CPC .......... *H01L 27/067* (2013.01); *H01L 27/0262* (2013.01); *H01L 27/0921* (2013.01)

(58) Field of Classification Search
None
See application file for complete search history.

(56) References Cited

U.S. PATENT DOCUMENTS 3,436,667 A    4/1969  Leonard
4,633,283 A   12/1986  Avery (Continued)

FOREIGN PATENT DOCUMENTS

DE   10 2007 040 875 A1   3/2009
EP       0 168 678 A2     1/1986

(Continued)

OTHER PUBLICATIONS

Salcedo et al., *Bidirectional Devices for Automotive-Grade Electrostatic Discharge Applications*, IEEE Electron Device Letters, vol. 33, No. 6, Jun. 2012, 3 pages.

(Continued)

*Primary Examiner* — Mamadou Diallo
*Assistant Examiner* — Jay C Chang
(74) *Attorney, Agent, or Firm* — Knobbe, Martens, Olson & Bear LLP

(57) ABSTRACT

An apparatus for transceiver signal isolation and voltage clamp from transient electrical events includes a bi-directional protection device comprising a bipolar PNPNP device assembly, a first parasitic PNPN device assembly, and a second parasitic PNPN device assembly. The bipolar PNPNP device assembly includes an NPN bi-directional bipolar transistor, a first PNP bipolar transistor, and a second PNP bipolar transistor, and is configured to receive a transient voltage signal through first and second pads. The first and second pads are electrically connected to the PNPNP device assembly through emitters of the first and second PNP bipolar transistors. The bipolar PNPNP device assembly is electrically connected to a first parasitic PNPN device assembly comprising a parasitic PNP bipolar transistor and a first parasitic NPN bipolar transistor. The bipolar PNPNP device assembly is further connected to a second parasitic parasitic PNPN device assembly comprising the parasitic PNP bipolar transistor and a second parasitic NPN bipolar transistor. The base of the parasitic PNP bipolar transistor is connected to the substrate of the transceiver through a resistor to prevent triggering and breakdown of the first and second parasitic PNPN device assemblies.

33 Claims, 26 Drawing Sheets

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,840 A | 4/1999 | Ohuchi et al. |
| 5,895,940 A | 4/1999 | Kim |
| 5,998,813 A | 12/1999 | Bernier |
| 6,097,068 A | 8/2000 | Brown et al. |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,784,489 B1 * | 8/2004 | Menegoli ................. 257/343 |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,217,461 B1 | 7/2012 | Chu et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,466,489 B2 | 6/2013 | Salcedo et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo et al. |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 2001/0040254 A1 | 11/2001 | Takiguchi |
| 2002/0021538 A1 | 2/2002 | Chen et al. |
| 2002/0109190 A1 | 8/2002 | Ker et al. |
| 2002/0122280 A1 | 9/2002 | Ker et al. |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164351 A1 | 8/2004 | Petruzzello et al. |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0133869 A1 | 6/2005 | Ker et al. |
| 2005/0151160 A1 | 7/2005 | Salcedo et al. |
| 2005/0173727 A1 | 8/2005 | Manna et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0145260 A1 | 7/2006 | Kim |
| 2006/0151836 A1 | 7/2006 | Salcedo et al. |
| 2006/0186467 A1 | 8/2006 | Pendharkar et al. |
| 2007/0007545 A1 | 1/2007 | Salcedo et al. |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0207409 A1 | 8/2011 | Ker et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0007207 A1 | 1/2012 | Salcedo |
| 2012/0008242 A1 | 1/2012 | Salcedo |
| 2012/0199874 A1 * | 8/2012 | Salcedo et al. ................. 257/120 |
| 2012/0205714 A1 | 8/2012 | Salcedo et al. |
| 2012/0293904 A1 | 11/2012 | Salcedo et al. |
| 2013/0032882 A1 | 2/2013 | Salcedo et al. |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 * | 5/2014 | Clarke et al. ................. 257/124 |
| 2014/0167104 A1 | 6/2014 | Salcedo |
| 2014/0167105 A1 | 6/2014 | Salcedo |
| 2014/0167106 A1 | 6/2014 | Salcedo |

FOREIGN PATENT DOCUMENTS

| | | |
|---|---|---|
| EP | 0 915 508 A1 | 5/1999 |
| EP | 1 703 560 A2 | 9/2006 |
| KR | 10-2006-0067100 | 2/2006 |

(56) References Cited

FOREIGN PATENT DOCUMENTS

| KR | 10-2009-0123683 | 12/2009 |
| KR | 10-2010-0003569 | 1/2010 |

OTHER PUBLICATIONS

Salcedo et al., *On-Chip Protection for Automotive Integrated Circuits Robustness*, IEEE 2012 8$^{th}$ International Caribbean Conference on Devices, Circuits and Systems (ICCDCS), 5 pages (2012).

Anderson et al., *ESD Protection under Wire Bonding Pads*, EOS/ESD Symposium 99-88, pp. 2A.4.1-2A.4.7 (1999).

Luh et al. *A Zener-Diode-Activated ESD Protection Circuit for Sub-Micron CMOS Processes*, IEEE International Symposium on Circuits and Systems, , May 28-31, 2000, Geneva, Switzerland, pp. V-65-V-68.

Salcedo et al., *Electrostatic Discharge Protection Framework for Mixed-Signal High Voltage CMOS Applications*, IEEE Xplore, downloaded Feb. 23, 2010 at 12:53 EST, 4 pages.

Betak, Petr, An Advanced SCR Protective Structure Against ESD Stress, 5 pages, undated.

Chang et al., High-k Metal Gate-bounded Silicon Controlled Rectifier for ESD Protection, 34th Electrical Overstress/Electrostatic Discharge Symposium, Sep. 2012, 7 pages.

European Patent Office Search Report for Application No. EP 14 16 7969 dated Oct. 24, 2014, 10 pages.

Parthasarathy, S., Salcedo, J.A., Hajjar, J., Analog Devices, Wilmington, MA, USA, Design of SCR Devices for SiGe BiCMOS Applications, Bipolar/BiCMOS Circuits and Technology Meeting (BCTM), 2011 IEEE, p. 235-238.

* cited by examiner

US 9,275,991 B2

APPARATUS FOR TRANSCEIVER SIGNAL ISOLATION AND VOLTAGE CLAMP

BACKGROUND

1. Field

Embodiments of the invention relate to electronics, and more particularly, to protection of communication transceivers from electrostatic discharge.

2. Description of the Related Technology

Certain electronic systems can be exposed to a transient electrical event, or an electrical signal of a relatively short duration having rapidly changing voltage and high power. Transient electrical events can include, for example, electrical overstress/electrostatic discharge (EOS/ESD) events arising from the abrupt release of charge from an object or person to an electronic system.

Transient electrical events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient electrical events can induce latch-up (in other words, inadvertent creation of a low-impedance path), thereby disrupting the functioning of the IC and potentially causing permanent damage to the IC.

SUMMARY

In one embodiment, an apparatus is provided on a p-type semiconductor substrate. The apparatus includes a first n-type well region, a second n-type well region, and a first p-type well region configured to form an NPN bi-directional transistor formed in the semiconductor substrate. The apparatus further includes a p-type tub configured to surround the NPN bi-directional transistor, an n-type tub configured to surround the p-type tub, and a p-type epitaxial region configured to surround the n-type tub, wherein the first n-type well region, the p-type tub, and the n-type tub are configured to form a first NPN bipolar transistor, and wherein the p-type epitaxial region, the n-type tub, and the p-type tub are configured to form a PNP bipolar transistor.

Another embodiment an apparatus is provided on a p-type semiconductor substrate. The apparatus includes a first n-type well region, a second n-type well region, and a first p-type well region of the p-type substrate, wherein the first n-type well region, the second n-type well region, and the first p-type well region are configured to form an NPN bi-directional transistor in the p-type semiconductor substrate. The apparatus further includes a p-type tub surrounding the NPN bi-directional transistor and an n-type tub surrounding the p-type tub. The apparatus further includes a first p-type active region disposed in the first n-type well region, wherein the first p-type active region, the first n-type well region, and the p-type tub are configured to form a first PNP bipolar transistor. The apparatus further includes a second p-type active region disposed in the second n-type well region, wherein the second p-type active region, the second n-type well region, and the p-type tub are configured to form a second PNP bipolar transistor, wherein the p-type epitaxial region, the n-type tub, and the p-type tub form a third PNP bipolar transistor.

DETAILED DESCRIPTION OF EMBODIMENTS

Figure 1:
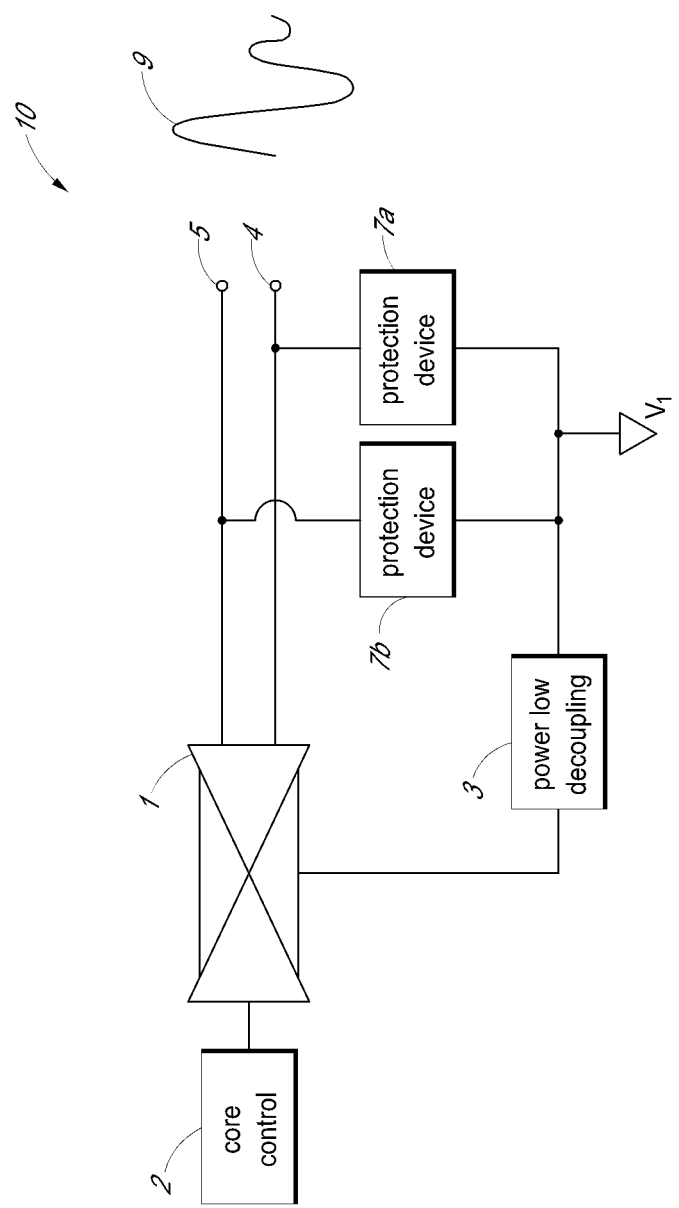
FIG. 1 is a schematic block diagram of one example of a transceiver system.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

ESD/EOS stress conditions are more severe in precision communication transceivers operating at variable positive and negative voltage swing and under harsh industrial and automotive environments. For enabling robust precision communication transceivers operating under such environments, limitations are encountered in existing art to discharge high voltage overstress without injecting a large current into the common substrate when the circuit is powered. The high substrate current injection, which can be referred to as majority carrier injection, can be caused by bipolar parasitic transistors formed between terminals of the protection device and a substrate. For instance, a parasitic PNP bipolar transistor can have an emitter formed from a p-type region of the protection device, a base formed from an n-type tub that surrounds the protection device, and a collector formed from a p-type substrate. The bipolar parasitic transistors can inject holes into the substrate, which can lead to unpredictable latch-up conditions in internal circuits formed in a common substrate with the protection device.

The effects of parasitic bipolar current injection may be mitigated by reducing the risk of latch-up path triggering by careful spacing between core circuit blocks and protection devices. However, such an approach can result in unpredictable design iterations, excessive silicon die area usage, extra energy consumption due to leakage injection into the substrate, and/or additional development cost. Thus, there is a need to provide a precision transceiver IC with on-chip protection from such harsh transient electrical environments. Furthermore, there is a need for providing a protection scheme permitting transceiver bi-directional operation voltage swing in the sub ±15 V range that is symmetric or asymmetric relative to a ground or power-low reference. Moreover, there is a need to clamp a transient stress voltage to a safe level within the transient safe operating area of the circuit and to discharge high stress conditions without injecting majority carriers into the substrate during powered stress conditions.
Overview of examples of electronic systems including protection devices FIG. 1 is a schematic block diagram of one example of a transceiver system 10. The transceiver system 10 includes a transceiver circuit 1, a core control circuit 2, a power low decoupling circuit 3, a first signal pin 4, a second signal pin 5, a first protection device 7a, and second protection device 7b.

The first and second pins 4, 5 are configured to receive a differential signal, such as a signal for a low voltage differential signaling (LVDS) interface. The transceiver circuit 1 is electrically connected to the first and second pins 4, 5, and can be used to receive and/or transmit signals over the differential signaling interface. The core control circuit 2 is configured to generate control signals for the transceiver circuit 1 so as to control the operation of signaling over the differential signaling interface. For example, the core control circuit 2 can be used to control the transceiver circuit 1 to provide full or half duplex signaling using the first and second pins 4, 5.

The first protection device 7a is electrically connected between a node of the first pin 4 and a first or power low voltage supply $V_1$, and the second protection device 7b is electrically connected between a node of the second pin 5 and the power low voltage supply $V_1$. The power low voltage supply $V_1$ can be, for example, a low impedance power low supply such as ground, and the first and second protection devices 7a, 7b can be used to protect the first and second pins 4, 5, respectively, from a transient electrical event 9. For example, when the transient electrical event 9 is received on the first pin 4, the first protection device 7a can divert or shunt current associated with the transient electrical event 9 to the power low voltage supply $V_1$. Likewise, when the transient electrical event 9 is received on the second pin 5, the second protection device 7b can shunt current to the power low voltage supply $V_1$. In certain implementations, the power low voltage supply $V_1$ is electrically connected to one or more power low pads or pins, such as ground pins.

The transient electrical event 9 can be a rapidly changing high energy signal such as an electrostatic discharge (ESD) event. The transient electrical event 9 can be associated with an overvoltage event caused by user contact. In other implementations, the transient electrical event 9 can be generated by a manufacturer to test the robustness of the transceiver system 10 under a defined stress condition, which can be described by standards set by various organizations, such as the Joint Electronic Device Engineering Council (JEDEC), the International Electrotechnical Commission (IEC), and the Automotive Engineering Council (AEC).

The power low decoupling circuit 3 can be used to isolate a power low voltage supply used by the transceiver circuit 1 from the power low voltage supply $V_1$ used by the first and second protection devices 7a, 7b to divert the current associated with the transient electrical event 9. For example, the power low decoupling circuit 3 can help prevent current from being injected into the transceiver circuit 1 through the power low voltage supply $V_1$ during the transient electrical event 9, thereby helping to prevent overvoltage conditions or latch-up in the transceiver system 10.

The first and second protection devices 7a, 7b can be integrated on-chip with the transceiver circuit 1, the core control circuit 2, and/or the power-low decoupling circuit 3. However, the first and second protection devices 7a, 7b can also be arranged on a separate IC, such as a separately packaged IC or an IC encapsulated in a common package with transceiver circuitry. Thus, the first and second protection devices 7a, 7b can be integrated with a transceiver in a common semiconductor substrate for system-on-a-chip applications, provided as a separate IC in a common package for system-on-a-package applications, or placed in a separately packaged standalone IC.

Electronic circuit reliability is enhanced by providing protection devices to the pins or pads of an IC. The protection devices can maintain the voltage level at the pads within a predefined safe range by transitioning from a high-impedance state to a low-impedance state when the voltage of the transient electrical event reaches a trigger voltage. Thereafter, the protection device can shunt at least a portion of the current associated with the transient electrical event before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for a protection device to be configurable for different current and voltage (I-V) blocking characteristics and able to render protection against positive and negative transient electrical events with fast operational performance and low static power dissipation at normal operating voltage conditions.

Figure 2:
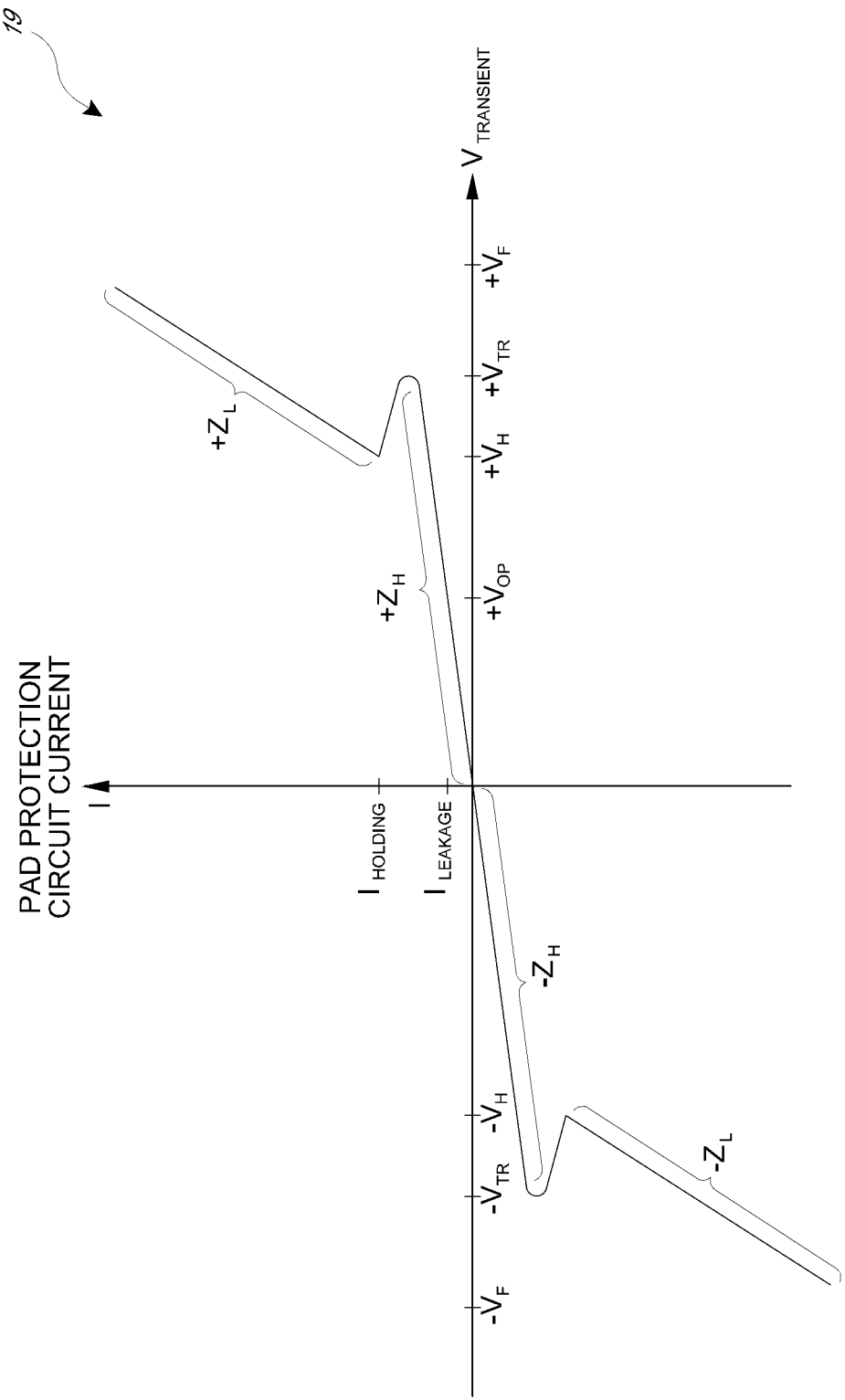
FIG. 2 is a graph showing a relationship between current and voltage of a bi-directional protection device according to one embodiment.

FIG. 2 is a graph 19 showing a relationship between current and voltage of a bi-directional protection device according to one embodiment. In FIG. 2, voltage is expressed along a horizontal axis, and current is expressed along a vertical axis. In the illustrated embodiment, the protection device has I-V characteristics that are symmetrical. In other implementations, the protection devices described herein can have asymmetrical I-V characteristics. For example, protection devices can have different trigger voltages, holding voltages, and/or failure voltages with different I-V curves in the positive and negative regions of the graph 19. As shown in the graph 19, the bi-directional protection device can transition from a high-impedance state $+Z_H$ to a low-impedance state $+Z_L$ when the voltage of the transient signal $V_{TRANSIENT}$ reaches a positive trigger voltage $+V_{TR}$. Thereafter, the bi-directional protection device can shunt a large amount of current and remain in the low-impedance state $+Z_L$ as long as the transient signal voltage level remains above a positive holding voltage $+V_H$. By configuring the protection device to have a trigger voltage $+V_{TR}$ and a holding voltage $+V_H$, the protection device can have improved performance while having enhanced stability against unintended activation.

The bi-directional protection device can also transition from a high-impedance state $-Z_H$ to a low-impedance state $-Z_L$ when the voltage of the transient signal $V_{TRANSIENT}$ reaches a negative trigger voltage $-V_{TR}$. The bi-directional protection device can remain in the low-impedance state $-Z_L$ as long as the voltage magnitude of the negative transient signal is greater than the voltage magnitude of the negative holding voltage $-V_H$. Bi-directional operation of the protection device can permit a reduction in layout area relative to a design that uses separate structures for protection against positive and negative transient electrical events, thereby enabling a more scalable design solution for low voltage operation.

As shown in FIG. 2, the bi-directional protection device can be configured to transition to a low-impedance state before the voltage of the transient signal $V_{TRANSIENT}$ reaches either a positive failure voltage $+V_F$ or a negative failure voltage $-V_F$ that can otherwise cause damage to the IC. When a normal operating voltage $+V_{OP}$ is present across the bi-directional protection device, the bi-directional protection device should conduct a relatively small leakage current $I_{LEAKAGE}$, thereby reducing or minimizing static power dissipation and enhancing the energy efficiency of the IC.

The bi-direction protection device can be configured to be very low leakage at normal operating voltages and to trigger during transient electrical events before internal or core devices reach overvoltage conditions. In certain implementations described herein, protection devices are configured to provide forward and reverse trigger voltages having magnitudes in the range of about 10 V to about 12 V and forward and reverse holding voltages having magnitudes in the range of about 2.5 V to about 5 V so as to limit the magnitude of the voltage across core devices to be less than about 14 V. However, other implementations are possible, including, for example, low noise precision applications in which a single-mode or dual-mode transceiver interface can operate symmetrically in the range of ±3 V, ±5 V, or asymmetrically, for instance in the range of about −1.8 V and 3.3 V. Additionally, the isolated protection device can be co-designed with the core circuit such that the trigger voltage is low enough to protect the transceiver interface, while at the same time the breakdown voltage is high enough to minimize leakage and risk of false triggering, such as at least 3 V to 4 V beyond the operating voltage.

Figure 3:
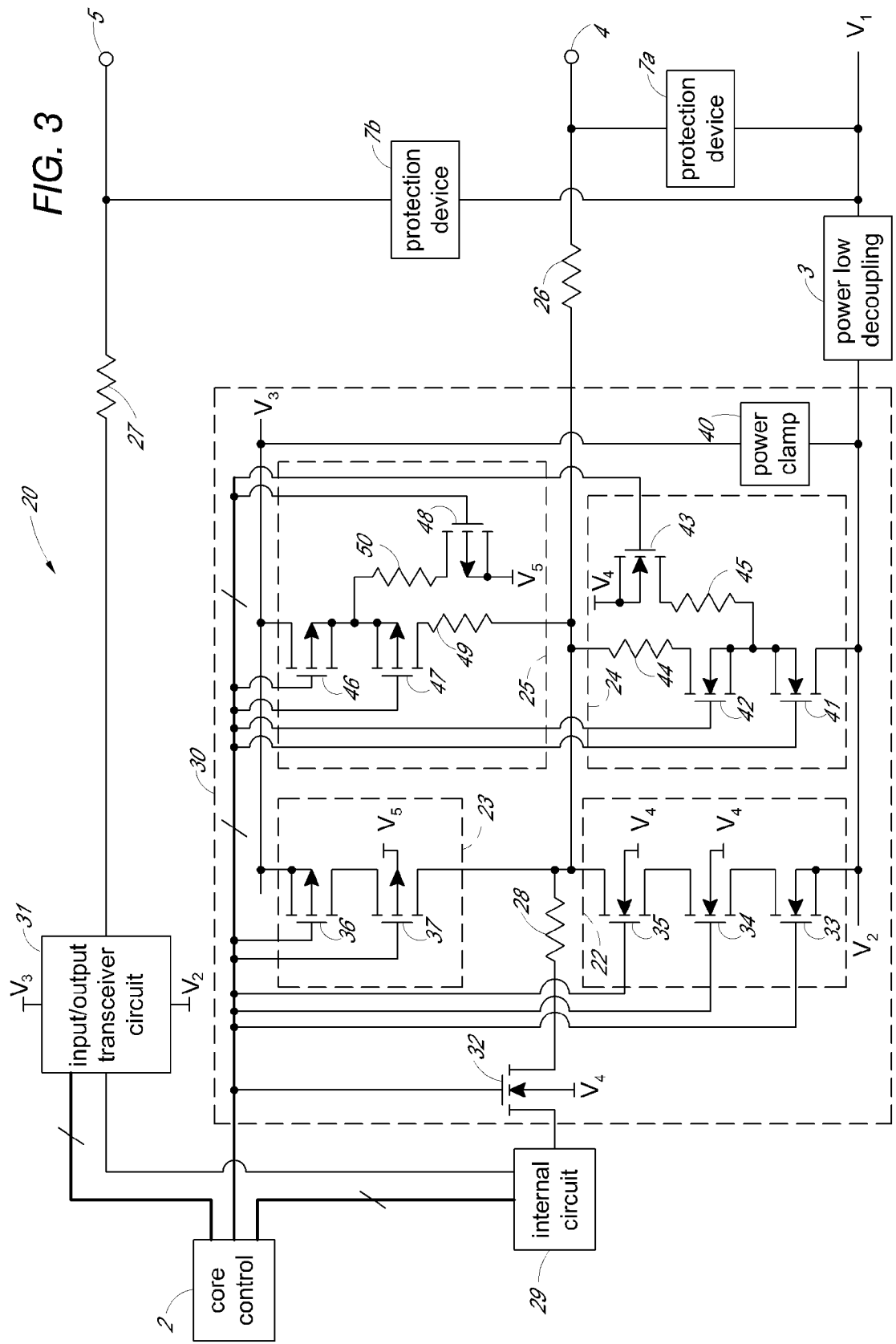
FIG. 3 is a circuit diagram of one example of a transceiver system interface.

FIG. 3 is a circuit diagram of one example of a transceiver system 20 or transceiver system interface, which can include one or more protection devices described herein. The transceiver system 20 includes the core control circuit 2, the power low decoupling circuit 3, the first and second pins 4, 5, the first and second protection devices 7a, 7b, first and second resistors 26, 27, an internal circuit 29, and first and second input/output transceiver circuits 30, 31. The transceiver system 20 can be, for example, an interface IC, such as a half or full duplex communication transceiver IC in which the first and second pins 4, 5 are directly exposed to a user, for instance, directly connected to the car cables or an industrial machinery hardness, in a normal operational environment. The transceiver system 20 can be used to communicate data over an interface, such as an interface associated with electrical cables connecting the first and second pins 4, 5 to an engine control unit (ECU) for an automobile or an industrial programmable logic controller (PLC).

The first and second input/output transceiver circuits 30, 31 are electrically connected to the first and second pins 4, 5 through the first and second resistors 26, 27, respectively. Inclusion of a resistor in the signal path between an input/output transceiver circuit and a pin can help prevent current associated with a transient electrical event received on the pin from being injected into the input/output transceiver circuit. However, including such a resistor can also impact the integrity of the signals received or transmitted using the input/output transceiver circuit. In certain implementations, the first and second resistor 26, 27 have a resistance selected to be in the range of about 0Ω (omitted or shorted) and about 15Ω, for example, about 10Ω. However, persons having ordinary skill in the art will readily ascertain other suitable resistance values, such as resistance values associated with signal processing integrity and/or minimum noise constraints.

The first and second protection devices 7a, 7b have been provided to protect the first and second input/output transceiver circuits 30, 31, the internal circuit 29, and/or the core control circuit 2 from damage due to transient electrical events received on the first and second pins 4, 5. The first protection device 7a is electrically connected between the first pin 4 and the power low voltage supply $V_1$ and the second protection device 7b is electrically connected between the first pin 4 and the power low voltage supply $V_1$. The first protection device 7a can be configured to transition from a high-impedance state to a low-impedance state in response to over or under voltage conditions on the first pin 4, thereby shunting current from the first pin 4 to the power low voltage supply $V_1$. Likewise, the second protection device 7b can be configured to transition from a high-impedance state to a low-impedance state in response to over or under voltage conditions on the second pin 5.

The illustrated power low decoupling circuit 3 is disposed in an electrical path between the first or power low voltage supply $V_1$ and a second or internal power low voltage supply $V_2$ that is used for power for the first and second input/output transceiver circuits 30, 31. Including the power low decoupling circuit 3 can help prevent latch-up of the first and second input/output transceiver circuits 30, 31 when a transient electrical event is received on the first and/or second pins 4, 5 by reducing majority carrier injection into a substrate used to form the input/output transceiver circuits. In certain implementations, the power low decoupling circuit 3 includes a resistor in series with one or more clamping structures, such as anti-parallel diodes and/or junction bipolar transistor structures.

The internal circuit 29 is electrically coupled to the first and second input/output transceiver circuits 30, 31, and can be used to process signals that are received by the first and second input/output transceiver circuits 30, 31. The core control circuit 2 generates control signals for each of the internal circuit 29, the first input/output transceiver circuit 30, and for the second input/output transceiver circuit 31.

The first input/output transceiver circuit 30 has been illustrated to include one example of circuitry suitable for transmitting and receiving signals over the first pin 4. Although not illustrated in FIG. 3 for clarity, the second input/output transceiver circuit 31 can have a similar circuit structure. The illustrated first input/output transceiver circuit 30 includes a first output circuit 22, a second output circuit 23, a first arbitration circuit 24, a second arbitration circuit 25, a third resistor 28, a first n-type metal oxide semiconductor (NMOS) transistor 32, and a power clamp 40. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics used in advanced sub-40-nanometer process technologies.

The first output circuit 22 and the second output circuit 23 can be used for electrically transmitting signals over the first pin 4. For example, the first output circuit 22 is electrically connected between the internal power low voltage supply $V_2$ and the first pin 4, and can be used to drive the voltage at the first pin 4 low. Additionally, the second output circuit 23 is electrically connected between a third or power high voltage supply $V_3$ and the first pin 4, and can be used to drive the voltage at the first pin 4 high.

The first output circuit 22 includes second to fourth NMOS transistors 33-35. The second NMOS transistor 33 includes a source and body electrically connected to the internal power low voltage supply $V_2$ and a drain electrically connected to a source of the third NMOS transistor 34. The fourth NMOS transistor 35 includes a source electrically connected to a drain of the third NMOS transistor 34 and a drain electrically connected to the first pin 4 through the first resistor 26. The third NMOS transistor 34 and the fourth NMOS transistor 35 each further include a body electrically connected to a fourth voltage supply $V_4$. In certain implementations, the fourth voltage supply $V_4$ is selected to be a voltage below the internal power low voltage supply $V_2$ to help achieve target signaling performance. For example, the signaling conditions on the first pin 4 may include positive and negative voltage signaling levels, and the fourth voltage supply $V_4$ can be used to prevent the bodies of the third and fourth NMOS transistor 34, 35 from becoming forward-biased when the first pin 4 has a relatively low voltage level. The second to fourth NMOS transistors 33-35 each further include a gate configured to be controlled using the core control circuit 2. In certain implementations, the voltage level of the gate of the second NMOS transistor 33 is controlled to provide a desired sink current of the first output circuit 22, the voltage level of the gate of the third NMOS transistor 34 is controlled to provide a desired resistance for adjusting the output impedance of the first output circuit 22, and the voltage level of the gate of the fourth NMOS transistor 35 is controlled to turn the first output circuit 22 on and off to generate a signal on the first pin 4.

The second output circuit 23 includes first and second p-type metal oxide semiconductor (PMOS) transistors 36, 37. The first PMOS transistor 36 includes a source and a body electrically connected to the power high voltage supply $V_3$ and a drain electrically connected to a source of the second PMOS transistor 37. The second PMOS transistor 37 further includes a drain electrically connected to the first pin 4 through the first resistor 26. The second PMOS transistor 37 further includes a body electrically connected to a fifth voltage supply $V_5$. In certain implementations, the fifth voltage supply $V_5$ is selected to be a voltage above the third voltage supply $V_3$, and can have a magnitude selected to help prevent the body of the second PMOS transistor 37 from becoming forward-biased when the voltage of the first pin 4 increases above the third voltage supply $V_3$. The first and second PMOS transistors 36, 37 each include a gate that can be controlled using the core control circuit 2. In certain implementations, the voltage level of the gate of the first PMOS transistor 36 is controlled to provide a desired source current of the second output circuit 23 and the voltage level of the gate of the second PMOS transistor 37 is controlled to turn the second output circuit 23 on and off to generate a signal on the first pin 4.

The first NMOS transistor 32 can be used to pass signals received on the first pin 4 to the internal circuit 29. The first NMOS transistor 32 includes a drain electrically connected to the internal circuit 29 and a source electrically connected to the first pin 4 through the first and third resistors 26, 28. The core control circuit 2 can control the potential of the gate of the first NMOS transistor 32, thereby controlling the impedance between the internal circuit 29 and the first pin 4 and allowing a voltage level on the first pin 4 to be sensed by the internal circuit 29. As illustrated in FIG. 2, the first NMOS transistor 32 can include a body electrically connected to the fourth potential $V_4$.

In certain implementations, the first and second arbitration circuits 24, 25 can be included to generate the fourth and fifth voltage supplies $V_4$, $V_5$, respectively. The first arbitration circuit 24 can control a voltage level of the fourth voltage supply $V_4$ to be equal to about the lesser of the internal power low voltage supply $V_2$ and the voltage of the first pin 4. Additionally, the second arbitration circuit 25 can control the voltage level of the fifth voltage supply $V_5$ to be equal to about the greater of the power high voltage supply $V_3$ and the voltage of the first pin 4. The first and second arbitration circuits 24, 25 can permit the voltage at the first pin 4 to fall below the internal power low voltage supply $V_2$ and to increase above the power high voltage supply $V_3$ during normal signaling conditions.

The first arbitration circuit 24 includes a fifth NMOS transistor 41, a sixth NMOS transistor 42, a seventh NMOS transistor 43, a fifth resistor 44, and a sixth resistor 45. The fifth NMOS transistor 41 includes a drain electrically connected to the internal power low voltage supply $V_2$ and a source and body electrically connected to a source and body of the sixth NMOS transistor 42 and to a first end of the sixth resistor 45. The sixth resistor 45 further includes a second end electrically connected to a drain of the seventh NMOS transistor 43. The seventh NMOS transistor 43 further includes a source and a body electrically connected to the fourth voltage supply $V_4$. The fifth resistor 44 includes a first end electrically connected to a drain of the sixth NMOS transistor 42 and a second end electrically connected to the first pin 4 through the first resistor 26. The fifth to seventh NMOS transistors 41-43 each further include a gate controlled using the core control circuit 2. The second arbitration circuit 25 includes a third PMOS transistor 46, a fourth PMOS transistor 47, a fifth PMOS transistor 48, a seventh resistor 49, and an eighth resistor 50. The third PMOS transistor 46 includes a drain electrically connected to the third voltage supply $V_3$ and a source and body electrically connected to a source and body of the fourth PMOS transistor 47 and to a first end of the eighth resistor 50. The eighth resistor 50 further includes a second end electrically connected to a drain of the fifth PMOS transistor 48. The fifth PMOS transistor 48 further includes a source and a body electrically connected to the fifth voltage supply $V_5$. The third to fifth PMOS transistors 46-48 each further include a gate controlled using the core control circuit 2. The seventh resistor 49 includes a first end electrically connected to a drain of the fourth PMOS transistor 47 and a second end electrically connected to the first pin 4 through the first resistor 26.

When a transient electrical event is received on the first pin 4, the voltage of the first pin 4 can increase until a trigger voltage of the first protection device 7a is reached (see FIG. 2). However, in certain implementations, there can be an overshoot of voltage on the first pin 4 before the first protection device 7a activates. In one embodiment, the first and second arbitration circuits 24, 25 and the first and second output circuits 22, 23 are configured to have a trigger voltage greater than an overshoot voltage of the first protection device 7a to aid in preventing the arbitration circuits 24, 25 and/or the output circuits 22, 23 from breaking down before the first protection device 7a activates during a transient electrical event. In one implementation, at least two p-n junctions are disposed in each electrical path between the first pin 4 and the internal power low voltage supply $V_2$ to prevent a parasitic path between the first pin 4 and the internal power low voltage supply $V_2$ from activating before the first protection device 7a turns on during the transient electrical event. As shown in FIG. 3, at least two p-n junctions can be provided in these circuits between the first pin 4 and the internal power low voltage supply $V_2$ by cascading MOS transistor devices. In certain implementations, the power clamp 40 can also be included and configured to have a fewer number of devices in a cascade than a number of devices cascaded in the first output circuit 22 so as to help reduce overshoot.

The fifth and seventh resistors 44, 49 can be included in the first and second arbitration circuits 24, 25, respectively, to increase the impedance in parasitic electrical paths between the first pin 4 and the second voltage supply $V_2$ through the first and second arbitration circuits 24, 25. In one implementation, the fifth and seventh resistors 44, 49 each have a resistance selected to be in the range of about 30 ohms ($\Omega$) and about 85$\Omega$, for example, about 72$\Omega$. The sixth and eighth resistors 45, 50 can also aid in increasing the impedance in parasitic paths between the first pin 4 and the internal power low voltage supply $V_2$ through the first and second arbitration circuits 24, 25, as well as to aid the first and second arbitration circuits 24, 25 in generating the fourth and fifth voltage supplies $V_4$, $V_5$, respectively. In certain implementations, the sixth and eighth resistors 45, 50 each have a resistance selected to be in the range of about 30$\Omega$ and about 85$\Omega$, for example, about 75$\Omega$. Although various resistor values have been described above, persons having ordinary skill in the art will readily ascertain other suitable resistance values.

The transceiver system 10 of FIG. 1 and the transceiver system 20 of FIG. 3 illustrates two examples of electronic systems suitable for use with the protection devices described herein. However, the transceiver systems can be configured in other ways to meet communication protocol constraints and/or false condition tolerances. Additionally, although the protection devices have been illustrated in the context of transceiver systems, the protection devices described herein can be used in a wide range of ICs and other electronics, including, for example, industrial control systems, interface systems, power management systems, microelectromechanical system (MEMS) sensor systems, automotive systems, wireless infrastructure systems, and/or digital signal processing (DSP) systems. Additionally, although the transceiver systems have been illustrated as including two signal pins and two protection devices, more or fewer protection devices and pins can be included to meet system specifications. Furthermore, the protection devices can be arranged in other ways, such as by electrically connecting each protection device between a pin and a power high pin.

Dual-Tub-Isolated Bi-Directional Protection Devices

Dual-tub-isolated bi-directional protection devices and methods of forming the same are provided herein. In certain implementations, the bi-directional protection device includes a bi-directional NPN bipolar transistor including an emitter/collector formed from a first n-well region, a base formed from a p-well region, and a collector/emitter formed from a second n-well region. P-type active regions are formed in the first and second n-well regions to form a PNPNP structure, which is isolated from the substrate using dual-tub isolation having an n-type isolation region or tub and a p-type isolation region or tub. The dual-tub isolation prevents the wells associated with the PNPNP structure from injecting carriers into the substrate during a transient electrical event and from interacting with external components and circuitry. For example, the dual-tub isolation prevents formation of parasitic bipolar structures that include an emitter formed from a well of the PNPNP structure and a collector formed from the substrate, thereby increasing isolation of the protection device from the substrate and enhancing IC latch-up immunity. Latch-up is often observed in precision transceivers applications when large stress conditions are obtained at the IC pin while the IC is powered. In certain implementations, the size, spacing, and doping concentrations of active regions and wells associated with the PNPNP structure can be selected to provide fine-tuned control of the trigger and holding voltage characteristics to enable the bi-directional protection device to be implemented in applications using low voltage precision interface signaling. The bi-directional protection devices can be used to provide latch-up robustness to a bulk-isolated bipolar complementary metal oxide semiconductor (CMOS) diffusion metal oxide semiconductor (DMOS) (BCD) process to a level comparable to a silicon-on-insulator (SOI) process at a substantially lower cost.

Figure 4:
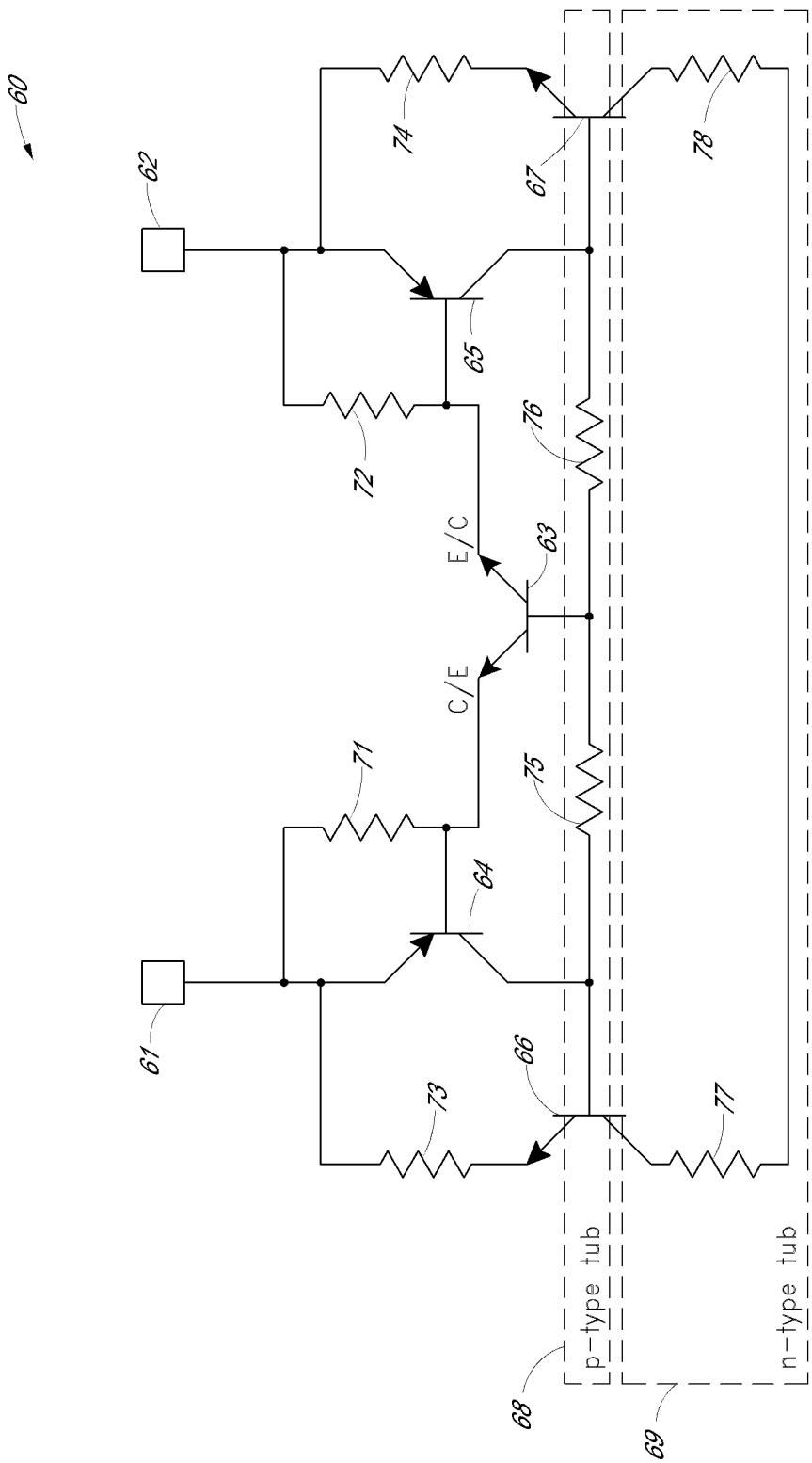
FIG. 4 is a circuit diagram illustrating a bi-directional protection circuit according to one embodiment.

FIG. 4 is a circuit diagram illustrating a bi-directional protection circuit 60 according to one embodiment. The illustrated protection circuit 60 is electrically connected between a first pin or pad 61 and a second pin or pad 62, and can be used to provide low voltage bi-directional blocking voltage protection. The bi-directional protection circuit 60 includes an NPN bi-directional bipolar transistor 63, first and second PNP bipolar transistors 64, 65, first and second parasitic NPN bipolar transistors 66, 67, and first to eighth resistors 71-78. The protection circuit 60 can be adapted to serve, for example, any of the protection devices 7a, 7b of FIGS. 1 and 3.

The protection circuit 60 can provide a current shunt path between the first and second pads 61, 62 when there is an overvoltage or undervoltage condition. For example, the first pad 61 can be a signal pin or pad of an IC, such as the first and second signal pins 4, 5 of FIGS. 1 and 3, and the second pad 62 can be a power low pin or pad, such as a pad associated with the power low voltage supply $V_1$ of FIGS. 1 and 3. In certain implementations, the second pad 62 is a ground pad or a pad intended to be coupled to a ground reference.

The first PNP bipolar transistor 64 includes an emitter electrically connected to the first pad 61, to a first end of the first resistor 71, and to a first end of the third resistor 73. The first PNP bipolar transistor 64 further includes a base electrically connected to a collector/emitter C/E of the NPN bi-directional bipolar transistor 63 and to a second end of the first resistor 71. The first PNP bipolar transistor 64 further includes a collector electrically connected to a first end of the fifth resistor 75 and to a base of the first NPN bipolar transistor 66. The first NPN bipolar transistor 66 further includes an emitter electrically connected to a second end of the third resistor 73 and a collector electrically connected to a first end of the seventh resistor 77. The second PNP bipolar transistor 65 includes an emitter electrically connected to the second pad 62, to a first end of the second resistor 72, and to a first end of the fourth resistor 74. The second PNP bipolar transistor 65 further includes a base electrically connected to an emitter/collector E/C of the NPN bi-directional bipolar transistor 63 and to a second end of the second resistor 72. The second PNP bipolar transistor 65 further includes a collector electrically connected to a first end of the sixth resistor 76 and to a base of the second NPN bipolar transistor 67. The sixth resistor 76 further includes a second end electrically connected to a second end of the fifth resistor 75 and to a base of the NPN bi-directional bipolar transistor 63. The second NPN bipolar transistor 67 further includes an emitter electrically connected to a second end of the fourth resistor 74 and a collector electrically connected to a first end of the eighth resistor 78. The eighth resistor 78 further includes a second end electrically connected to a second end of the seventh resistor 77.

The NPN bi-directional bipolar transistor 63 can operate bi-directionally, and the operation of the emitter/collector E/C and the collector/emitter C/E as emitter and collector can depend on the voltage conditions of the first and second pads 61, 62. For example, when a voltage difference between the first pad 61 and the second pad 62 is greater than about a positive trigger voltage $+V_{TR}$ (see FIG. 2) of the protection circuit 60, the emitter/collector E/C of the NPN bi-directional bipolar transistor 63 serves as an emitter and the collector/emitter C/E of the bi-directional bipolar transistor serves as a collector. In contrast, when a voltage difference between the first pad 61 and the second pad 62 is less than about a negative trigger voltage $-V_{TR}$ (see FIG. 2) of the protection circuit 60, the emitter/collector E/C of the NPN bi-directional bipolar transistor 63 serves as a collector and the collector/emitter C/E of the NPN bi-directional bipolar transistor 63 serves as an emitter.

When a transient electrical event increases the voltage of the first pad 61 with respect to the second pad 62 the NPN bi-directional bipolar transistor 63 and the first PNP bipolar transistor 64 operate as a first cross-coupled bipolar PNPN or silicon controlled rectifier (SCR)-like structure. In particular, the NPN bi-directional bipolar transistor 63 and the first PNP bipolar transistor 64 are arranged in feedback such that an increase in the collector current of the first PNP bipolar transistor 64 increases the base current of the NPN bi-directional bipolar transistor 63 and an increase in the collector current of the NPN bi-directional bipolar transistor 63 increases the base current of the first PNP bipolar transistor 64. As the voltage between the first and second pads 61, 62 increases during a positive transient electrical event and reaches a forward trigger voltage of the protection circuit 60, the feedback between the NPN bi-directional bipolar transistor 63 and the first PNP bipolar transistor 64 can be regenerative and cause the protection circuit 60 to enter a low-impedance state. Thereafter, the feedback between the transistors can maintain the protection circuit 60 in the low-impedance state as long as the voltage across the first and second pads 61, 62 exceeds a forward holding voltage of the protection circuit 60. When a transient electrical event decreases the voltage of the first pad 61 with respect to the second pad 62 the NPN bi-directional bipolar transistor 63 and the second PNP bipolar transistor 65 operate as a second cross-coupled bipolar PNPN or SCR-like structure, which can operate in a manner similar to that described above. Since the first and second cross-coupled bipolar PNPN structures each include the NPN bi-directional bipolar transistor 63, the first and second cross-coupled bipolar PNPN structures are referred to herein as collectively operating as a PNPNP structure.

The forward trigger and holding voltages of the protection circuit 60 can be varied by controlling the gain and conduction strength of the NPN bi-directional bipolar transistor 63 relative to the gain and conduction strength of the first PNP bipolar transistor 64 as well as by selecting the value of the first resistor 71, which is disposed across the base-emitter junction of the first PNP bipolar transistor 64 and can expedite the turn-on of the first PNP bipolar transistor 64 during a transient electrical event. Likewise, the reverse trigger and holding voltages of the protection circuit 60 can be varied by controlling the gain and conduction strength of the NPN bi-directional bipolar transistor 63 relative to the gain and conduction strength of the second PNP bipolar transistor 65 and by selecting the value of the second resistor 72. The size, spacing, and doping concentrations of active regions and wells associated with the NPN bi-directional bipolar transistor 63 and the first and second PNP bipolar transistors 64, 65 can be selected to provide fine-tuned control of the trigger and holding voltage characteristics to enable the protection circuit 60 to be implemented in applications using low voltage precision interface signaling.

The protection circuit 60 includes dual-tub isolation that prevents the protection circuit 60 from interacting with external components and circuitry formed in a common substrate with the protection circuit 60, thereby providing an IC with superior latch-up immunity. In particular, as shown in FIG. 4, the bases of the first and second NPN bipolar transistors 66, 67 and the fifth and sixth resistors 75, 76 are associated with a p-type isolation region or tub 68, while the collectors of the first and second NPN bipolar transistors 66, 67 and the seventh and eighth resistors 77, 78 are associated with an n-type isolation region or tub 69. The dual-tub isolation prevents the formation of parasitic bipolar structures to the substrate and reduces the amount of charge the protection circuit 60 injects into the substrate during a transient electrical event received between the first and second pads 61, 62.

Figure 5A:
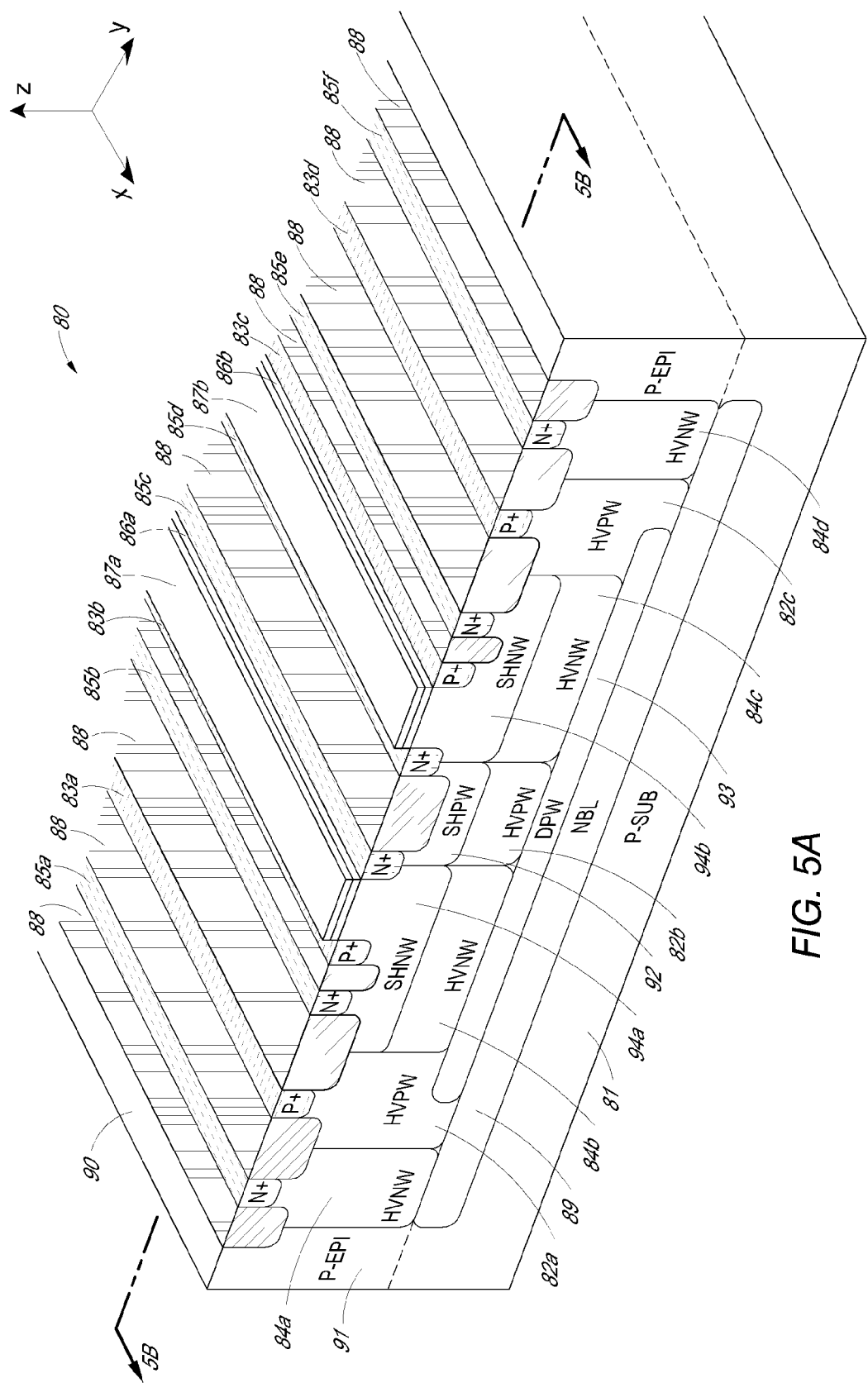
FIG. 5A is a schematic perspective view of a dual-tub-isolated bi-directional protection device implementing the protection circuit of FIG. 4 according to one embodiment.
Figure 5B:
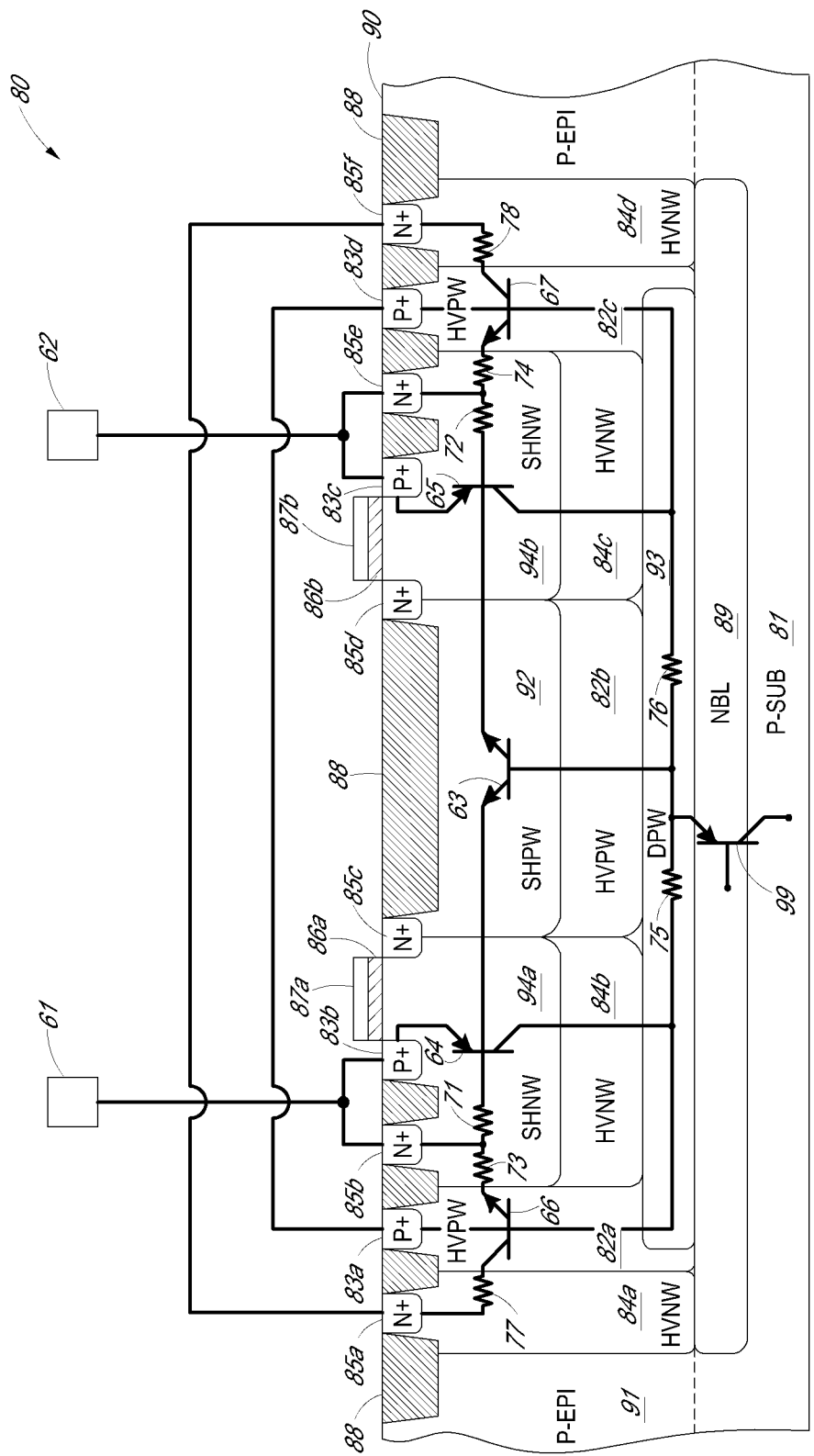
FIG. 5B is an annotated cross section view of the dual-tub-isolated protection device of FIG. 5A taken along the lines 5B-5B.

FIG. 5A is a schematic perspective view of a dual-tub-isolated bi-directional protection device 80 implementing the protection circuit 60 of FIG. 4 according to one embodiment. The protection device 80 includes a p-type substrate (P-SUB) 81, an n-type buried layer (NBL) 89, a p-type epitaxial layer (P-EPI) 91, a deep p-well (DPW) 93, first to fourth high voltage n-wells (HVNWs) 84a-84d, first to third high voltage p-wells (HVPWs) 82a-82c, first and second shallow n-wells (SHNWs) 94a, 94b, shallow p-well (SHPW) 92, first to fourth p-type active (P+) regions 83a-83d, first to sixth n-type active (N+) regions 85a-85f, first and second gate oxide layers 86a, 86b, first and second gates 87a, 87b, and oxide regions 88. FIG. 5B is a cross section view of the protection device 80 of FIG. 5A, taken along the lines 5B-5B. The protection device 80 of FIG. 5B has been annotated to show equivalent circuit devices formed from the illustrated structure, such as the NPN bi-directional bipolar transistor 63, the first and second PNP bipolar transistors 64, 65, the first and second NPN bipolar transistors 66, 67, and the first to eighth resistors 71-78 of FIG. 4. Additionally, the cross section has been annotated to show the first and second pads 61, 62 as well as electrical connections within the protection device 80 and to the pads.

The NBL 89 is formed in the P-SUB 81, the P-EPI 91 is formed over the P-SUB 81, and the DPW 93 is formed in the P-EPI 91 over the NBL 89. In certain implementations, the P-EPI 91 is a lightly doped region allowing the operation at relatively high voltage conditions, typically up to 300 V, in mixed-signal high voltage bipolar-CMOS-DMOS (BCD) process technologies for precision transceiver applications. The first to fourth HVNWs 84a-84d and the first to third HVPWs 82a-82c are formed in the P-EPI 91 such that the first HVPW 82a is between the first and second HVNWs 84a, 84b, the second HVPW 82b is between the second and third HVNWs 84b, 84c, and the third HVPW 82c is between the third and fourth HVNWs 84c, 84d. As shown in FIG. 5A, the first and third HVPWs 82a, 82c and the DPW 93 form a p-type isolation region or tub that surrounds the bottom and sides of the second and third HVNW 84b, 84c and the second HVPW 82b and the structures and devices formed therein. In particular, the DPW 93 extends beneath the second and third HVNWs 84b, 84c and the second HVPW 82b, while the first and third HVPWs 82a, 82c contact the DPW 93 and surround the sides of the second and third HVNWs 84b, 84c and the second HVPW 82b. Additionally, the first and fourth HVNWs 84a, 84d and the NBL 89 form an n-type isolation region or tub that surrounds the p-type tub. In particular, the NBL 89 extends beneath the DPW 93 and the first and third HVPWs 82a, 82c, while the first and fourth HVNWs 84a, 84d contact the NBL 89 and surround the sides of the first and third HVPWs 82a, 82c. The dual tub structure formed from the p-type tub and n-type tub can fully isolate the protection device 80 from other devices formed in the P-SUB 81 and/or P-EPI 91.

The first SHNW 94a is formed in the second HVNW 84b, the second SHNW 94b is formed in the third HVNW 84c, and the SHPW 92 is formed in the second HVPW 82b. The first and sixth N+ regions 85a, 85f are formed in the first and fourth HVNWs 84a, 84d, respectively, and the first and fourth P+ regions 83a, 83d are formed in the first and third HVPWs 82a, 82c, respectively. The first and second gate oxide layers 86a, 86b are formed on a surface 90 of the P-EPI 91 over the first and second SHNWs 94a, 94b, respectively. The first and second gates 87a, 87b are formed over the first and second gate oxide layers 86a, 86b, respectively, and can be polysilicon layers. At each side of the gate oxide layers 86a, 86b, spacer isolation regions (not shown) can be formed as part of the manufacturing process. The third N+ region 85c is on a first side of the first gate 87a, and includes a first portion in the SHPW 92 and a second portion in the first SHNW 94a. The second P+ region 83b is in the first SHNW 94a on a second side of the first gate 87a opposite the first side. The fourth N+ region 85d is on a first side of the second gate 87b, and includes a first portion in the SHPW 92 and a second portion in the second SHNW 94b. The third P+ region 83c is in the second SHNW 94b on a second side of the second gate 87b opposite the first side. The second N+ region 85b is in the first SHNW 94a on a side of the second P+ region 83b opposite the first gate 87a. The fifth N+ region 85e is in the second SHNW 94b on a side of the third P+ region 83c opposite the second gate 87b.

The illustrated protection device 80 includes the oxide regions 88. Formation of the isolation regions can involve etching trenches in the P-EPI 91, filling the trenches with a dielectric, such as silicon dioxide ($SiO_2$), and removing the excess dielectric using any suitable method, such as chemical-mechanical planarization. In certain implementations, the oxide regions 88 can be shallow trench regions or local oxidation of silicon (LOCOS) regions disposed between active regions.

The protection device 80 can be formed using any suitable manufacturing process. In one embodiment, the P-SUB 81 can be implanted with the NBL 89, and the P-EPI 91 can be grown over the P-SUB 81 and NBL 89 using an epitaxial growth process. Thereafter, the DPW 93 can be implanted in the P-EPI 91, and the HVPWs 82a-82c and HVNWs 84a-84d can be implanted in the P-EPI 91. Next, the SHPW 92 and SHNWs 94a, 94b can be implanted, and the oxide regions 88 can be formed in the P-EPI 91 as previously described above. Thereafter the gate oxide layers 86a, 86b and the gates 87a, 87b can be formed over the surface 90 of the P-EPI 91, followed by implantation of the N+ regions 85a-85f and P+ regions 83a-83d. Although one possible manufacturing process of the protection device 80 has been described, variations and other implementations are possible as will be recognized by persons of ordinary skill in the art.

In one embodiment, the P+ regions 83a-83d and the N+ regions 85a-85f have a depth into the surface 90 of the P-EPI 91 in the range of about 0.15 micrometers (μm) and about 0.5 μm, for example, about 0.2 μm, the SHPW 92 and the SHNWs 94a, 94b have a depth into the P-EPI 91 in the range of about 0.5 μm and about 1.5 μm, for example, about 1.0 μm, and the HVPWs 82a-82c and HVNWs 84a-84d have a depth into the P-EPI 91 in the range of about 3.0 μm and about 4.5 μm, for example, about 3.5 μm. Additionally, the P-EPI 91 can have a thickness in the range of about 4 μm and about 6 μm, for example, about 4.5 μm, and the peak doping of the NBL 89 can have a depth into the P-SUB 81 in the range of about 4.0 μm and about 5.5 μm, for example, about 5.0 μm. As shown in FIGS. 5A-5B, the HVPWs 82a-82c can have a depth sufficient to reach the DPW 93, and the HVNWs 84a-84d can have a depth sufficient to reach the NBL 89. The depth of the DPW doping peak can be in the range of 1.5 μm to 3 μm, for example, 2.0 μm. In certain implementations, the oxide regions 88 can be relatively deeper than the P+ regions 83a-83d and the N+ regions 85a-85f. Although various examples of depths have been described above, persons having ordinary skill in the art will readily ascertain other suitable depth values.

In one embodiment, the P-SUB 81 has a peak doping concentration in the range of about $0.5 \times 10^{15}$ atoms per cubic centimeter ($cm^{-3}$) to about $1.5 \times 10^{15}$ $cm^{-3}$, for example, about $1.0 \times 10^{15}$ $cm^{-3}$, the P-EPI 91 has a peak doping concentration in the range of about $1 \times 10^{14}$ $cm^{-3}$ to about $8.0 \times 10^{14}$ $cm^{-3}$, for example, about $2.0 \times 10^{14}$ $cm^{-3}$. Additionally, the DPW 93 has a peak doping concentration in the range of about $8 \times 10^{16}$ $cm^{-3}$ to about $2 \times 10^{17}$ $cm^{-3}$, for example, about $1.0 \times 10^{17}$ $cm^{-3}$, and the NBL 89 has a peak doping concentration in the range of about $0.5 \times 10^{17}$ $cm^{-3}$ to about $4 \times 10^{17}$ $cm^{-3}$, for example, about $2.5 \times 10^{17}$ $cm^3$. Furthermore, the P+ regions 83a-83d and the N+ regions 85a-85f have a peak doping concentration in the range of about $1 \times 10^{20}$ $cm^{-3}$ to about $8 \times 10^{20}$ $cm^{-3}$, for example, about $5 \times 10^{20}$ $cm^{-3}$, the SHPW 92 and the SHNWs 94a, 94b have a peak doping concentration in the range of about $2.5 \times 10^{17}$ $cm^{-3}$ to about $9.5 \times 10^{17}$ $cm^{-3}$, for example, about $7.0 \times 10^{17}$ $cm^{-3}$, and the HVPWs 82a-82c and HVNWs 84a-84d have a peak doping concentration in the range of about $1.5 \times 10^{16}$ $cm^{-3}$ to about $7.5 \times 10^{16}$ $cm^{-3}$, for example, about $3.0 \times 10^{16}$ $cm^{-3}$. Accordingly, the HVPWs 82a-82c can have a peak doping concentration that is less than a peak doping concentration of the SHPW 92, but a depth of the HVPWs 82a-82c can be greater than a depth of the SHPW 92. Similarly, the HVNWs 84a-84d can have a peak doping concentration that is less than a peak doping concentration of the SHNWs 94a, 94b, but a depth of the HVNWs 84a-84d can be greater than a depth of the SHNWs 94a, 94b. Although various ranges of peak doping concentrations and depth have been described above, persons having ordinary skill in the art will readily ascertain other suitable doping concentrations.

The protection device 80 can undergo back end processing to form contacts and metallization. Additionally, although not illustrated in FIGS. 5A-5B, the P-SUB 81 can also include other devices or structures formed therein. Skilled artisans will appreciate that these details have been omitted from this figure for clarity.

With reference now to FIG. 5B, the first pad 61 is electrically connected to the second P+ region 83b and to the second N+ region 85b, and the second pad 62 is electrically connected to the third P+ region 83c and to the fifth N+ region 85e. Additionally, the first N+ region 85a is electrically connected to the sixth N+ region 85f, and the first P+ region 83a is electrically connected to the fourth P+ region 83d. The NPN bi-directional bipolar transistor 63 includes a collector/emitter C/E formed from a first n-well region including the first SHNW 94a and the second HVNW 84b, a base formed from a p-well region including the SHPW 92 and the HVPW 82b, and an emitter/collector E/C formed from a second n-well region including the second SHNW 94b and the third HVNW 84c. The first PNP bipolar transistor 64 includes an emitter formed from the second P+ region 83b, a base formed from the first SHNW 94a and the second HVNW 84b, and a collector formed from the DPW 93. The second PNP bipolar transistor 65 includes an emitter formed from the third P+ region 83c, a base formed from the second SHNW 94b and the third HVNW 84c, and a collector formed from the DPW 93. The first NPN bipolar transistor 66 includes an emitter formed from the first SHNW 94a, a base formed from the first HVPW 82a, and a collector formed from the first HVNW 84a. The second NPN bipolar transistor 67 includes an emitter formed from the second SHNW 94b, a base formed from the third HVPW 82c, and a collector formed from the fourth HVNW 84d. The first and third resistors 71, 73 are formed from the resistance of the first SHNW 94a, and the second and fourth resistors 72, 74 are formed from the resistance of the second SHNW 94b. The fifth and sixth resistors 75, 76 are formed from the resistance of the DPW 93, and the seventh and eighth resistors 77, 78 are formed from the resistances of the first and fourth HVNWs 84a, 84d, respectively.

As shown in FIG. 5B, the n-type tub formed from the NBL 89 and the first and fourth HVNWs 84a, 84d can be electrically floating. Additionally, the p-type tub formed from the DPW 93 and the first and third HVPWs 82a, 82c can be electrically floating. Configuring the p-type tub and the n-type tub in this manner can increase the maximum allowable voltage swing on the first and second pads 61, 62 relative to a configuration in which the p-type tub and/or n-type tub are electrically biased to a fixed potential. However, in some configurations, such as low-leakage implementations, the p-type tub and/or the n-type tub can be electrically connected to a voltage supply. For example, the p-type tub can be electrically connected via a high impedance in the range of 1 megaohm (M-ohm) to a power low voltage supply equal to or less than a minimum operational voltage of the first and second pads 61, 62 and the n-type tub can be electrically connected to a power high voltage supply equal to or greater than a maximum operational voltage of the first and second pads 61, 62. In one embodiment, the n-type tub is electrically connected to a power high voltage supply equal to or greater than a maximum operational voltage of the first and second pads 61, 62 to provide stronger isolation of the protection device from the substrate, while the p-type tub is configured to be electrically floating to provide maximum bi-directional voltage swing between the first and second pads 61, 62.

In a manner similar to that described earlier, the protection characteristics of the protection device 80 can be varied by controlling a PNPNP structure associated with the protection device 80. For example, the forward trigger and holding voltages of the protection device 80 can be varied by controlling the resistances and relative device strengths of a first PNPN structure associated with the NPN bi-directional bipolar transistor 63 and the first PNP bipolar transistor 64, and the reverse trigger and holding voltages of the protection device 80 can be varied by controlling the resistances and relative device strengths of a second PNPN structure formed from the NPN bi-directional bipolar transistor 63 and the second PNP bipolar transistor 65. The first and second PNPN structures collectively operate as a PNPNP structure. In the illustrated configuration, the SHPW 92 and the first and second SHNWs 94a, 94b have been included in the protection device 80 to control breakdown near the device's surface. To further control the device's protection characteristics, the third and fourth N+ regions 85c, 85d have been included along the boundaries between the SHPW 92 and first and second SHNWs 94a, 94b. The third and fourth N+ regions 85c, 85d have a higher doping concentration than the first and second SHNWs 94a, 94b and thus can be used to control the breakdown voltage of the NPN bi-directional bipolar transistor 63 and enhance feedback within the PNPNP structure during a transient electrical event.

Additionally, the protection device 80 includes the first and second gates 87a, 87b, which do not include conventional metal oxide semiconductor (MOS) transistor formation, since active regions of different doping polarities have been implanted on opposing sides of each of the first and second gates 87a, 87b. However, during a transient electrical event that increases the voltage of the first pad 61 relative to the voltage of the second pad 62, current can flow with more lateral uniformity from the first pad 61 to the first gate 87a, thereby providing a conduction path under the first gate 87a for which carriers can reach the third N+ region 85c and stimulate breakdown. Likewise, during a transient electrical event that increases the voltage of the second pad 62 relative to the voltage of the first pad 61, a current can flow with more lateral uniformity from the second pad 62 to the second gate 87b, thereby providing a conduction path under the second gate 87b for which carriers can reach the fourth N+ region 85d. However, during normal operating conditions, even at relatively high quasi-static voltages, the impedance between the first and second pads 61, 62 and the third and fourth N+ active regions 85c, 85d can be relatively high, thereby providing enhanced protection against unintended activation of the protection device 80 and minimizing standing leakage current.

The dual-tub isolation used in the protection device 80 prevents the formation of parasitic bipolar structures to the P-SUB 81, thereby enhancing the isolation of the protection device 80. For example, the protection device 80 has been annotated to show a parasitic PNP bipolar transistor 99 including an emitter formed from the DPW 93, a base formed from the NBL 89 and a collector formed from the P-SUB 81. As shown in FIG. 5B, the parasitic PNP bipolar transistor 99 includes an emitter and base formed from the p-type tub and the n-type tub rather than from the wells used to form the NPN bi-directional bipolar transistor 63, such as the SHNWs 94a, 94b and SHPW 92. The n-type tub base of this parasitic PNP bipolar can be biased at a power-high voltage, further eliminating any current path to substrate without interacting with the bidirectional device functionality during power-up conditions as well as by eliminating any potential latchup path from the protection clamp to other component in the same substrate.

Although the protection device 80 illustrates one implementation of the protection circuit 60 of FIG. 4, the protection circuit 60 can be implemented in other ways. For example, the p-type and n-type tubs used to isolate the protection device from the substrate can be implemented in other ways. As used herein, and as will be understood by one of skill in the art, the term "n-type tub" refers to any suitable n-type tub, including, for example, those used in buried n-layer technologies or in deep n-well technologies. Likewise, the term "p-type tub" refers to any suitable p-type tub.

Figure 6A:
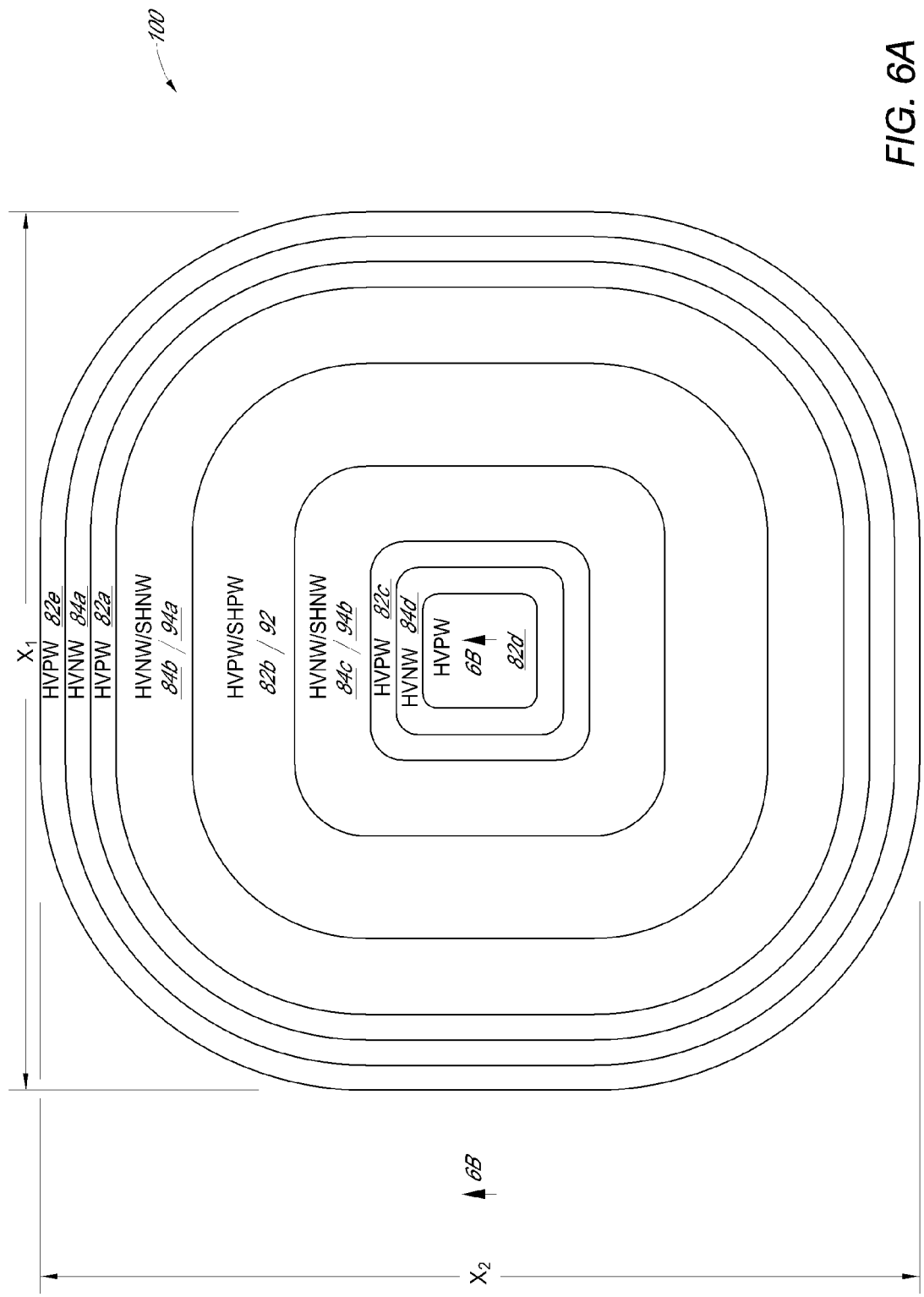
FIG. 6A is a schematic top plan layout view of a dual-tub-isolated protection device according to one embodiment.
Figure 6B:
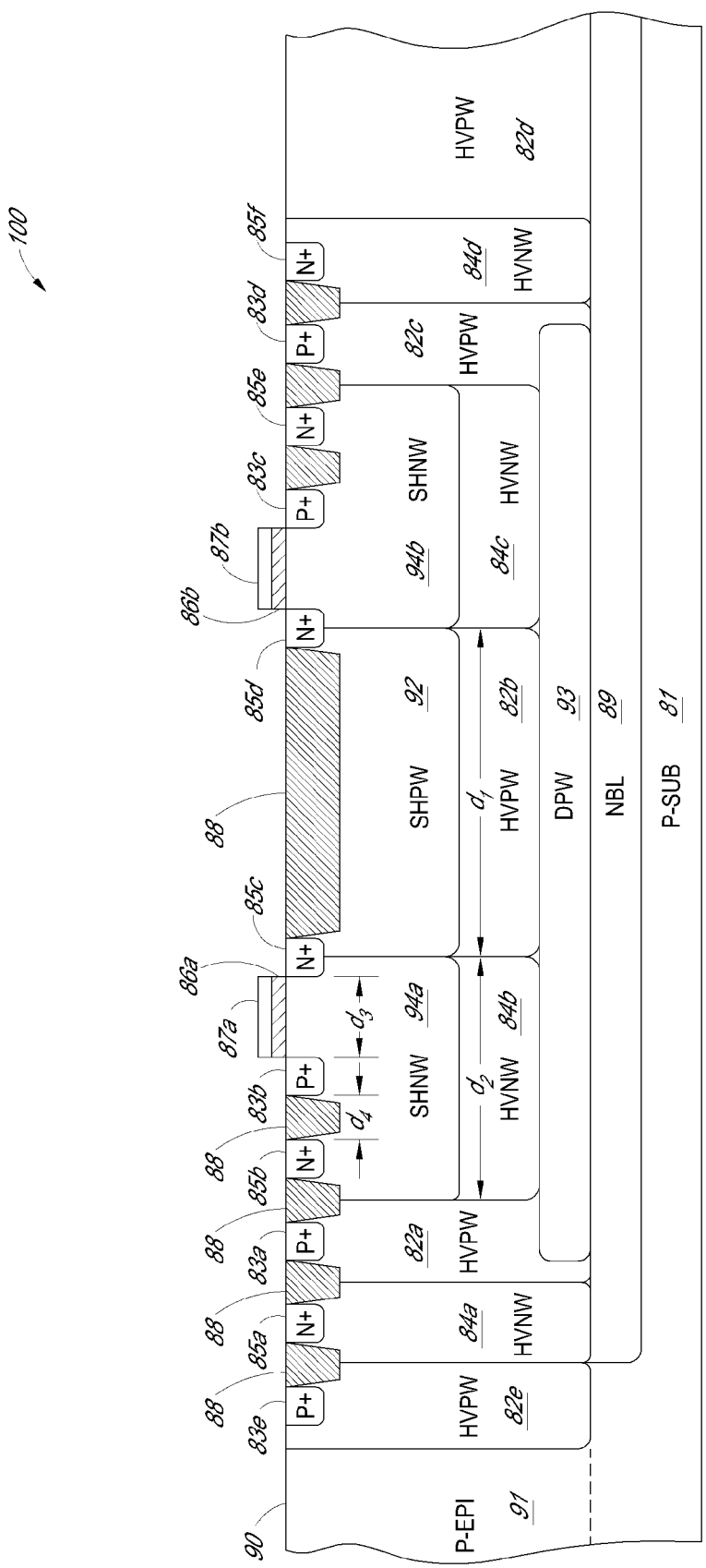
FIG. 6B is an annotated cross section view of the dual-tub-isolated protection device of FIG. 6A taken along the lines 6B-6B.

FIG. 6A is a schematic top plan layout view of a dual-tub-isolated bi-directional protection device 100 according to one embodiment. FIG. 6B is an annotated cross section view of the protection device 100 of FIG. 6A taken along the lines 6B-6B. The protection device 100 includes p-type substrate (P-SUB) 81, n-type buried layer (NBL) 89, p-type epitaxial layer (P-EPI) 91, first to fourth high voltage n-wells (HVNWs) 84a-84d, first to fifth high voltage p-wells (HVPWs) 82a-82e, first and second shallow n-wells (SHNWs) 94a, 94b, shallow p-well (SHPW) 92, first to fifth p-type active (P+) regions 83a-83e, first to sixth n-type active (N+) regions 85a-85f, first and second gate oxide layers 86a, 86b, first and second gates 87a, 87b, and oxide regions 88. For purposes of clarity, only the HVNWs and HVPWs have been illustrated in the top plan layout view of FIG. 6A. This layout top-view also can include an embedded bond pad (not shown), which allows the formation of area-efficient protection and facilitates package bonding compatibility at the periphery of the die.

The protection device 100 illustrates one example of an annular implementation of the protection device 80 of FIGS. 5A-5B. The protection device 100 of FIGS. 6A-6B is similar to the protection device 80 of FIGS. 5A-5B, except that the protection device 100 further includes the fourth and fifth HVPWs 82d, 82e and the fifth P+ region 83e. Additionally, the protection device 100 is configured as an annular ring, such that the fourth HVNW 84d is a first ring that surrounds the fourth HVPW 82d, the third HVPW 82c is a second ring that surrounds the fourth HVNW 84d, the third HVNW 84c is a third ring that surrounds the third HVPW 82c, the second HVPW 82b is a fourth ring that surrounds the third HVNW 84c, the second HVNW 84b is a fifth ring that surrounds the second HVPW 82b, the first HVPW 82a is a sixth ring that surrounds the second HVNW 84b, the first HVNW 84a is a seventh ring that surrounds the first HVPW 82a, and the fifth HVPW 82e is an eighth ring that surrounds the first HVNW 84a. Configuring the wells as rings can help improve the current handling capability and/or reduce the footprint of the protection device.

Although FIGS. 6A-6B illustrate a configuration in which the center of the device includes the fourth HVPW 82d, in certain implementations, an n-type well region such as a HVNW can be used in the center of the device rather than a p-type well region. Additionally, in certain configurations, the fourth HVNW 84d and the fourth HVPW 82d can be omitted and the third HVPW 82c can be configured to operate as the center of the protection device.

The fifth HVPW 82e includes the fifth P+ region 83e formed therein, and can be used as a guard ring around the protection device 100. The guard ring can be used to further reduce the amount of charge that is injected into the P-EPI 91 and/or P-SUB 81 during a transient electrical event. In certain implementations, the guard ring can be connected to a power low voltage supply.

In one embodiment, a signal pad is electrically connected to the second P+ region 83b and to the second N+ region 85b and a power low pad is electrically connected to the third P+ region 83c and to the fifth N+ region 85e.

FIG. 6B has been annotated to show various dimensions of the wells, regions, and layers described above for the protection device 100. For example the protection device 100 has been annotated to show a first dimension $d_1$ corresponding to a width of the HVPW 82b, a second dimension $d_2$ corresponding to a width of the HVNW 84b, a third dimension $d_3$ corresponding to a spacing between the second P+ region 83b and the third N+ region 85c, and a fourth dimension $d_4$ corresponding to a spacing between the second N+ region 85b and the second P+ region 83b. Although dimensions are shown with respect to the left half of the device, the right half of the device can be configured to have similar dimensions.

In one embodiment, the first dimension $d_1$ has a size selected to be in the range of about 2.5 μm to about 8 μm, for instance, 4 μm, the second dimension $d_2$ has a size selected to be in the range of about 4 μm to about 8 μm, for instance, 6.5 μm, and the third dimension $d_3$ has a size selected to be in the range of about 0.25 μm to about 2 μm, for instance, 1 μm, and the fourth dimension $d_4$ has a size selected to be in the range of about 0 μm (abutting) to about 2 μm, for instance, 0.6 μm. However, other dimensions will be readily determined by one of skill in the art.

In one embodiment, the footprint of the protection device 100 has a width $x_1$ in the range of about 220 μm to about 170 μm, for example, about 200 μm, and the protection device 100 has a height $x_2$ in the range of about 220 μm to about 170 μm, for example, about 200 μm for a 8 kV IEC-61000-4-2 ESD robustness level. However, other dimensions will be readily determined by one of skill in the art.

Figure 7A:
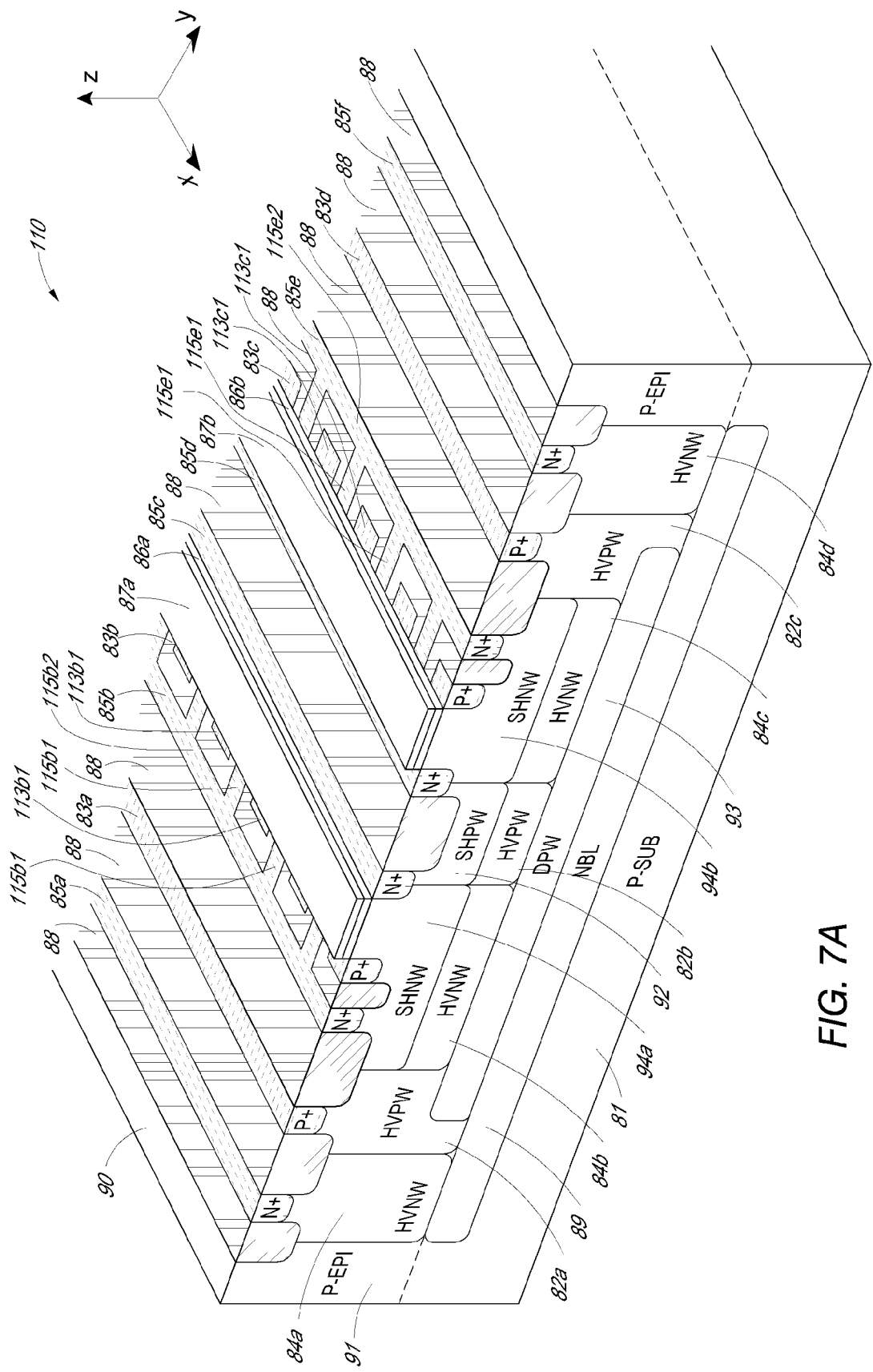
FIG. 7A is a schematic perspective view of a dual-tub-isolated bi-directional protection device according to another embodiment.

FIG. 7A is a schematic perspective view of a dual-tub-isolated bi-directional protection device 110 according to another embodiment. The protection device 110 is similar to the protection device 80 described above with reference to FIGS. 5A-5B, except that the protection device 110 includes a different configuration of the second and third P+ regions 83b, 83c and of the second and fifth N+ regions 85b, 85e. In particular, in the protection device 110 of FIG. 7A, the second P+ region 83b includes a plurality of island regions 113b1 disposed along the x-direction and the second N+ region 85b includes an elongated region 115b2 disposed along the x-direction and protruding regions 115b1 extending in the y-direction such that each of the protruding regions 115b1 extends between two of the island regions 113b1. Similarly, the third P+ region 83c includes a plurality of island regions 113c1 disposed along the x-direction and the fifth N+ region 85e includes an elongated region 115e2 disposed along the x-direction and protruding regions 115e1 extending in the y-direction such that each of the protruding regions 115e1 extends between two of the island regions 113c1.

Configuring the protection device 110 in this manner can be used to increase the holding voltage of the protection device 110 of FIG. 7A relative to the protection device 80 of FIGS. 5A-5B while maintaining a similar breakdown voltage. The increase in holding voltage can be achieved by increasing the size of the N+ regions 85b, 85e relative to the size of the P+ regions 83b, 83c to enhance the gain and conduction strength of the NPN bi-directional bipolar transistor 63 of FIG. 5B relative to the gain and conduction strength of the PNP bipolar transistors 64, 65 of FIG. 5B.

Figure 7B:
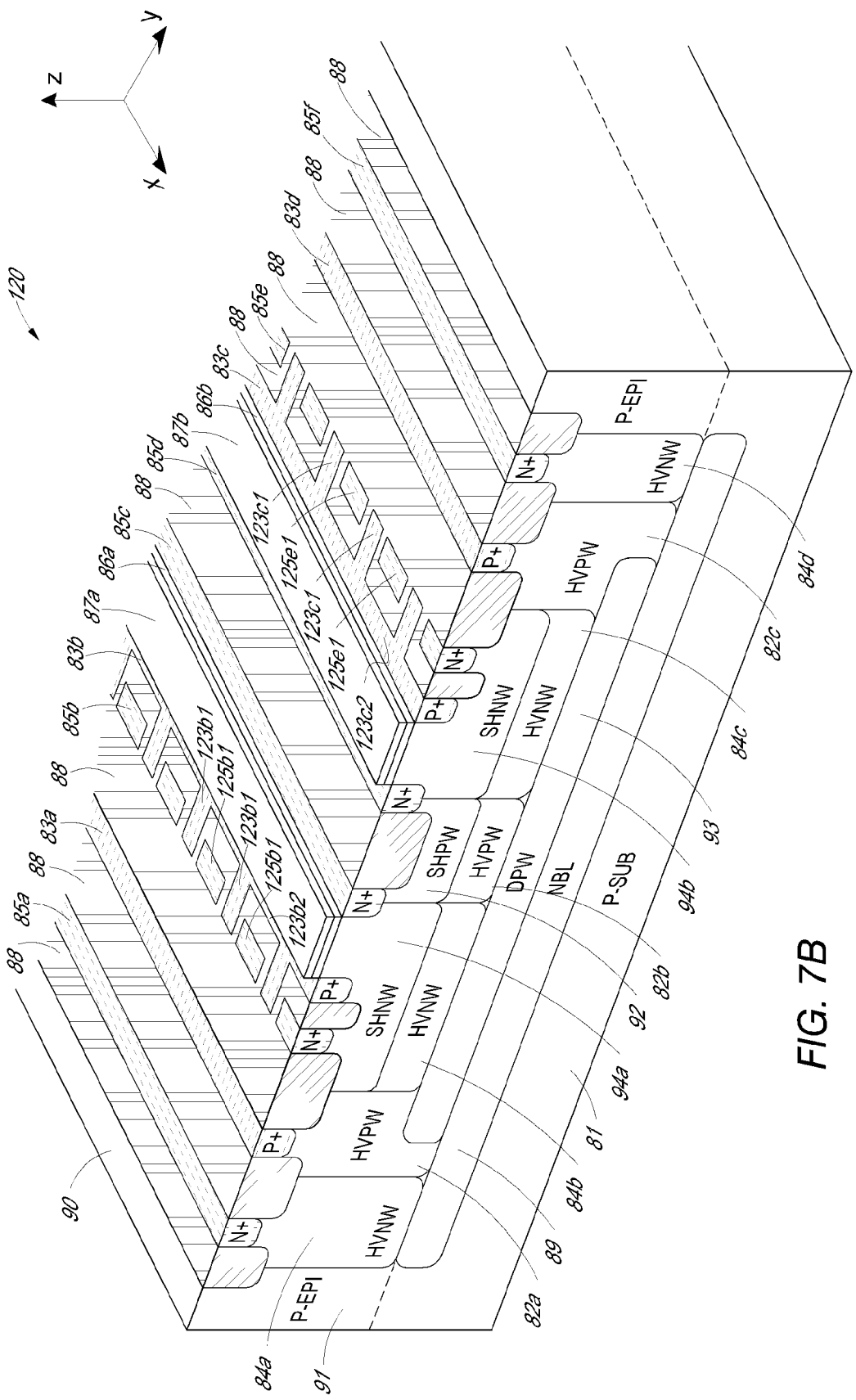
FIG. 7B is a schematic perspective view of a dual-tub-isolated bi-directional protection device according to yet another embodiment.

FIG. 7B is a schematic perspective view of a dual-tub-isolated bi-directional protection device 120 according to yet another embodiment. The protection device 120 is similar to the protection device 80 described above with reference to FIGS. 5A-5B, except that the protection device 120 includes a different configuration of the second and third P+ regions 83b, 83c and of the second and fifth N+ regions 85b, 85e. In particular, in the protection device 120 of FIG. 7B, the second N+ region 85b includes a plurality of island regions 125b1 disposed along the x-direction and the second P+ region 83b includes an elongated region 123b2 disposed along the x-direction and protruding regions 123b1 extending in the y-direction such that each of the protruding regions 123b1 extends between two of the island regions 125b1. Similarly, the fifth N+ region 85e includes a plurality of island regions 125e1 disposed along the x-direction and the third P+ region 83c includes an elongated region 123c2 disposed along the x-direction and protruding regions 123c1 extending in the y-direction such that each of the protruding regions 123c1 extends between two of the island regions 125e1.

Configuring the protection device 120 in this way can increase further the holding voltage of the protection device 120 of FIG. 7B relative to the protection device 80 of FIGS. 5A-5B while maintaining a similar breakdown voltage. The increase in holding voltage can be achieved by increasing the size of the P+ regions 83b, 83c relative to the size of the N+ regions 85b, 85e to enhance the gain and conduction strength of the PNP bipolar transistors 64, 65 of FIG. 5B relative to the gain and conduction strength of the NPN bi-directional bipolar transistor 63 of FIG. 5B.

Figure 8:
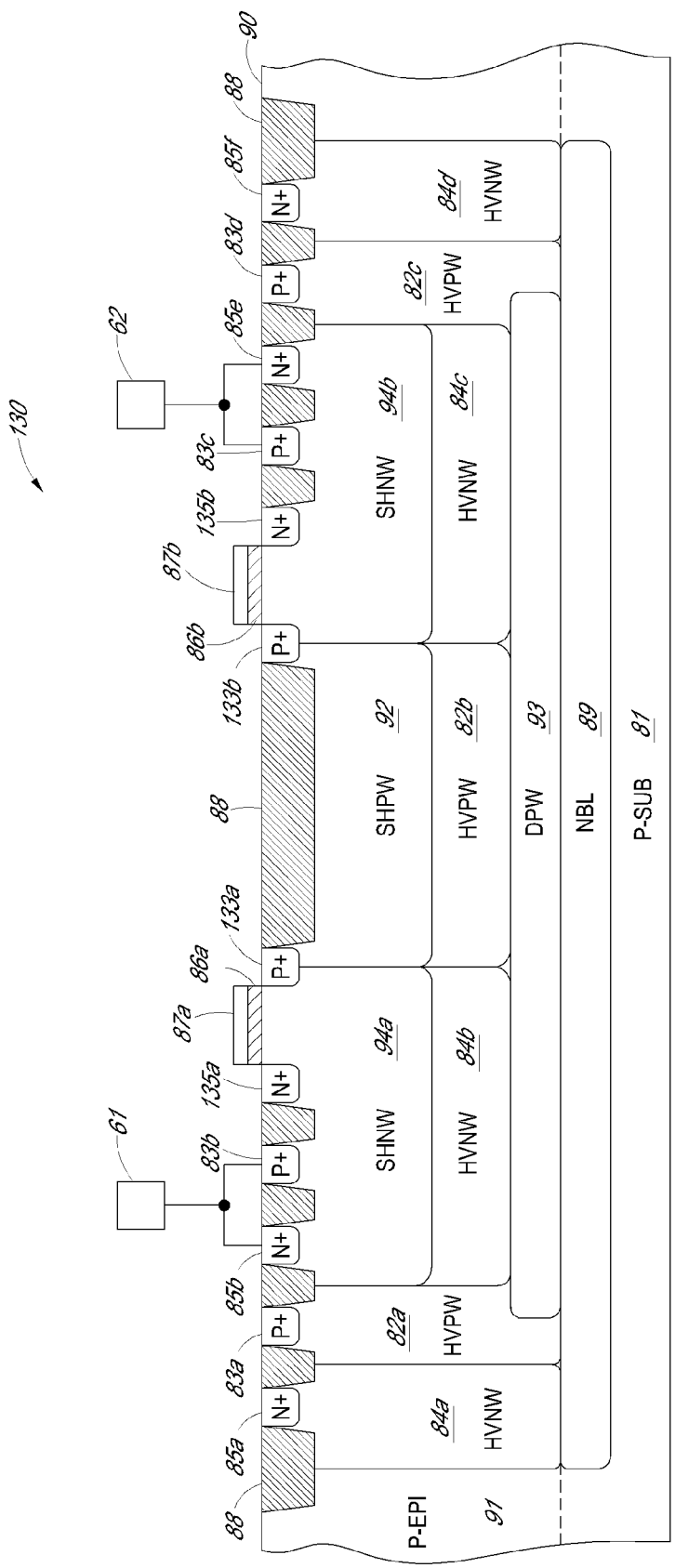
FIG. 8 is a cross section view of a dual-tub-isolated protection device according to another embodiment.

FIG. 8 is a cross section view of a dual-tub-isolated protection device 130 according to another embodiment. The protection device 130 is similar to the protection device 80 described above with reference to FIGS. 5A-5B, except that the protection device 130 illustrates a configuration in which the third and fourth N+ regions 85c, 85d of FIG. 5B have been replaced with first and second P+ regions 133a, 133b, respectively, for customizing the blocking voltage junction at each side of the device. To maintain active areas of opposite doping polarities on each side of the first and second gates 87a, 87b and minimize standing leakage current, the protection device 130 further includes a first N+ region 135a disposed in the SHNW 94a and a second N+ region 135b disposed in the SHNW 94b. The P+ regions 133a, 133b have a higher doping concentration than the SHPW 92 and thus can be used to control the breakdown voltage of the NPN bi-directional bipolar transistor 63 of FIG. 5B during a transient electrical event.

FIGS. 9A to 9I illustrate partial cross section views of various embodiments of dual-tub-isolated bi-directional protection devices, which can be used to provide custom bi-directional operation characteristics. FIGS. 9A to 9I show cross-sections of a dual tub isolation structure 140 along with certain structures contained therein, such as the SHPW 92, the SHNWs 94a, 94b, the HVNWs 84a, 84b, and the HVPW 82b. The dual tub isolation structure 140 includes a p-type tub and an n-type tub, which can be as described earlier. Although various wells and active regions are illustrated in the cross-sections of FIGS. 9A-9I, additional structures, such as N+ regions and P+ regions can be formed in the illustrated wells but have been omitted from FIGS. 9A to 9I for clarity. For example, the N+ region 85b and the P+ region 83b of FIGS. 5A-5B can be formed in the SHNW 94a, and the N+ region 85e and the P+ region 83c of FIGS. 5A-5B can be formed in the SHNW 94b.

The illustrated cross-sections show variations of the protection device 80 of FIGS. 5A-5B that can be used to provide fine-tuned control of the protection device's trigger and holding voltage characteristics in both forward and reverse directions. In FIGS. 9A to 9I, the structures are shown to be asymmetrically-formed, in which the left hand side of the protection device is changed relative to the protection device 80 of FIGS. 5A-5B to identify examples of variations used to control the blocking voltage characteristics for the forward operation (left to right positive overvoltage). For example, in one implementation using a 40 to 60 V operation BCD process, the protection devices of FIGS. 9A-9B can provide a forward trigger voltage of less than about 15 V (medium doping level to high doping level breakdown), the protection devices of FIGS. 9C-9D can provide a forward trigger voltage between about 15 V and about 30 V (medium doping level to medium doping level breakdown), the protection devices of FIGS. 9E-9F can provide a forward trigger voltage between about 15 V and about 30 V (high doping level to low doping level breakdown), the protection devices of FIGS. 9G and 9H can provide a forward trigger voltage between about 30 V and about 40 V (medium doping level to low doping level breakdown), and the protection device of FIG. 9I can provide a forward trigger voltage greater than about 40 V (low doping level to low doping level breakdown). Although forward trigger voltage can scale or change with a particular processing technology, the cross-sections of FIGS. 9A to 9I illustrate various configurations of protection devices that can be used to achieve a protection characteristic desired for a particular application.

Figure 9A:
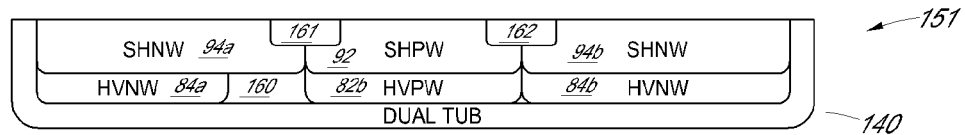
FIGS. 9A to 9I illustrate partial cross section views of various embodiments of dual-tub-isolated bi-direction protection devices with variable geometric features for providing, for example, symmetric and asymmetric operation for precision transceivers.

FIG. 9A illustrates an asymmetric protection device 151 in which the HVNW 84a has a width less than the SHNW 94a such that a lightly-doped p-type region 160 is formed between the HVNW 84a and the HVPW 82b. The p-type region 160 can have a doping concentration similar to that of a background doping concentration, such as a doping concentration of an epitaxial layer in which the p-type region 160 is formed. Including the p-type region 160 can increase the base resistance of the PNP bipolar transistor 64 of FIG. 5B, which can improve the transient response time and decrease the protection device's trigger voltage. The protection device 151 further includes a first active region 161 disposed along a boundary between the SHNW 94a and the SHPW 92 and a second active region 162. The first and second active regions 161, 162 can be either n-type or p-type doping conductivity type.

Figure 9B:
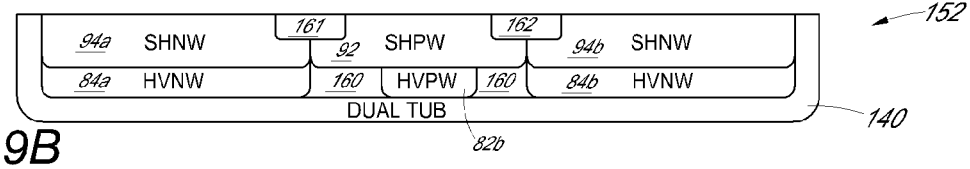
Figure 9C:
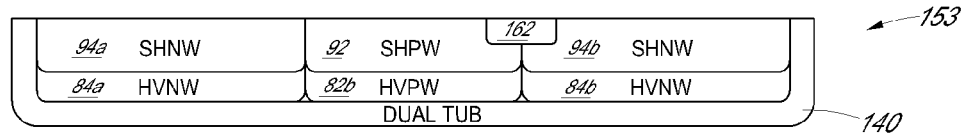
Figure 9D:
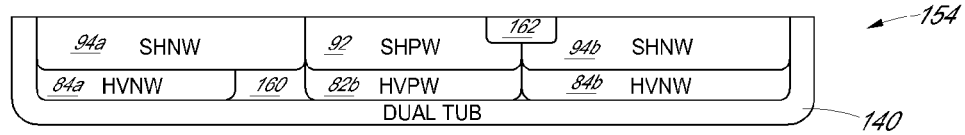

FIG. 9B shows a protection device 152 in which the HVPW 82b is configured to have a width smaller than a width of the SHPW 92 such that p-type regions 160 are formed between the HVPW 82b and each of the HVNWs 84a, 84b. Configuring the protection device 152 in this manner increases instead a base resistance of the NPN bi-directional bipolar transistor 63 of FIG. 5B, which can decrease the protection device's trigger voltage and provide a faster response time. FIG. 9C illustrates a protection device 153 in which the first active region 161 has been omitted, which can increase the protection device's forward trigger voltage. FIG. 9D shows a configuration of a protection device 154 in which the first active region 161 has been omitted and in which the HVNW 84a has a width less than the SHNW 94a such that a p-type region 160 is formed between the HVNW 84a and the HVPW 82b, as was discussed in connection with FIG. 9A.

Figure 9E:
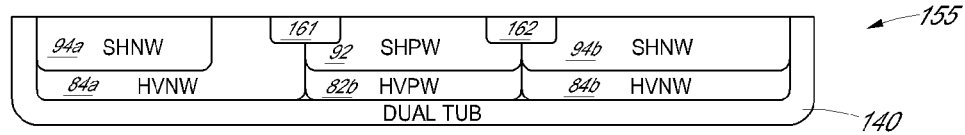
Figure 9F:
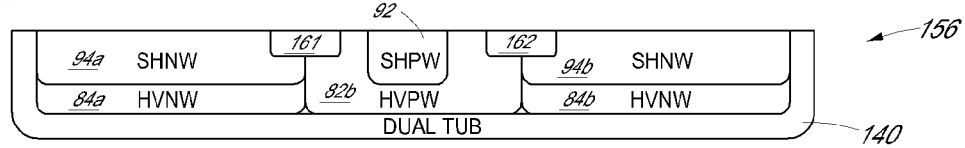
Figure 9G:
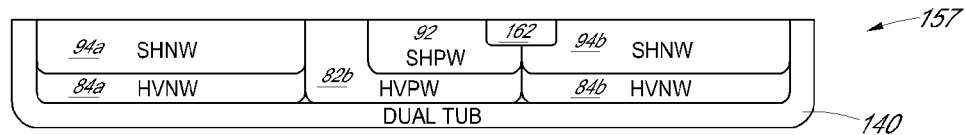

FIG. 9E shows a protection device 155 in which the SHNW 94a has a width less than a width of the HVNW 84a. Configuring the protection device 155 in this manner can increase the protection device's forward trigger voltage by increasing the blocking voltage. Additionally, configuring the device in this manner also increases the PNP base resistance and resistance looking into the collector/emitter of the NPN bi-directional bipolar transistor 63 of FIG. 5B. FIG. 9F illustrates a protection device 156 in which the SHPW 92 has a width less than a width of the HVPW 82*b* such that the HVPW 82*b* surrounds the SHPW 92, which can increase the protection device's forward trigger voltage by increasing the blocking voltage from the SHNW 94*a*/HVNW 84*a* and active region 161 regions to the HVPW 82*b*. Additionally, configuring the device in this manner also increases the base resistance of the NPN bi-directional bipolar transistor 63 of FIG. 5B. FIG. 9G shows a protection device 157 in which the SHPW 92 has a width less than a width of the HVPW 82*b* such that the HVPW 82*b* surrounds one side of the SHPW 92. Additionally, FIG. 9G shows an implementation in which the first active region 161 has been omitted, thereby further increasing forward trigger voltage relative to the configuration shown in FIG. 9F. The protection device 157 can have a blocking voltage defined by the junction formed by the SHNW 94*a* and the HVPW 82*b*, while the spacing from the junction to the SHPW 92 can be adjusted to obtain fine tuning of punch-trough-induced blocking voltages.

Figure 9H:
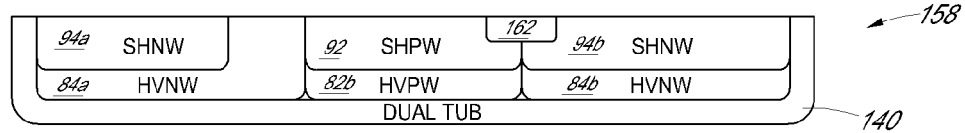
Figure 9I:
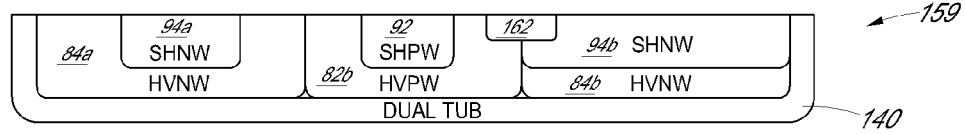

FIG. 9H shows a configuration of a protection device 158 in which a width of the SHNW 94*a* is less than a width of the HVNW 84*a* and in which the first active region 161 has been omitted. FIG. 9I illustrates a protection device 159 in which a width of the SHNW 94*a* is less than a width of the HVNW 84*a* such that the HVNW 84*a* surrounds the SHNW 94*a*. Additionally, in FIG. 9I the first active region 161 has been omitted and a width of the SHPW 92 is less than a width of the HVPW 82*b* such that the HVPW 82*b* surrounds the SHPW 92. The protection device 159 of FIG. 9I can achieve the largest blocking voltage condition for the corresponding process technology by defining the blocking junction formation between two regions with relatively light doping concentration while maintaining the SHPW 92 and SHNWs 94*a*, 94*b* to optimize the blocking voltage and well resistance.

In the embodiments described above, the protections devices can include layers, regions, and/or wells having n-type or p-type dopants. In other embodiments, the doping types of all the layers, regions, and wells of the protection devices can be opposite to those described and shown in the above embodiments, and the same principles and advantages can still apply to the other embodiments. For example, a complementary version of the protection device of FIGS. 5A-5B can be formed using an n-type substrate and n-type epitaxial layer and by reversing the doping polarity of the wells, active regions, and buried layers formed therein. Similarly, complementary versions of the protection devices shown in FIGS. 6A-9I are also possible under the same principle described above.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Transceiver Signal Isolation Apparatus with Latch-up Prevented Parasitic PNPN Devices Bidirectional protection circuit such as the protection circuit 60 illustrated in FIG. 4 provides for a current shunt path to discharge a large amount of current in response to a transient electrical event that induces a voltage difference exceeding a trigger voltage between the first and second pads 61 and 62. The high current path is enabled by the first PNP bipolar transistor 64, the NPN bi-directional bipolar transistor 63, and the second PNP bipolar transistor 65 configured in a silicon-controlled rectifier (SCR) configuration. In addition, the dual tub isolation comprising a highly doped p-type tub 68 and a highly doped n-type tub 69 may enables maximum voltage handling capability of the protection circuit 60 while minimizing the interaction with other components of the main transceiver circuitry.

Under certain implementations, there may be parasitic devices that form as a result of fabricating bidirectional protection circuit such as the protection circuit 60 in FIG. 4. The parasitic devices may share certain regions that form core regions of the protection circuit 60. For example, an as-grown p-type epitaxial region, along with the p-type tub 68 and the n-type tub 69 that form the dual tub isolation of the protection circuit 60, may also form a parasitic PNP bipolar transistor. Such parasitic devices may provide alternative current paths through which a transient electrical event may discharge instead of the main current path between the first and second pads 61 and 62 connected through the first and second PNP bipolar transistors 64 and 65 and the NPN bi-directional bipolar transistor 63. Current flow though such paths may be undesirable, because it may result in discharging a large amount of current though portions of the transceiver circuitry that are not designed for such an event, resulting in undesirable damage to the circuitry and reliability issues. Therefore, there is a need to prevent high current flow through the parasitic devices.

Figure 10:
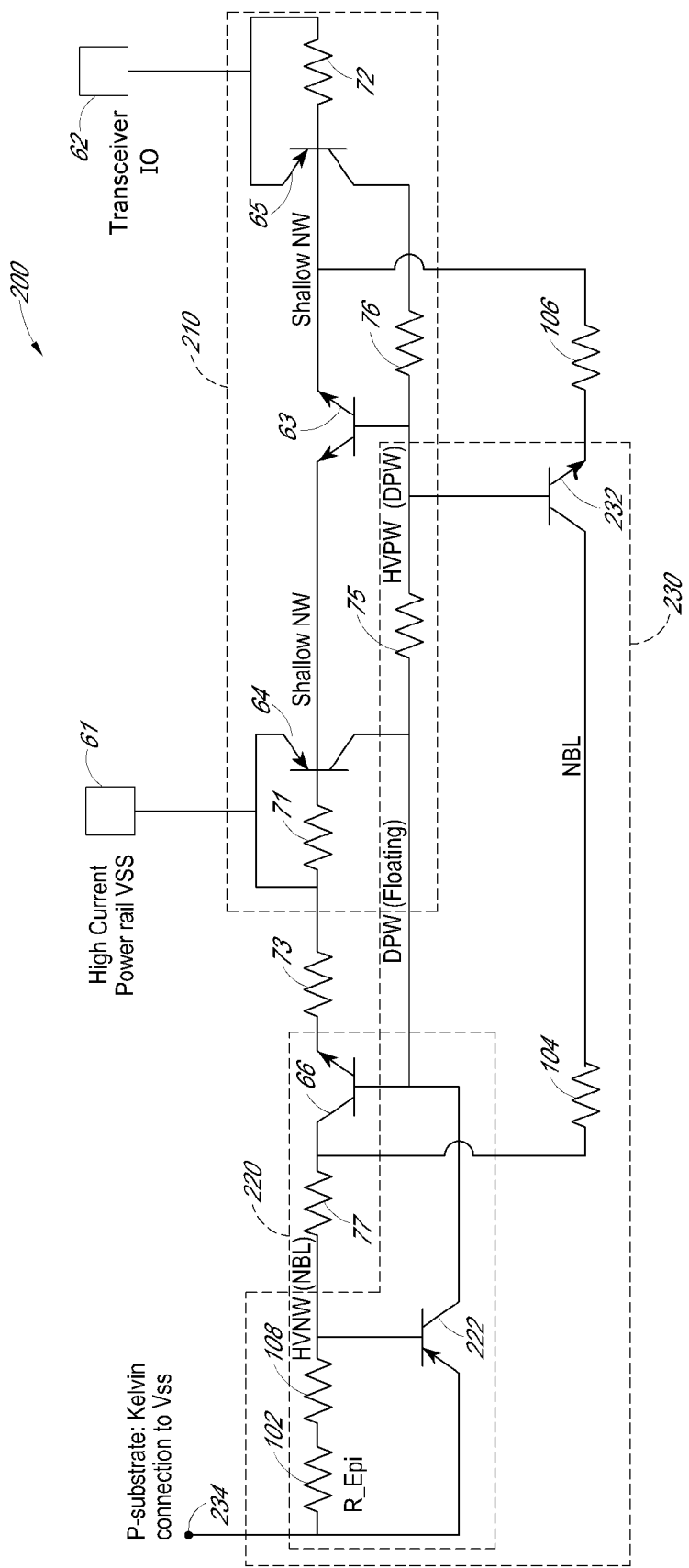
FIG. 10 is a schematic diagram of a bidirectional protection circuit for transceiver signal isolation and voltage clamp according one embodiment.

FIG. 10 illustrates a schematic bidirectional protection circuit 200 according to one embodiment. The bidirectional protection circuit 200 includes a bipolar PNPNP device assembly 210, a first parasitic PNPN device assembly 220, and a second parasitic PNPN device assembly 230. The protection circuit 200 can be configured to provide a current shunt path through the bipolar PNPNP device assembly 210 in response to an external transient electrical event which induces a voltage difference between the first and second pads 61 and 62 that exceeds a certain critical value. For example, the second pad 62 can be a signal pin or pad of an IC, such as the first and second signal pins 4, 5 of FIGS. 1 and 3, and the first pad 61 can be a power low pin or pad, such as a pad associated with the power low voltage supply $V_1$ of FIGS. 1 and 3.

In one embodiment, the second pad 62 may configured as a transceiver IO pad. The first pad 61 can be configured to be connected to a substrate of a transceiver circuit such as the transceiver circuit 1 in FIG. 1, which may be at $V_{SS}$ or ground. The connection between the first pad 61 and the transceiver circuit substrate can be made through a high current power rail. The high current power rail typically has a relatively low resistance and be designed to handle a relatively large amount of current in response to a transient electrical event. The protection circuit 200 can further be connected to the substrate of the transceiver circuit 1 shown in FIG. 1 which can also be at $V_{SS}$ or ground. The connection between substrate of the transceiver circuit 1 and the substrate of the protection circuit 200 may be made through a Kelvin connection 234. In comparison to the relatively high current power rail connection that may connect the first pad 61 and the transceiver circuit substrate, the Kelvin connection 234 can be relatively high in resistance, but passes a relatively low amount of current flowing in response to the same transient electrical event that can trigger a relatively large amount of current to pass through the high current power rail. Because both the first pad 61 and Kelvin connection 234 both connect to the substrate of the transceiver circuit 1 which may be at $V_{SS}$ or ground, and there is no appreciable current flow between the bidirectional protection circuit 200 and the substrate of the transceiver circuit 1 under equilibrium conditions, the voltage potential at the first pad 61 and the Kelvin connection 234 are about the same. However, during a transient electrical event, because the relatively high amount of current that flows between the bidirectional protection circuit 200 and the substrate of the transceiver circuit 1 via the high current power rail, there is a relatively large voltage drop along the high current power rail such that there can be a difference in potential between the first pad 61 and the Kelvin connection 234 even though each connects to the substrate of the transceiver circuit 1.

The bidirectional protection circuit 200 includes a bipolar PNPNP device assembly 210. The bipolar PNPNP device assembly 210 includes an NPN bi-directional bipolar transistor 63, the first PNP bipolar transistor 64, the second PNP bipolar transistor 65, first and second resistors 71 and 72, and fifth and sixth resistors 75 and 76 arranged similarly as described above in FIG. 4. In particular, the first pad 61 is electrically connected to the PNPNP device assembly 210 through the first resistor 71 and the emitter of the first PNP bipolar transistor 64. The first PNP bipolar transistor 64 includes an emitter electrically connected to the first pad 61 and a collector electrically connected to the base of the first parasitic NPN bipolar transistor 66. The first PNP bipolar transistor 64 further includes a base electrically connected to a collector/emitter C/E of the NPN bi-directional bipolar transistor 63 and to the first resistor 71. The second pad 62 is electrically connected to the PNPNP device assembly 210 through the second resistor 72 and the emitter of the second bipolar transistor 65. The second PNP bipolar transistor 65 includes an emitter electrically connected to the second pad 62 and a collector electrically connected to the base of the second parasitic NPN bipolar transistor 232 through the sixth resistor 76. The second PNP bipolar transistor 65 further includes a base electrically connected to an emitter/collector E/C of the NPN bi-directional bipolar transistor 63 and to the second resistor 72. The NPN bi-directional bipolar transistor 63 includes a collector/emitter C/E electrically connected the base of the first PNP bipolar transistor 64 and a emitter/collector E/C electrically connected to the base of the second PNP bipolar transistor 65. The NPN bi-directional transistor further includes a base connected to the collector of the first PNP bipolar transistor 64 through the fifth resistor 75 and further connected to the collector of the second PNP bipolar transistor 65 through the sixth resistor 76.

The bidirectional protection circuit 200 additionally includes a first parasitic PNPN device assembly 220. The first parasitic PNPN device assembly 220 includes a parasitic PNP bipolar transistor 222, a first parasitic NPN bipolar transistor 66, a seventh resistor 77, a ninth resistor 102, and a twelfth resistor 108. The parasitic PNP bipolar transistor 222 includes an emitter electrically connected to the p-substrate of the transceiver circuit 1 and to the ninth resistor 102. The parasitic PNP bipolar transistor 222 further includes a base connected to the emitter through the ninth resistor 102 and the twelfth resistor 108 connected in series. The base of the parasitic PNP bipolar transistor 222 is further connected to a collector of the parasitic NPN bipolar transistor 66 through the seventh resistor 77. The parasitic PNP bipolar transistor 222 further includes a collector connected to a base of the first parasitic NPN bipolar transistor 66. The first parasitic NPN bipolar transistor 66 includes an emitter electrically connected to the third resistor 73 and a base electrically connected to the collector of the parasitic PNP bipolar transistor 222. The first parasitic NPN bipolar transistor 66 further includes a collector electrically connected to the base of the parasitic bipolar PNP transistor 222 through the seventh resistor 77.

The bidirectional protection circuit 200 further includes a second parasitic PNPN device assembly 230. The second parasitic PNPN device assembly 230 includes a parasitic PNP bipolar transistor 222, a second parasitic NPN bipolar transistor 232, a fifth resistor 75, a seventh resistor 77, a ninth resistor 102, a tenth resistor 104, and a twelfth resistor 108. The parasitic PNP bipolar transistor 222 includes an emitter electrically connected to the p-substrate of the transceiver circuit 1 and to the ninth resistor 102. The parasitic PNP bipolar transistor 222 further includes a base connected to the emitter through the ninth resistor 102 and the twelfth resistor 108. The base of the parasitic PNP bipolar transistor 222 is further connected to a collector of the second parasitic NPN bipolar transistor 232 through the seventh resistor 77 and the tenth resistor 104 connected in series. The parasitic PNP bipolar transistor 222 further includes a collector connected to a base of the second parasitic NPN bipolar transistor 232 through the fifth resistor 75. The second parasitic NPN bipolar transistor 232 includes an emitter connected to the eleventh resistor 106 and a base connected to the collector of the parasitic PNP bipolar transistor 222 through the fifth resistor 75. The second parasitic NPN bipolar transistor 232 further includes a collector electrically connected to the base of the parasitic PNP bipolar transistor 222 through the tenth resistor 104 and the seventh resistor 77.

The operation of the bipolar PNPNP device assembly 210 is similar to that explained in connection with FIG. 4. In particular, when a transient electrical event increases the absolute voltage difference between the first pad 61 and the second pad 62, the NPN bi-directional bipolar transistor 63 and one of the first PNP bipolar transistor 64 or the second PNP bipolar transistor 65 operate as a first cross-coupled bipolar PNPN bipolar transistors in a silicon-controlled rectifier (SCR) configuration as described above. For example, when transient electrical event induces the voltage of the first pad 61 to exceeds that of the second pad 62 (or alternatively, the voltage of the second pad 62 to fall below that of the voltage on the first pad 61), the emitter-base junction and the collector-base junction of the PNP bipolar transistor 64 are forward biased and reverse biased, respectively. Under this situation, the emitter/collector E/C of the NPN bi-directional bipolar transistor 63 serves as an emitter and the collector/emitter C/E of the NPN bi-directional bipolar transistor 63 serves as a collector. Once the positive voltage difference between the first pad 61 and the second pad 62 exceeds a trigger voltage $+V_{TR}$, the PNPNP device assembly 210 enters into a low impedance mode described in connection with FIG. 2. The low impedance mode is triggered by a feedback loop formed between one of the first or second PNP bipolar transistors 64 and 65 and the NPN bi-directional bipolar transistor 63. The feedback loop operates as follows: an increase in the collector current of the first or second PNP bipolar transistors 64 or 65 increases the base current of the NPN bi-directional bipolar transistor 63 and an increase in the collector current of the NPN bi-directional bipolar transistor 63 increases the base current of the first or second PNP bipolar transistors 64 or 65. The feedback loop can be regenerative because of the gains of the individual bipolar transistors and cause the PNPNP device assembly 210 to enter a low-impedance state. Once in the low impedance state, the PNPNP device assembly 210 will remain in the low impedance state until the voltage across the first and second pins 61 and 62 falls below the holding voltage +$V_H$, or the current falls below +$I_H$, or both. An analogous situation develops when a transient electrical event induces the voltage of the second pad 62 to exceed that of the first pad 61 (or alternatively, the voltage of the first pad 61 to fall below that of the voltage on the second pad 62). Under this situation, the emitter-base junction and the collector-base junction of the PNP bipolar transistor 65 are forward biased and reverse biased, respectively. Under this situation, the collector/emitter C/E of the NPN bi-directional bipolar transistor 63 serves as an emitter and the emitter/collector E/C of the bi-directional bipolar transistor serves as a collector. Once the negative voltage difference between the first pad 61 and the second pad 62 exceeds the trigger voltage -$V_{TR}$ in absolute value, the PNPNP device assembly enters into a low impedance mode described in connection with FIG. 2. Once in the low impedance state, the PNPNP device will remain in the low impedance state until the voltage across the first and second pins 61 and 62 falls below -$V_H$ in absolute value, or the current falls below -$I_H$ in absolute value, or both.

The protection circuit 200 includes dual-tub isolation similar to the protection circuit 60 of FIG. 4 that reduces the interaction between the PNPNP device assembly 210 and the external components and circuitry formed in a common substrate with the protection circuit 200. However, as discussed above, under certain implementations, there may be parasitic device assemblies that may result from various regions formed to create the PNPNP device assembly 210 and the dual tub isolation. These parasitic devices may provide for alternative or additional current paths that may cause undesirable reliability failures.

In particular, in the illustrated embodiment in FIG. 10, the first parasitic PNPN device assembly 220 may provide an alternative current path in response to a transient electrical event. As illustrated in FIG. 10, the first parasitic PNPN device assembly 220 includes a parasitic PNP bipolar transistor 222 and a first parasitic NPN bipolar transistor 66 arranged in a silicon-controlled rectifier (SCR) configuration. In particular, the collector of the parasitic PNP bipolar transistor 222 is connected to the base of the first parasitic NPN bipolar transistor 66, and the collector of the first parasitic NPN bipolar transistor 66 is connected to the base of the parasitic PNP bipolar transistor 222. Similar to the bipolar PNPNP device assembly 210, the parasitic PNP bipolar transistor 222 coupled to the first parasitic bipolar transistor 66 may enter into a regenerative feedback loop when the voltage across the first PNPN device assembly 220 exceeds a certain value. In particular, once the positive voltage difference between the Kelvin connection 234 and the first pad 61 exceeds a trigger voltage +$V_{TR}$ of the first parasitic PNPN device assembly 220, the first PNPN device assembly 220 may enter into a low impedance mode similar to that which occurs in the PNPNP device assembly 210 due to a feedback loop. The feedback loop operates as follows: an increase in the collector current of the parasitic PNP bipolar transistor 222 that increases the base current of the first parasitic NPN bipolar transistor 66 and an increase in the collector current of the first parasitic NPN bipolar transistor 66 that increases the base current of the parasitic PNP bipolar transistor 222. As in the PNPNP device assembly 210, once in the low impedance state, the first parasitic PNPN device assembly 220 will remain in the low impedance state until the positive voltage difference between the Kelvin connection 234 and the first pad 61 falls below +$V_H$, or the current falls below +$I_H$, or both.

The illustrated embodiment in FIG. 10 additionally includes a second parasitic PNPN device assembly 230 which may provide another alternative current path in response to a transient electrical event. The second parasitic PNPN device assembly 230 includes a parasitic PNP bipolar transistor 222 and a second parasitic NPN bipolar transistor 232 arranged in a silicon-controlled rectifier (SCR) configuration. In particular, the collector of the parasitic PNP bipolar transistor 222 is connected to the base of the second parasitic NPN bipolar transistor 232, and the collector of the second parasitic NPN bipolar transistor 232 is connected to the base of the parasitic PNP bipolar transistor 222. Similar to the PNPNP device assembly 210, the parasitic PNP bipolar transistor 222 coupled to the second parasitic PNP bipolar transistor 232 may enter into a low impedance mode in response to a positive voltage difference between the Kelvin connection 234 and the second pad 62 exceeds a trigger voltage +$V_{TR}$ of the second parasitic PNPN device assembly 230. The triggering mechanism as well as the conditions under which the second PNPN device assembly 230 remains in the low impedance state is similar to those described above for the first parasitic PNPN device assembly 220.

Because the first and second parasitic PNPN device assemblies 220 and 230 may be triggered in a similar fashion as the bipolar PNPNP device assembly 210, it may be desirable to design the bidirectional protection circuit 200 such that the first and second parasitic PNPN device assemblies 220 and 230 have trigger voltages values greater than the trigger voltage values of the PNPNP device assembly 210. There are many factors that control the trigger voltage values of the first and second parasitic PNPN device assemblies 220 and 230. In general, the ratio of carrier lifetimes, the ratio of doping, and the ratio of diffusion lengths between an emitter and a base generally determines the gain of a given bipolar transistor. A higher gain of the individual bipolar transistors within the first and second parasitic PNPN device assemblies 220 and 230 in turn generally results in a lower trigger voltage. For example, a higher minority carrier lifetime in the base, a lower doping concentration in the base, and smaller physical base width may result in a higher gain of the parasitic PNP bipolar transistor 222. A higher gain of the parasitic PNP bipolar transistor 222 in turn can result in lower trigger voltages of the first and second parasitic PNPN device assemblies 220 and 230. Similarly, a higher gain of the first and second parasitic NPN bipolar transistors 66 and 232 can also result in lower trigger voltages of the first and second parasitic PNPN device assemblies 220 and 230, respectively.

While it may be generally desirable to have a high trigger voltage of the first and second parasitic PNPN device assemblies 220 and 230, a person skilled in the art will appreciate that other factors may also be important to consider when designing the overall circuit of the bidirectional protection circuit 200. In certain implementations, it might not be desirable to have pre-trigger impedance values of the parasitic PNPN device assemblies 220 and 230 that are significantly higher relative to a pre-trigger impedance value of the bipolar PNPNP device assembly 210. Under these circumstances, a higher voltage may fall across the first and/or second parasitic PNPN device assemblies 220 and 230 in comparison to the bipolar PNPNP device assembly 210 and cause the parasitic PNPN device assemblies to preferentially trigger. Under certain circumstances, there may be a trade-off between the pre-trigger impedance and the trigger voltage. For example, a design having higher parasitic PNPN pre-trigger impedance may lead to lower PNPN trigger voltage, and vice versa. Therefore, having a balanced pre-trigger impedance value and a trigger voltage may be desirable.

Moreover, it may be desirable have design factors for first and second parasitic PNPN device assemblies 220 and 230 that are independent from design factors that affect the device properties of the bipolar PNPNP device assembly 210 such that changes made to the device parameters of the PNPNP device assembly 210 do not affect the device parameters of the first and/or second parasitic PNPN device assemblies 220 and 230.

In one embodiment as illustrated in FIG. 10, a properly optimized leakage and trigger characteristics of the first and second parasitic PNPN device assemblies 220 and 230 may be achieved through connecting the base and the emitter of the parasitic PNP bipolar transistor 222 through ninth and twelfth resistors 102, 108 in a series, and controlling the combined resistance values of the two resistors. Depending of the relative value of the combined resistance of the ninth and twelfth resistors 102 and 108, the configuration of the parasitic PNP bipolar transistor 222 may be in one of three modes known as BVCES condition (collector-emitter breakdown voltage with the emitter-base shorted), BVCEO conditions (collector-emitter breakdown voltage with the base open), and BVCER condition (collector-emitter breakdown with the emitter-base connected by a resistance).

In particular, in one implementation, when the value of the combined resistances of the ninth and twelfth resistors 102 and 108 are nearly zero (i.e., shorted-circuited) or very low, the parasitic PNP bipolar transistor 222 is configured to be in a condition referred to as the BVCES condition (breakdown with emitter-base shorted). Among the three modes, the BVCES condition generally results in the highest breakdown voltage of reverse-biased base-collector junction of the parasitic PNP bipolar transistor 222, which in turn may result in a higher trigger voltage of the first and second parasitic PNPN device assemblies 220 and 230. At the same time, the BVCES condition generally results in the lowest pre-trigger impedance and hence the highest leakage current though the first and second parasitic PNPN device assemblies 220 and 230.

Under another implementation, when the value of the combined resistances of the ninth and the twelfth resistors 102 and 108 are very high (i.e., open-circuited), the parasitic PNP bipolar transistor 222 is configured to be in a condition referred to as the BVCEO condition (breakdown with emitter-base open). Among the three modes, the BVCEO condition generally results in the lowest possible breakdown voltage of the reverse-biased base-collector junction of the parasitic PNP bipolar transistor 222, which in turn may result in a lower trigger voltage of the first and second parasitic PNPN device assemblies 220 and 230. At the same time, the BVCEO condition generally results in the highest pre-trigger impedance and hence the lowest leakage current though the first and second parasitic PNPN device assemblies 220 and 230.

Under yet another preferred implementation, the value of the combined resistances of the ninth and the twelfth resistors 102 and 108 may be at an intermediate value, and the parasitic PNP bipolar transistor 222 is configured to be in a condition referred to as the BVCER condition (breakdown with emitter-base connected by a resistor). Among the three modes, BVCER condition generally results in an intermediate breakdown voltage of the reverse-biased base-collector junction of the parasitic PNP bipolar transistor 222, which in turn may result in an intermediate trigger voltage of the first and second parasitic PNPN device assemblies 220 and 230. Likewise, the BVCER condition generally results in an intermediate pre-trigger impedance and hence an intermediate leakage current though the first and second parasitic PNPN device assemblies 220 and 230. A parasitic PNP bipolar transistor 222 in a BVCER condition may enable a proper balance between a pre-trigger impedance and the trigger voltage of the first and second parasitic PNPN device assemblies 220 and 230. Moreover, as will be discussed below, the resistance values of the ninth and the twelfth resistors 102 and 108 are controlled through processes that are largely independent of the process parameters that affect the bipolar PNPNP device assembly 210.

Figure 11A:
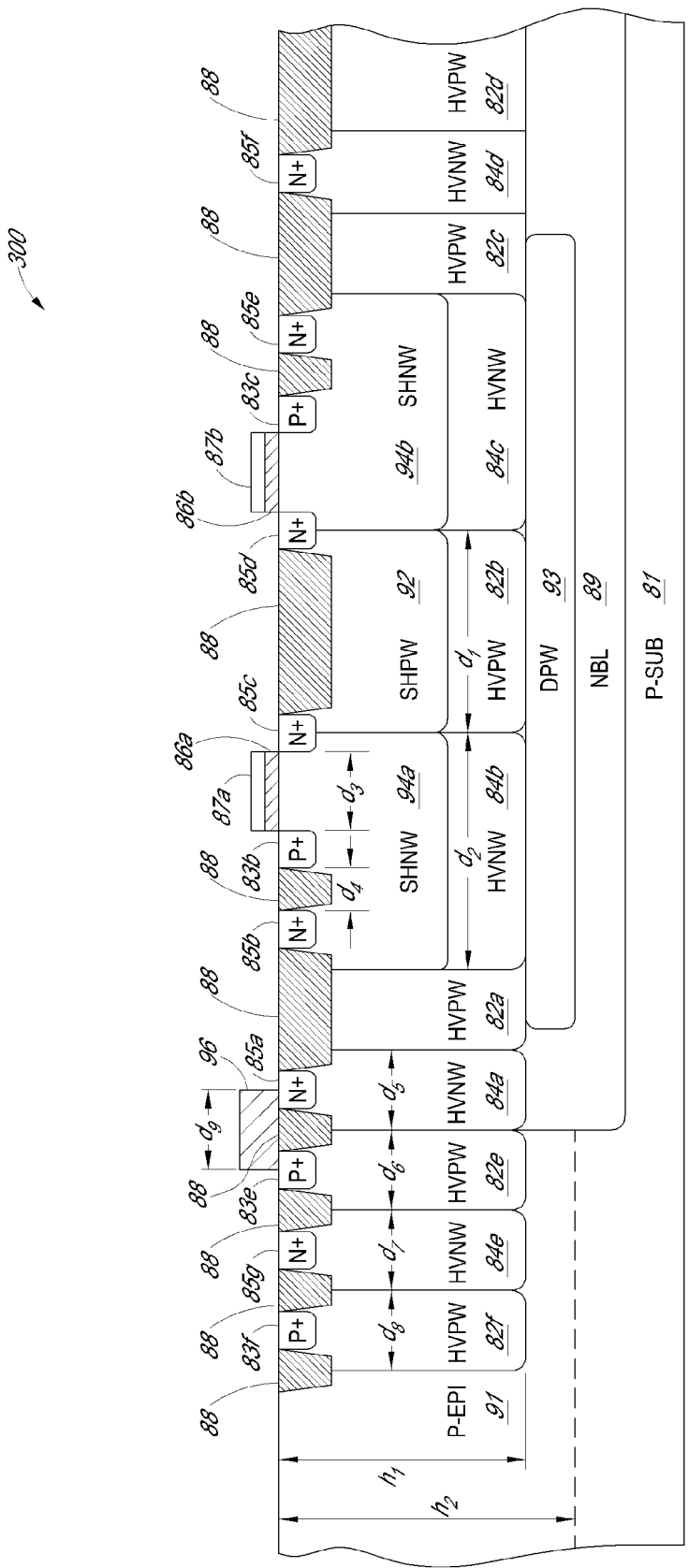
FIG. 11A is an annotated cross section view of a bidirectional protection device for transceiver signal isolation and voltage clamp according to one embodiment.
Figure 12A:
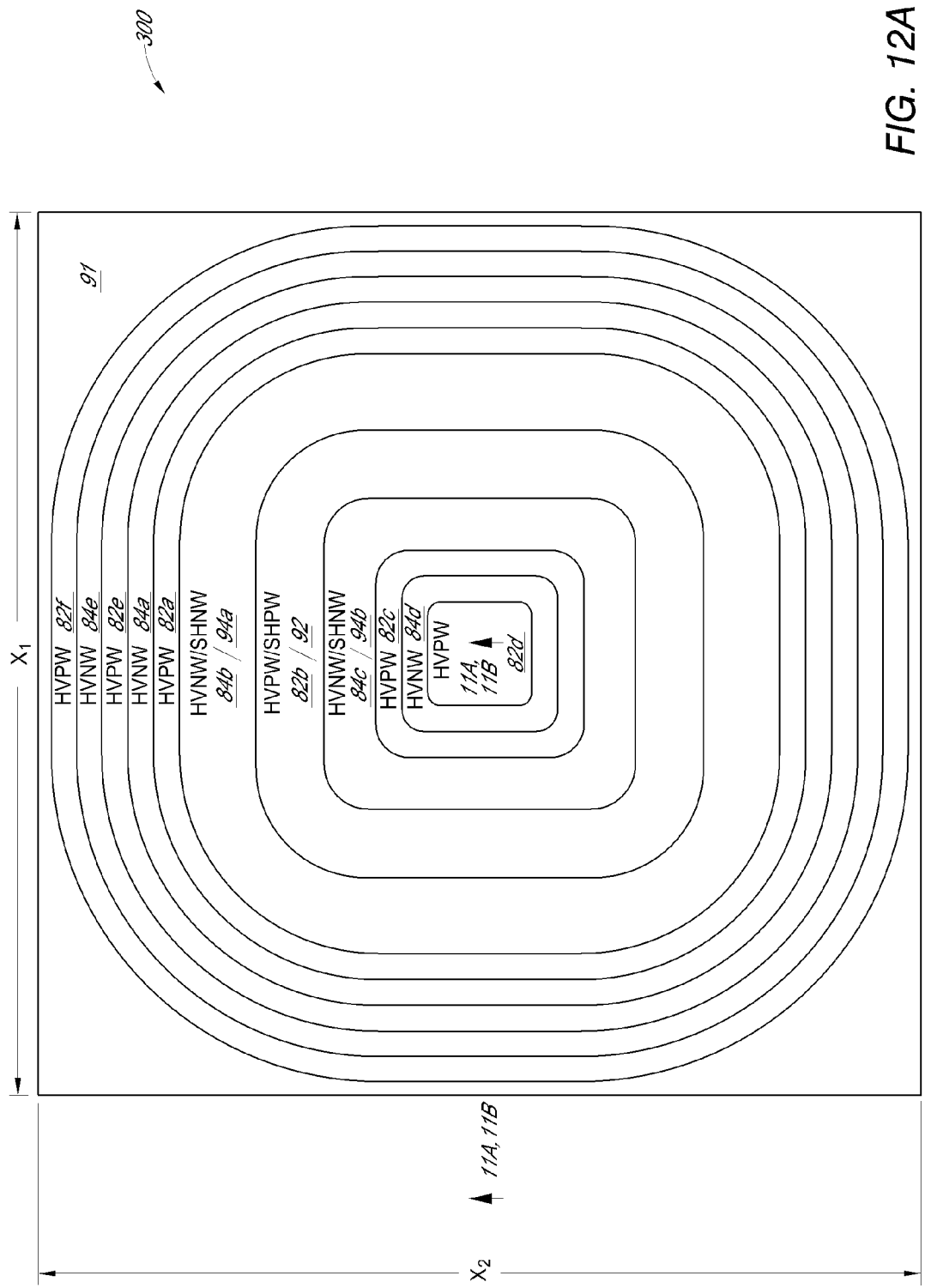
FIG. 12A is a schematic top plan layout view of a bidirectional protection device for transceiver signal isolation and voltage clamp according to one embodiment.

FIG. 11A is a cross-sectional view of an annular implementation of a bi-directional protection device 300 according to one embodiment, whose top plan view is illustrated in FIG. 12A. In particular, FIG. 11A represents a view through the cross-section 11A-11A in FIG. 12A. For clarity, FIG. 12A only shows various well regions below the active regions (first though seventh N+ regions 85a-85g and second, third, fifth, and sixth P+ regions 83b, 83c, 83e, 83f) and oxide regions 88. Referring to FIGS. 11A and 12A, the bidirectional protection device 300 is similar to the annular implementation of the protection device 100 of FIGS. 6A and 6B. Due to the symmetry of the illustrated embodiment, features discussed below with respect to one half of the device (shown in the figures) can also be applicable to the other half of the device (not shown). The central location of the bi-directional protection device 300 of FIGS. 11A and 12A comprises the fourth high voltage p-well (HVPW) 82d, around which the fourth high voltage n-well (HVNW) 84d forms a first ring, the third high voltage p-well (HVPW) 82c forms a second ring, the second shallow n-well (SHNW) 94b/third high voltage n-well (HVNW) 84c forms a third ring, shallow p-well (SHPW) 92/second high voltage p-well (HVPW) 82b forms a fourth ring, first shallow n-well (SHNW) 94a/second high voltage n-well (HVNW) 84b forms a fifth ring, fifth high voltage p-well (HVPW) 82a forms a sixth ring, first high voltage n-well (HVNW) 84a forms a seventh ring, and a fifth high voltage p-well (HVPW) 82e form an eighth ring, wherein each ring surrounds the previous ring and each of the first through eighth rings surrounding the fourth HVPW 82d to form successive concentric rings fourth high voltage p-well (HVPW) 82d forms a central location of the bi-directional protection device 300.

In addition, the bidirectional protection device 300 further includes a ninth ring formed by a fifth high voltage n-well (HVNW) 84e surrounding the fifth high voltage p-well (HVPW) 82e and a tenth ring formed by a sixth high voltage p-well (HVPW) 82f surrounding the fifth high voltage n-well (HVNW) 84e. The bi-directional protection device 300 further includes a p-type epitaxial layer (P-EPI) 91 surrounding the tenth ring formed by the sixth high voltage p-well (HVPW).

For purposes of clarity, only the HVNWs and HVPWs have been illustrated in the top plan layout view of FIG. 12A. Similar to the protection device illustrated in FIG. 6B, the bi-directional protection device 300 of FIG. 11A includes second, third, fifth, and sixth active (P+) regions 83b, 83c, 83e, 83f, first to sixth n-type active (N+) regions 85a-85f, first and second gate oxide layers 86a, 86b, first and second gates 87a, 87b, and oxide regions 88. In addition, the bi-directional protection device 300 includes a seventh n-type active (N+) region formed in the fifth HVNW 84e a sixth p-type active (P+) region 83f formed in the sixth HVPW 82f. In addition, oxide regions 88 are disposed between the fifth P+ region 83e and seventh N+ region 85g, between seventh N+ region 85g and sixth P+ region 83f, and between sixth P+ region 83f and P-EPI 91.

Also similar to the protection device 100 of FIG. 6B, the deep p-well (DPW) 93 of the bidirectional protection device 300 is disposed below the second and third high voltage n-wells (HVNWs) 84b and 84c, first to third high voltage p-wells (HVPWs) 82a-82c, first and second shallow n-wells (SHNWs) 94a and 94b, and a shallow p-well (SHPW) 92, to form an annular ring surrounding a central location of the bi-directional protection device 300 comprising the fourth high voltage p-well (HVPW) 82d. Also similar to the protection device 100 of FIG. 6B, the n-type buried layer (NBL) 89 is disposed below the HVNW 84a, HVNW 84d, HVPW 82d, and DPW 93 to surround the DPW 93.

The first to fifth HVNWs 84a-84e and first to sixth HVPWs 82a-82f of the bidirectional protection device 300 has a first depth $h_1$ into the p-type substrate (P SUB 81). The bidirectional protection device 300 further includes a p-type epitaxial layer (P-EPI) 91 similar to the protection device 100 of FIG. 6B, except that the P-EPI 91 has a second depth $h_2$ that extends deeper than the first depth $h_1$. As a result, the P-EPI 91 includes a first p-type epitaxial region that horizontally surrounds the sixth HVPW 82f and a second p-type epitaxial region disposed below the first p-type epitaxial region, the sixth HVPW 82f, the fifth HVNW 84e, and the fifth HVPW 82e to horizontally surround DPW 93. Additionally, the bi-directional protection device 300 also includes a p-type substrate (P-SUB) 81 disposed below the NBL 89 and P-EPI 91.

The bidirectional protection device 300 in the illustrated embodiment includes a series resistor 96 disposed above the silicon substrate and formed over at least a portion of the fifth P+ region 83e, over at least a portion of the first N+ region 85a, and over the oxide region 88 between the P+ region 83e and the N+ region 85a. In an embodiment, the series resistor 96 extends in a radial direction parallel to the surface of the substrate to overlap a portion of the fifth P+ region 83e and a portion of the first N+ region 85a. In another embodiment, the series resistor 96 extends to overlap the entire fifth P+ region 83e and the entire first N+ region 85a in a radial direction parallel to the surface of the substrate.

In an embodiment, the series resistor 96 comprises n-type poly silicon. In another embodiment, the series resistor 96 comprises p-type poly silicon. In yet another embodiment, the series resistor 96 comprises a metal or a metal nitride.

The illustrated embodiment in FIG. 11A further includes first and second gate oxide layers 86a and 86b and first and second gates 87a and 87b. Similar to its function described in FIG. 6B, during a transient electrical event that increases a voltage difference between the first pad 61 and the second pad 62, the first and second gates 87a and 87b allow the current to flow with more lateral uniformity from the first pad 61 to the first gate 87a, and from the second pad 62 to the second gate 87b, respectively. In another embodiment illustrated in FIG. 11B, the first and second gates 87a and 87b may be replaced with oxide regions 88 disposed between the P+ region 83c and N+ region 85d and between N+ region 85c and P+ region 83b, respectively.

FIG. 11A has been annotated to show various dimensions of the wells, regions, and layers described above for the bidirectional protection device 300. Similar to the protection device 100 of FIG. 6B, the first through fourth dimensions $d_1$ through $d_4$ correspond to widths of HVPW 82b, HVNW 84b, the spacing between the third N+ region 85c and the second P+ region 83b, and the spacing between the second P+ region 83b and the second N+ region 85b. In addition, fifth through ninth dimensions $d_5$ through $d_9$ correspond to widths of HVNW 84a, HVPW 82e, HVNW 84e, HVPW 82f, and the series resistor 96.

In one embodiment, the first through fourth dimensions $d_1$ through $d_4$ are similar to those described in connection with the protection device 100 of FIG. 6B. In addition, the fifth dimension $d_5$ has a size selected to be in the range of about 3.5 µm to about 5 µm, for instance, 4 µm, the sixth dimension $d_6$ has a size selected to be in the range of about 4 µm to about 5 µm, for instance, 4 µm, the seventh dimension $d_7$ has a size selected to be in the range of about 3.0 µm to about 6.0 µm, for instance, 4.0 µm, the eighth dimension $d_8$ has a size selected to be in the range of about 3.5 µm to about 8 µm, for instance, 5 µm, and the ninth dimension $d_9$ has a size selected to be in the range of about 1.5 µm to about 2 µm, for instance, 1.8 µm. However, other dimensions will be readily determined by one of skill in the art.

In one embodiment, peak doping concentrations of the P-SUB 81, the P-EPI 91, DPW 93, NBL 89, P+ regions 83a-83d and the N+ regions 85a-85f, the SHPW 92 and the SHNWs 94a, 94b, and the HVPWs 82a-82c and HVNWs 84a-84d have a peak doping concentration similar to the values for the protection device 80 in FIG. 5A. In addition, P+ regions 83e and 83f and N+ region 85g have a peak doping concentration in the range of about $1 \times 10^{20}$ cm$^{-3}$ to about $8 \times 10^{20}$ cm$^{-3}$, for example, about $2 \times 10^{20}$ cm$^{-3}$. In addition, HVPWs 82d-82f and HVNWs 84e have a peak doping concentration in the range of about $1.5 \times 10^{16}$ cm$^{-3}$ to about $7.5 \times 10^{16}$ cm$^{-3}$, for example, about $5.0 \times 10^{16}$ cm$^{-3}$. Although various ranges of peak doping concentrations and depth have been described above, persons having ordinary skill in the art will readily ascertain other suitable doping concentrations.

Figure 12B:
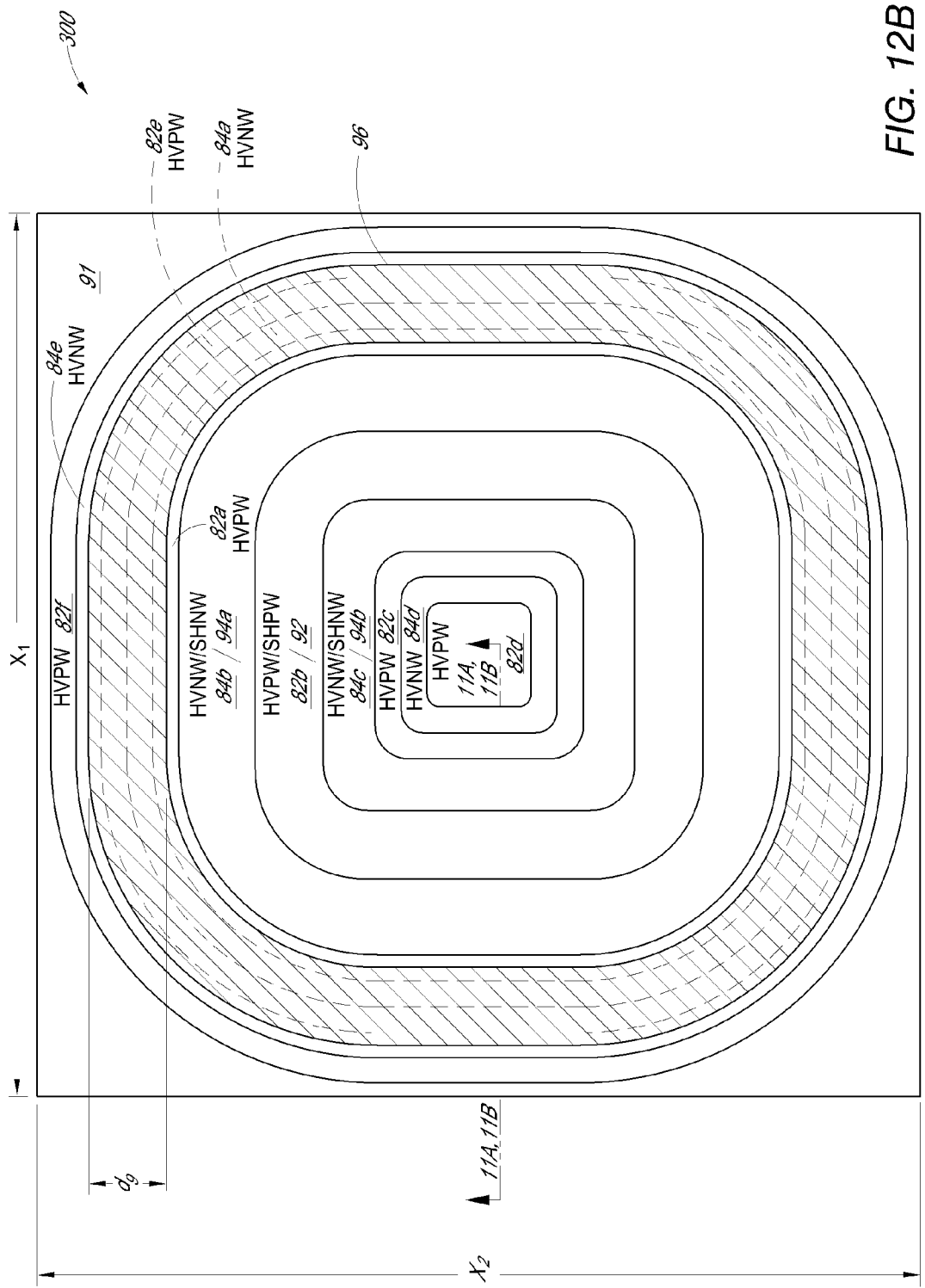
FIG. 12B is a schematic top plan layout view of a bidirectional protection device for transceiver signal isolation and voltage clamp according to another embodiment.

FIG. 12B illustrates a schematic top plan view of the bidirectional protection device 300 according to another embodiment. For clarity, FIG. 12B only shows overlapping regions between the series resistor 96 and various well regions below the active regions (first though seventh N+ regions 85a-85g and second, third, fifth, and sixth P+ regions 83b, 83c, 83e, 83f) and oxide regions 88). Due to the symmetry of the illustrated embodiment, features discussed below with respect to half of the device (shown in the figures) can also be applicable to the other half of the device (not shown).

A cross sectional view though 11A-11A of FIG. 12B is similar to FIG. 11A except that series resistor 96 in FIG. 12B overlaps a wider horizontal region compared FIG. 11A. In particular, the embodiment of FIG. 12B illustrates a series resistor 96 forming a ring surrounding the central area comprising HVPW 82d and horizontally overlapping HVPW 82e and HVNW 84a and portions of HVPW 82a and HVNW 84e. The inner edge of the series resistor 96 is disposed within the HVPW 82a and an outer edge of the series resistor 96 is disposed within the HVNW 84e. While not shown for clarity, the inner edge of the series resistor 96 is disposed within the oxide region 88 between N+ region 85a and N+ region 85b, and the outer edge of the series resistor 96 is disposed within the oxide region 88 between N+ region 85g and P+ region 83e.

Other embodiments are possible, where the series resistor 96 forms a ring to horizontally overlap substantially all of HVPW 82e and HVNW 84a without substantially overlapping portions of HVPW 82a and HVNW 84e. While not shown for clarity, in this embodiment, the inner edge of the series resistor 96 can be disposed near the boundary between the oxide region 88 between N+ region 85a and N+ region 85b, and the outer edge of the series resistor 96 would be disposed near the boundary between P+ region 83e and the oxide region 88 between N+ region 85g and the P+ region 83e.

Yet other embodiments are possible, such as that shown in FIG. 11A, where the series resistor 96 forms a ring to horizontally overlap portions of HVPW 82e and HVNW 84a without overlapping portions of HVPW 82a and HVNW 84e. While not shown for clarity, in this embodiment, the inner edge of the series resistor 96 can be disposed within the N+ region 85a, and the outer edge of the series resistor 96 can be disposed within the P+ region 83e.

Designing the series resistor mask such that the inner and outer edges fall within oxide regions 88 can have an advantage in that the first and second edges can fall anywhere within the oxide regions 88 without substantially impacting the electrical characteristics of the series resistor 96 because an area of overlap between the series resistor 96 and the oxide regions 88 does not affect the contact resistance between the series resistor and the corresponding N+ and P+ regions.

Designing the series resistor mask such that the series resistor edges fall within various regions is a design consideration for a person having ordinary skill in the art to choose. In one implementation, designing the series resistor mask such that the inner and outer edges of the series resistor 96 fall within the oxide regions 88 as described above may offer, for example, a lithographic advantage because the inner and outer edges of the series resistor 96 may fall anywhere within the oxide regions 88 without causing an electrical short. In addition, such a design may also offer an advantage in etch processing because of a higher etch selectivity between the series resistor 96 (e.g., polysilicon) and isolation material (e.g., $SiO_2$) in the oxide regions 88. In terms of electrical tradeoffs, the design may result in an increased resistance value of the series resistor 96 due to an increased length in the radial direction parallel to the substrate surface. The contact resistances associated with the points of contact between the series resistor 96 and the active regions may remain relatively unchanged because the areas of overlap between the series resistor 96 and the N+ region 85a and P+ region 83e remain independent of the position of the first and second edges of the series resistor 96 within the isolation regions.

In another implementation, designing the series resistor mask such that the inner and outer edges of the series resistor 96 fall within the N+ region 85a and the P+ region 83e may offer less of a processing advantage, for example, because while the inner and outer edges of the series resistor 96 may fall anywhere within the active regions and still make electrical contact, there may be less of an etch selectivity between the resistor 96 and the active regions. In terms of electrical tradeoffs, the design may offer a reduced resistance value of the series resistor 96 due to a reduced length of the series resistor in the radial direction parallel to the substrate surface. The contact resistances associated with the points of contact between the series resistor 96 and the active regions may increase due to decreased areas of overlap between the series resistor 96 and the N+ region 85a and P+ region 83e.

Figure 12C:
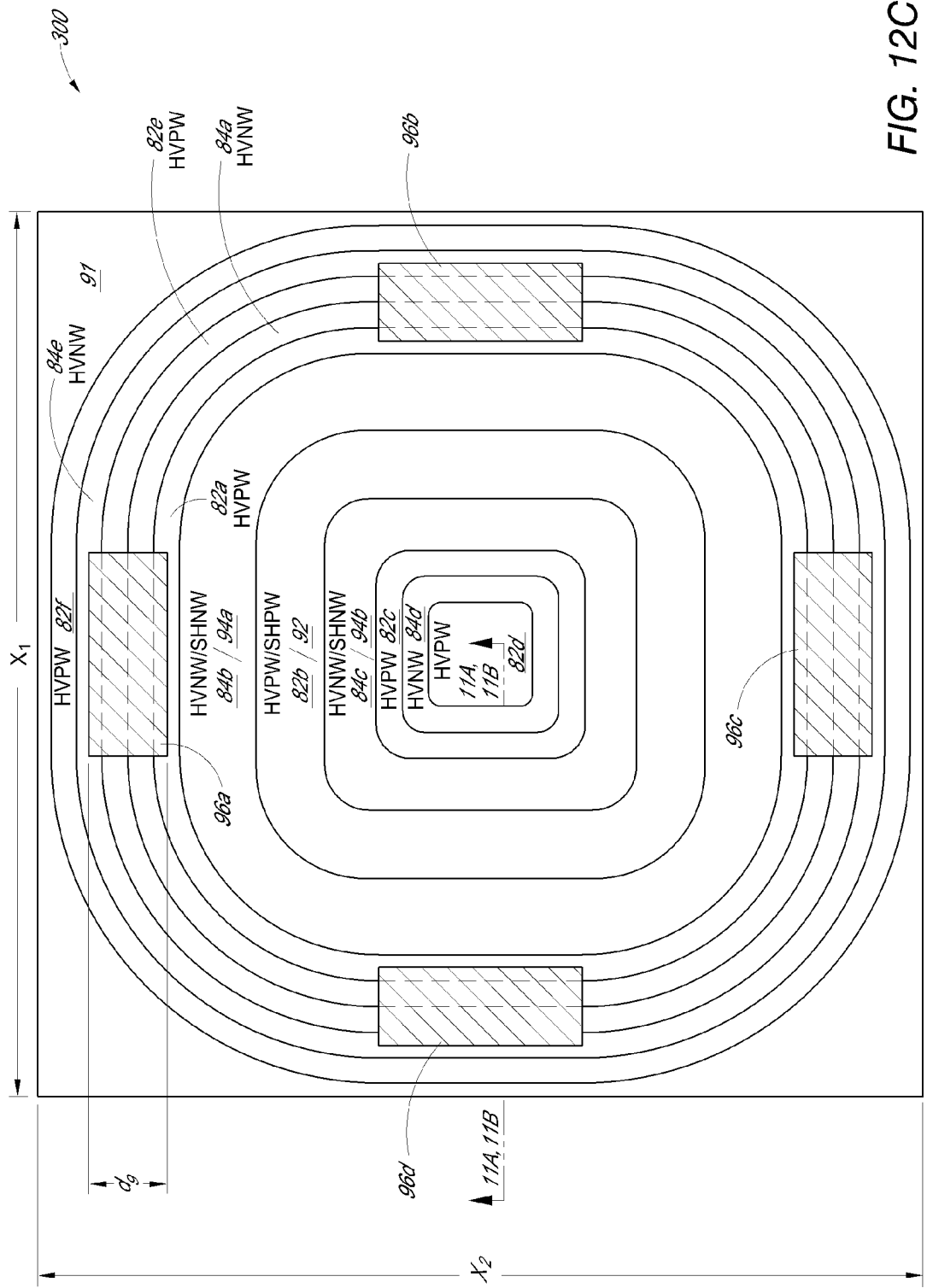
FIG. 12C is a schematic top plan layout view of a bidirectional protection device for transceiver signal isolation and voltage clamp according to yet another embodiment.

FIG. 12C illustrates a schematic top plan view the bidirectional protection device 300 according to yet another embodiment. For clarity, FIG. 12C only shows overlapping regions between first through fourth resistor segments 96a-96d and various well regions below the active regions (first though seventh N+ regions 85a-85g and second, third, fifth, and sixth P+ regions 83b, 83c, 83e, 83f) and oxide regions 88. Due to the symmetry of the illustrated embodiment, features discussed below with respect to half of the device (shown in the figures) can also be applicable to the other half of the device (not shown). The embodiment of FIG. 12C is similar to the embodiment of FIG. 12B, except that instead of the series resistor 96 forming a single ring, the embodiment includes first through fourth resistor segments 96a-96d. Each of the first through fourth resistor segments 96a-96d form a partial ring having first though fourth inner edge segments with first through fourth inner edge lengths and having first through fourth outer edge segments having edge first through fourth outer edge lengths extending along a tangential direction of each resistor segment parallel to the substrate surface. Additionally, each of the first through fourth resistor segments 96a-96d has a segment width extending in a radial direction of each partial ring segment of the bidirectional protection device 300 parallel to the substrate surface.

All of the design considerations discussed above in connection with FIG. 12B are applicable in this embodiment, including the location of the termination of first and second edges of each resistor segments in the radial direction parallel to the substrate surface. In addition, the embodiment may offer an additional degree of freedom in controlling the combined resistance of the resistor segments, for example the number of resistor segments. While the embodiment of FIG. 12C shows first through fourth resistor segments 96a-96d, other embodiments are possible, where the number of resistor segments may be any suitable number to give a suitable resistance value of each segment, and a suitable resistance value of the total resistance from the segments arranged in electrical parallel. Additionally, the length of each of the resistor segments may offer another degree of freedom in controlling the combined resistance of the resistor segments. Any suitable lengths of the first through fourth resistor segments 96a-96d in the tangential direction parallel the substrate surface may be chosen to give a suitable resistance value of each segment, and a suitable resistance value of the total resistance from the segments arranged in electrical parallel.

In one embodiment, the footprint of the bidirectional protection device 300 of FIGS. 12A-12C has a width $x_1$ in the range of about 220 μm to about 170 μm, for example, about 200 μm, and the protection device 100 has a height $x_2$ in the range of about 220 μm to about 170 μm, for example, about 200 μm for a 8 kV IEC-61000-4-2 ESD robustness level. However, other dimensions will be readily determined by one of skill in the art.

Figure 12D:
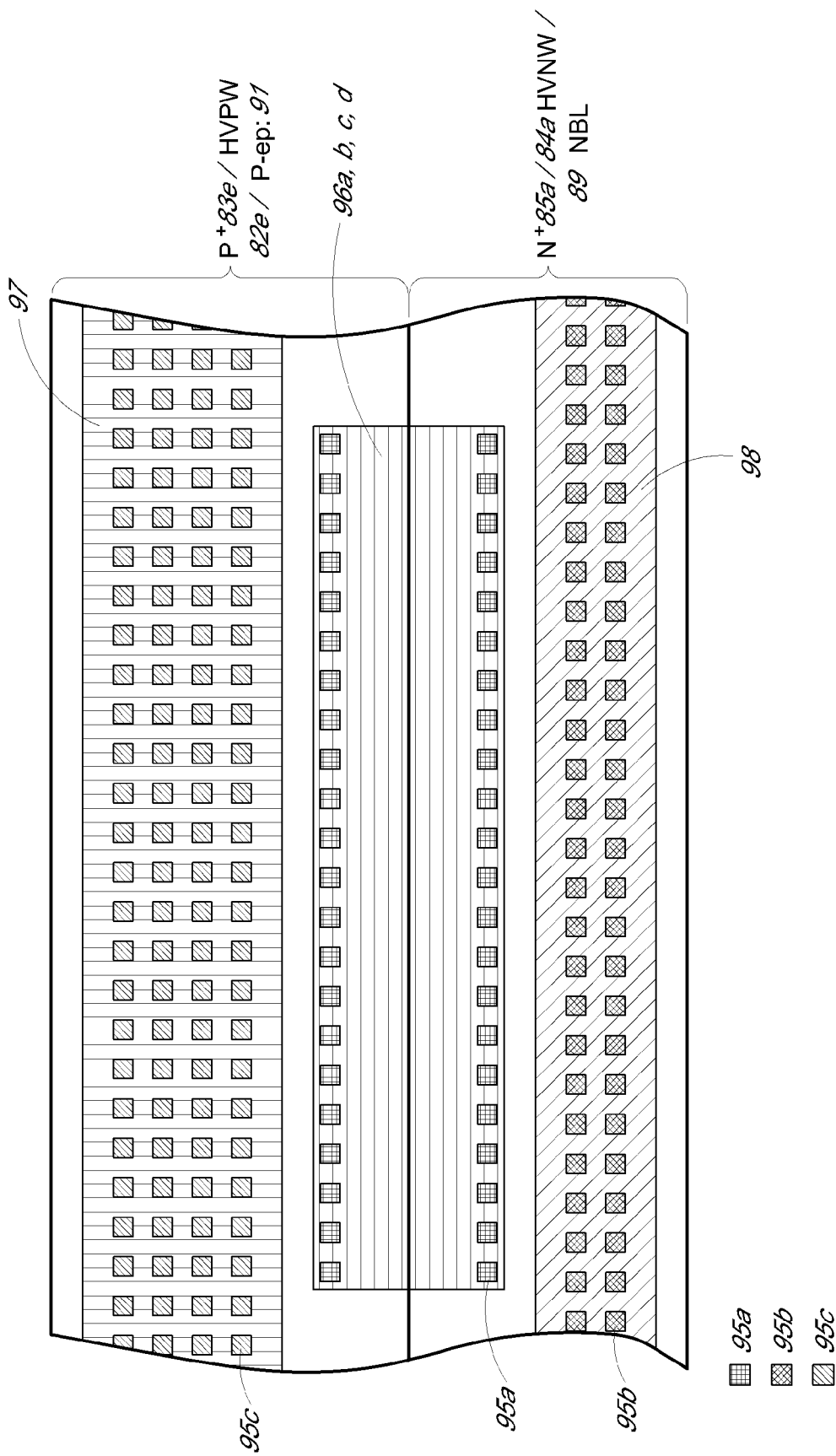
FIG. 12D is a schematic detailed top plan layout view of a bidirectional protection device for transceiver signal isolation and voltage clamp of FIG. 12C.

FIG. 12D shows one embodiment of any of the first to fourth series resistor segments 96a-96d. In particular, the embodiment relates to how each ends of the resistor segment in the radial direction may be connected to the HVPW 82e and the HVNW 84a through the P+ region 83e and the N+ region 85a, respectively. In the illustrated embodiment, only the first resistor segment 96a is shown for clarity. The first resistor segment 96a is horizontally disposed between an HVPW line 97 and an HVNW line 98. The HVPW line 97 is connected to P+ region 83e via contacts 95c and the HVNW line 98 is connected to N+ region 85a via contacts 95b. The illustrated embodiment corresponds to the case where the first resistor segment 96a forms (or any one of the second through fourth resistor segments 96b-96d similarly forms) a partial ring to horizontally overlap portions of P+ region 83e/HVPW 82e and N+ region 85a/HVNW 84a without overlapping portions of HVPW 82a and HVNW 84e. The resistor segment 96a has a first inner edge segment on the side closer to the N+ region 85a/HVNW 84a and a first outer edge segment on the side closer to the P+ region 83e/HVPW 82e. The first resistor segment 96a further includes an inner overlap region where the first resistor segment 96a horizontally overlaps the N+ region 85a/HVNW 84a and an outer overlap region where the first resistor segment 96a horizontally overlaps the P+ region 83e/HVPW 82e. Disposed horizontally within the inner and outer overlap regions and vertically disposed between the first resistor segment 96a and the N+ region 85a and the P+ region 83e is a plurality of series resistor via contacts 95a. The series resistor via contacts 95a electrically connect the P+ region 83e/HVPW 82e and N+ region 85a/HVNW 84a, for example, to provide the twelfth resistor in FIG. 10.

While the embodiment in FIG. 12D illustrates a connection method for connecting first to fourth series resistor segments 96a-96d of FIG. 12C to the HVPW 82e and HVNW 84a through the P+ region 83e and N+ region 85a, other embodiments are possible. For example, a similar connection method may be used to connect series resistor 96 of FIG. 12B, or any of other arrangements of the resistor ring and segment configurations discussed above.

The density per unit area and lateral dimensions of the series resistor via contacts 95a that may be employed under various embodiments depend on the circumstances and is a matter of design choice by a person skilled in the art. For example, a person skilled in the art may use any suitable number density and any suitable dimension of the series resistor via contacts 95a to target a resistance value of the series resistor 96 or resistance values of first through fourth series resistor segments 96a-96d.

Figure 11B:
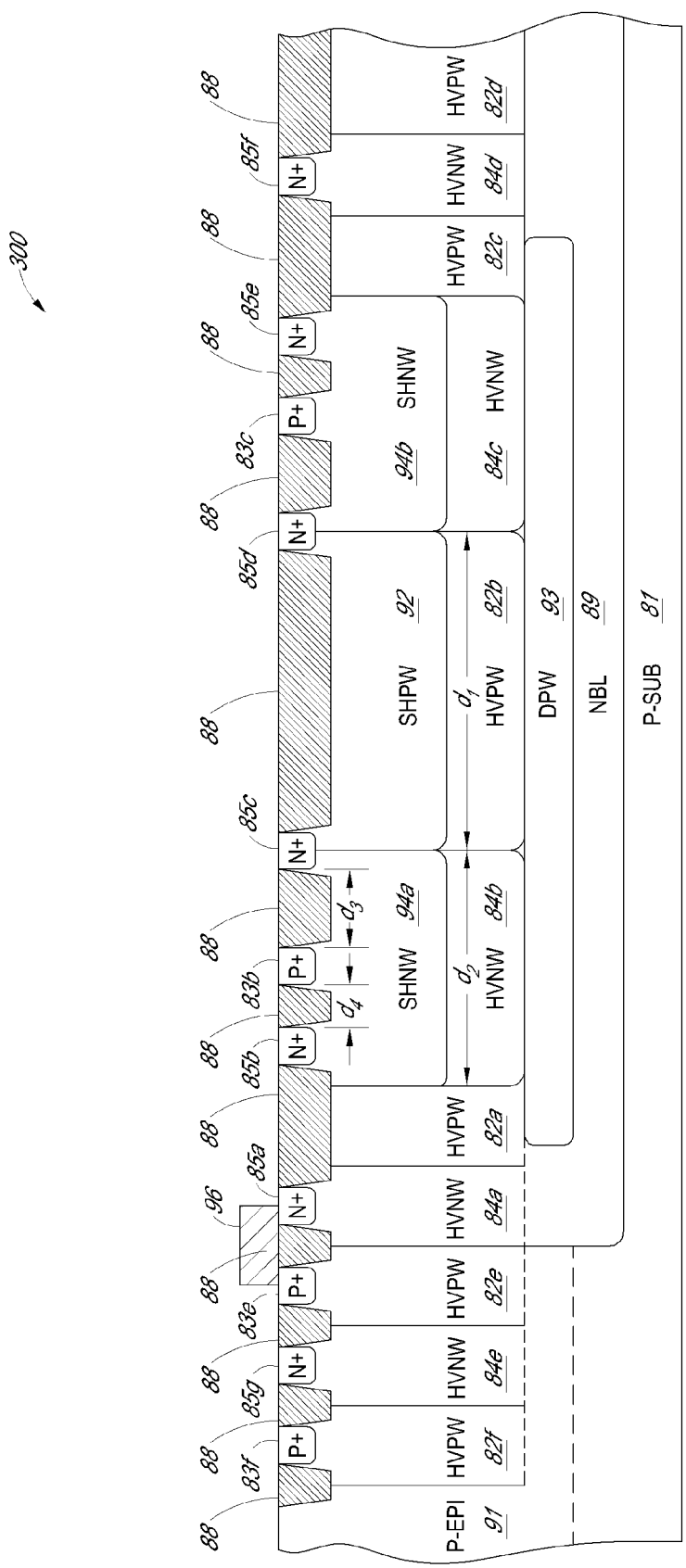
FIG. 11B is an annotated cross section view of a bidirectional protection device for transceiver signal isolation and voltage clamp according to another embodiment.
Figure 13A:
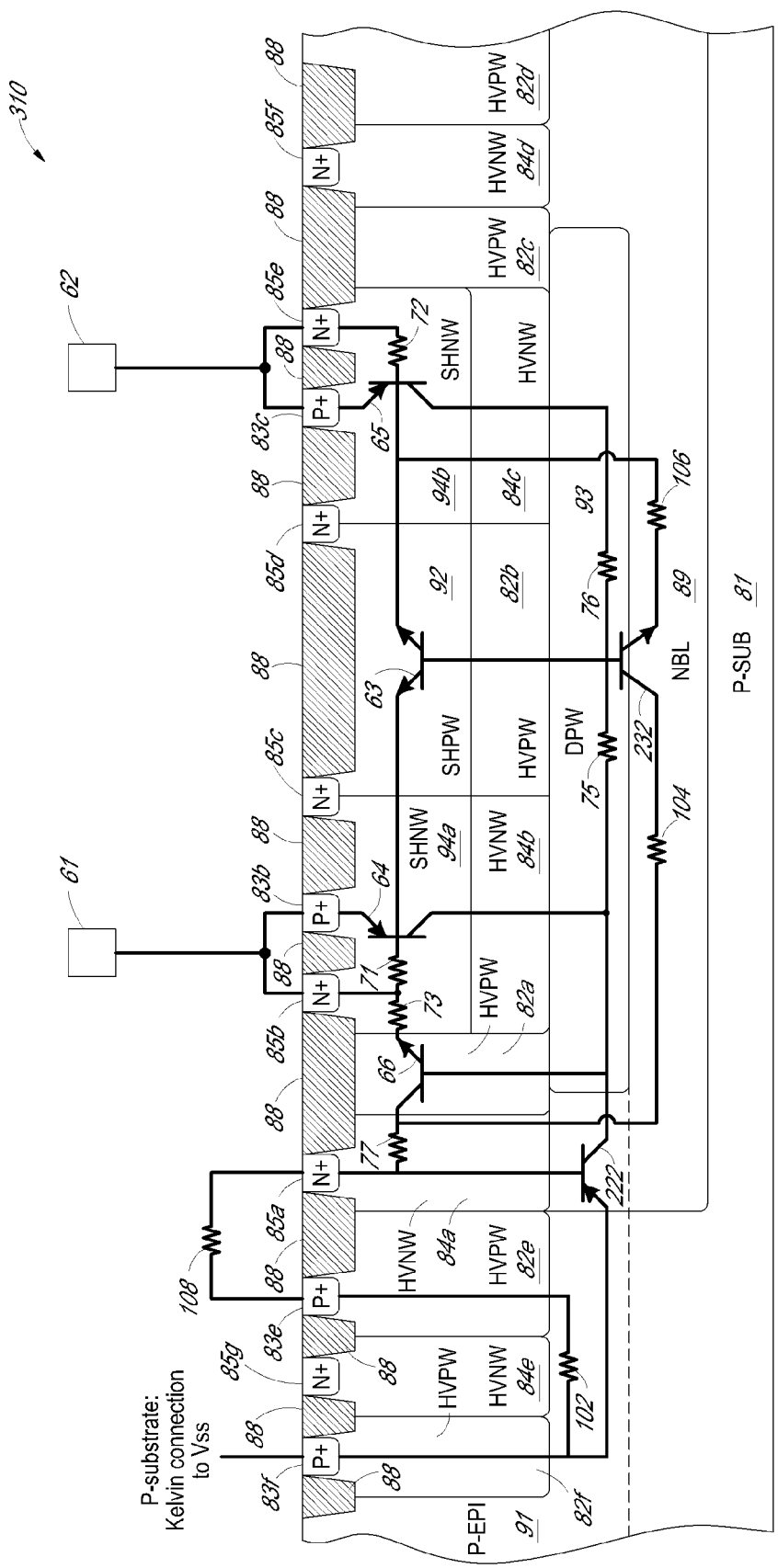
FIG. 13A is an annotated cross section view a bidirectional protection device for transceiver signal isolation according to an embodiment similar to FIG. 11B.
Figure 13B:
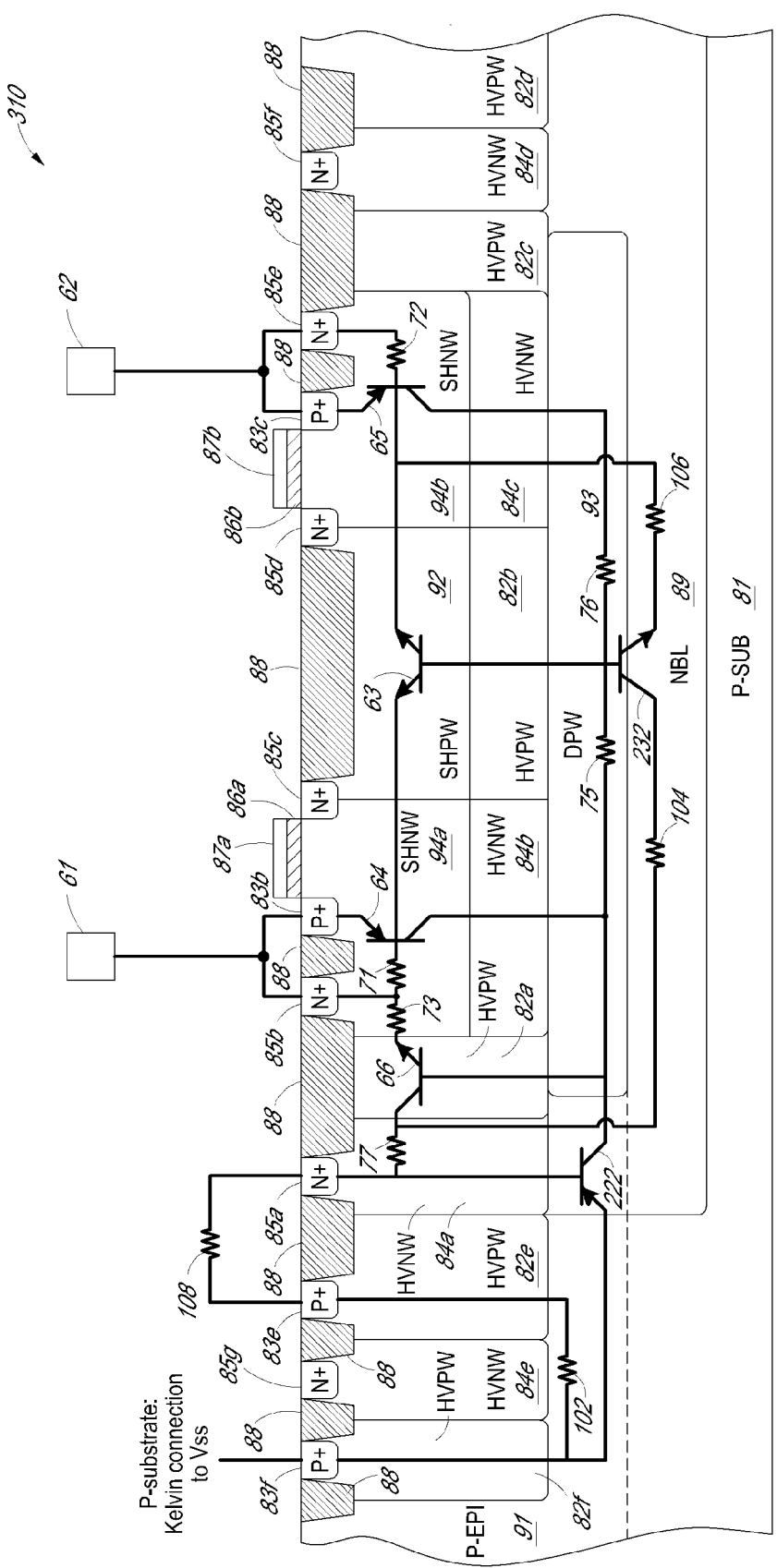
FIG. 13B is an annotated cross section view a bidirectional protection device for transceiver signal isolation according to another embodiment similar to FIG. 11B.

FIGS. 13A and 13B show alternative embodiments of the bidirectional protection circuit 310 similar to the bidirectional protection circuit 300 of FIGS. 11B and 11A, respectively, with annotations made with relevant circuit elements. The bidirectional protection circuit 310 in FIG. 13A is similar to that in FIG. 13B except that in FIG. 13A, the first and second gates 87a and 87b are replaced with oxide regions 88 disposed between the third P+ region 83c and fourth N+ region 85d and between third N+ region 85c and second P+ region 83b, respectively. The operational differences relating to the first and second gates 87a and 87b between the two embodiments are as discussed above in reference to FIGS. 11A and 11B.

The connections with respect to the first pad 61 and the second pad 62 are similar to the corresponding features in FIG. 5B. Additionally, the electrical configurations with respect to the various physical regions of the NPN bi-directional bipolar transistor 63, the first PNP bipolar transistor 64, the second PNP bipolar transistor 65, the first through third resistors 71-73, the fifth resistor 75, and the sixth resistor 76 are similar to the corresponding features in FIG. 5B. As a result, the device response of the bipolar PNPNP device assembly including the NPN bi-directional bipolar transistor 63, the first PNP bipolar transistor 64, and the second PNP bipolar transistor 65 is similar to that described above in connection with FIG. 5B. In addition, the device response of first and second parasitic PNPN device assemblies 220 and 230 is similar to that described above in connection with FIG. 10.

In contrast to FIG. 5B, in the embodiment in FIGS. 13A and 13B, the n-type tub formed from the NBL 89 and the first and fourth HVNWs 84a, 84d is not floating. Instead, the n-type tub is electrically connected to the p-substrate of the transceiver circuit 1 (Kelvin connection to Vss) through the twelfth resistor 108 formed from the resistance of the series resistor 96 serially connected to the ninth resistor 102 formed from the resistance of the P-EPI 91 disposed below the HVPW 82f, HVNW 84e, and HVNW 82e. Similar to FIG. 5B, the p-type tub formed from the DPW 93 and the first and third HVPWs 82a, 82c can be electrically floating.

Additionally, the embodiment of FIG. 13A shows a first parasitic PNPN device assembly similar to the first parasitic PNPN device assembly 220 described in FIG. 10, including a parasitic PNP bipolar transistor 222, a first parasitic NPN bipolar transistor 66, a seventh resistor 77, a ninth resistor 102, and a twelfth resistor 108. The parasitic PNP bipolar transistor 222 includes an emitter formed from P-EPI 91, a base formed from the NBL 89, and a collector formed from DPW 93. The emitter of the parasitic PNP bipolar transistor 222 is electrically connected to the p-substrate of the transceiver circuit 1 (Kelvin connection to VSS) and to the ninth resistor 102 formed from the resistance within the P-EPI 91. The parasitic PNP bipolar transistor 222 further includes a base connected to the emitter through the ninth resistor 102 and the twelfth resistor 108 formed from the resistance of the resistor 96 of FIGS. 11A and 11B connected in electrical series with the ninth resistor 102. The base of the parasitic PNP bipolar transistor 222 is further connected to a collector of the first parasitic NPN bipolar transistor 66 through the seventh resistor 77. The first parasitic NPN bipolar transistor 66 includes an emitter formed from SHNW 94a/HVNW 84b, a base formed from HVPW 82a, and a collector formed from NBL 89. The seventh resistor 77 is formed from the resistance within HVNW 84a. The parasitic PNP bipolar transistor 222 further includes a collector connected to a base of the first parasitic NPN bipolar transistor 66. The first parasitic NPN bipolar transistor 66 includes an emitter electrically connected to the third resistor 73 formed from the resistance of SHNW 94a and a base electrically connected to the collector of the parasitic PNP bipolar transistor 222. The first parasitic NPN bipolar transistor 66 further includes a collector electrically connected to the base of the parasitic bipolar PNP transistor 222 through the seventh resistor 77.

FIG. 13A further shows a second parasitic PNPN device assembly similar to the second parasitic PNPN device assembly 230 described in FIG. 10, including a parasitic PNP bipolar transistor 222, a second parasitic NPN bipolar transistor 232, a fifth resistor 75, a seventh resistor 77, a ninth resistor 102, a tenth resistor 104, and a twelfth resistor 108. The parasitic PNP bipolar transistor 222 includes an emitter formed from P-EPI 91, a base formed from the NBL 89, and a collector formed from DPW 93. The parasitic PNP bipolar transistor 222 includes an emitter electrically connected to the p-substrate (Kelvin connection to VSS) and to the ninth resistor 102 formed from the resistance within the P-EPI 91. The parasitic PNP bipolar transistor 222 further includes a base connected to the emitter through the ninth resistor 102 and the twelfth resistor 108 formed from the resistance of the resistor 96 of FIGS. 11A and 11B connected in electrical series with the ninth resistor 102. The base of the first parasitic PNP bipolar transistor 220 is further connected to a collector of the second parasitic NPN bipolar transistor 232 through the seventh resistor 77 and the tenth resistor 104 connected in series. The second parasitic NPN bipolar transistor 232 includes an emitter formed from SHNW 94b/HVNW 84c, a base formed from DPW 93, and a collector formed from NBL 89. The seventh resistor 77 is formed from the resistance of HVNW 84a and the tenth resistor 104 is formed from the resistance in the NBL 89. The parasitic PNP bipolar transistor 222 further includes a collector connected to a base of the second parasitic NPN bipolar transistor 232 through the fifth resistor 75 formed from the resistance in the DPW 93. The second parasitic NPN bipolar transistor 232 includes an emitter connected to the eleventh resistor 106 formed from the resistance in the SHNW 94b/HVNW 84c and a base electrically connected to the collector of the parasitic PNP bipolar transistor 222 through the fifth resistor 75. The second parasitic NPN bipolar transistor 232 further includes a collector electrically connected to the base of the parasitic PNP bipolar transistor 222 through the tenth resistor 104 and the seventh resistor 77.

Figure 13C:
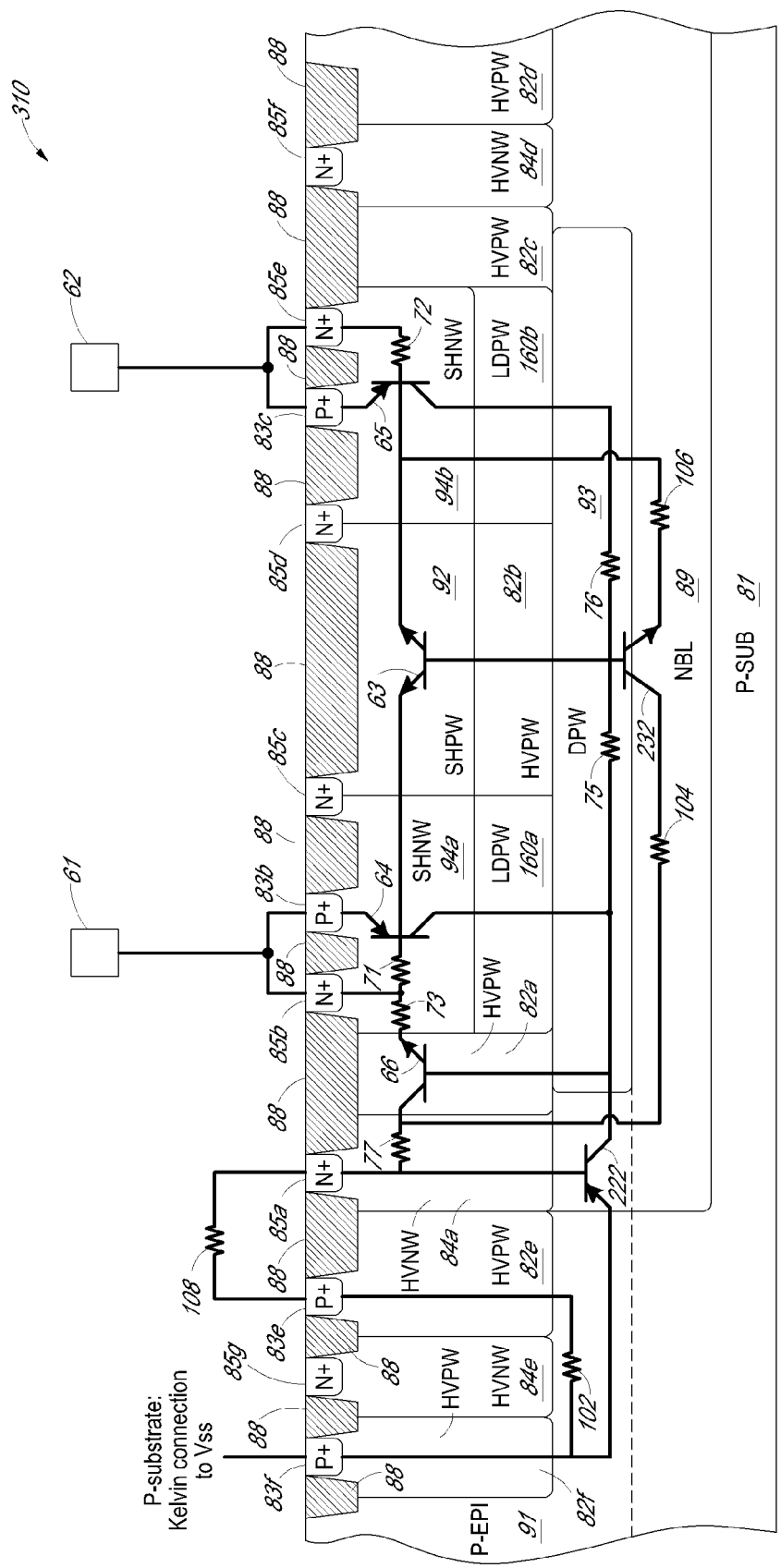
FIG. 13C is an annotated cross section view a bidirectional protection device for transceiver signal isolation according to yet another embodiment.

FIG. 13C shows yet another alternative embodiment. The embodiment of the bidirectional protection device 310 in FIG. 13C is similar to that shown in FIG. 13A except that the HVNW 84b and HVNW 84c may be replaced with lightly doped p-well regions LDPW 160a and LDPW 160b, respectively. The p-type region 160 can have a doping concentration similar to that of a background doping concentration, such as a doping concentration P-EPI 91. LDPW 160a and LDPW 160b may provide similar fine-tuning impact on the device behavior illustrated in FIGS. 9A and 9C. In particular, including the LDPW 160a and LDPW 160b can increase the base resistance of the first and second PNP bipolar transistors 64 and 65 of FIG. 13A. As a result, the transient response time may improve, and the trigger voltage of the bidirectional PNPNP device assembly 210 may also decrease due to an increased gain of the first and second PNP bipolar transistors 64 and 65. Other embodiments are possible in which the regions LDPW 160a and LDPW 160b are doped to different levels to asymmetrically vary the trigger voltage of the bidirectional PNPNP device assembly 210.

As discussed above it may be desirable to have the value of the combined resistances of the ninth and the twelfth resistors 102 and 108 be at an intermediate value, where the parasitic PNP bipolar transistor 222 is configured to be in the BVCER (breakdown with emitter-base connected by a resistor). In one embodiment, the value of ninth resistor 102 may be designed to have a value in the range between about 200 milliohms (mohms) and about 5 ohms, for instance, about 500 mohms. Such values may be obtained by, for example, controlling the level of activated dopants in the P-EPI 91. In another embodiment, the value of the twelfth resistor 108 may be designed to have a value in the range between about 200 mohms and 20 ohms, for instance 2 ohms. Such values may be obtained by, for example, controlling the level of activated dopants in the series resistor 96 of FIG. 12B or in the series resistor segments 96a-96d of FIG. 12C.

Figure 14A:
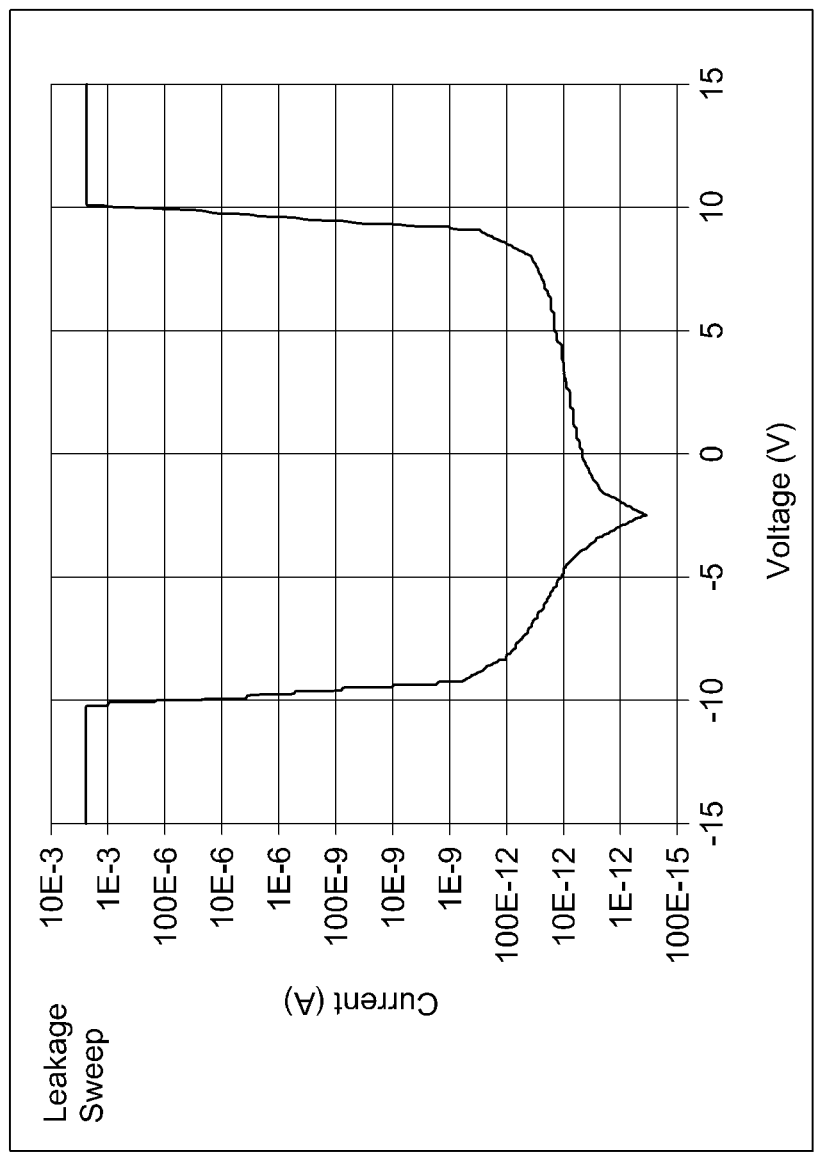
FIG. 14A is a current-voltage measurement of a bidirectional protection device for transceiver signal isolation in the high impedance state in both positive and negative voltage sweeps according to one embodiment.

FIG. 14A illustrates a current-voltage (IV) sweep made across first and second pads 61 and 62 of one embodiment of a bidirectional protection circuit similar to the bidirectional protection circuit 200 of FIG. 10 in a high impedance state, (i.e., pre-trigger). The x-axis represents the voltage difference between the first and second pads 61 and 62 in units of volts (V) and the y-axis represents the corresponding absolute value of the current measured in units of amps (A). In the illustrated embodiment, the current in absolute value does not exceed about $2 \times 10^{-11}$ A at positive and negative 5V between the first and second pads 61 and 62. In addition, up to about positive and negative 10V, none of the SCR device pairs described in FIG. 10 have exceeded their trigger voltage. In particular, at +/−10V, the voltage across first and second pads 61 and 62 has not exceeded +/−$V_{TR}$ of the bipolar PNPNP device assembly 210, which includes the NPN bi-directional bipolar transistor 63, the first PNP bipolar transistor 64, and the second PNP bipolar transistor 65, as indicated by a lack of a current snap-back event which may occur as shown schematically in FIG. 2. Additionally, at +/−10V across the first and second pads 61 and 62, the trigger voltage of the first parasitic PNPN device assembly 220, including the parasitic PNP bipolar transistor 222 and the first parasitic NPN bipolar transistor 66, has not been exceeded. Similarly, at +/−10V across first and second pads 61 and 62, the trigger voltage of the second parasitic PNPN device assembly 230, including the parasitic PNP bipolar transistor 222 and the second parasitic NPN bipolar transistor 232, has not been exceeded.

Figure 14B:
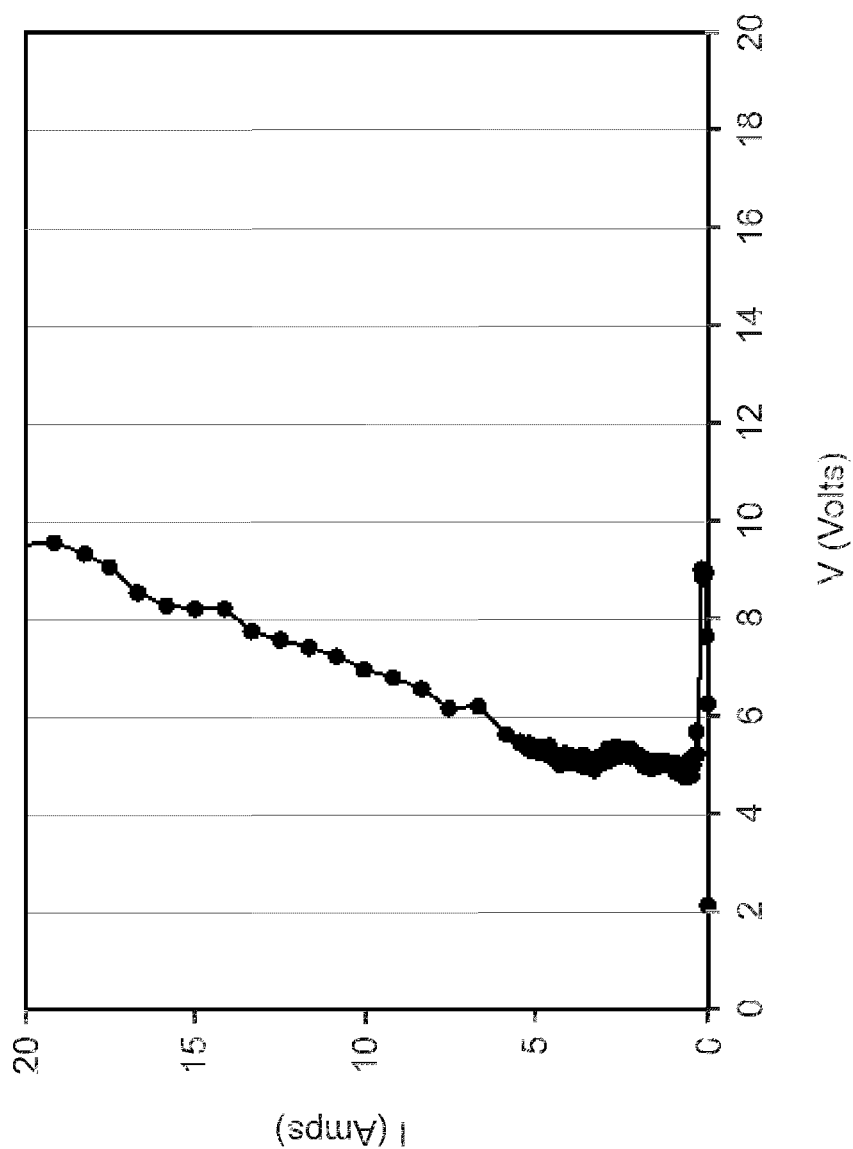
FIG. 14B is a current-voltage measurement of a bidirectional protection device for transceiver signal isolation illustrating the transition from high to low impedance states in positive voltage sweep according to one embodiment.
Figure 14C:
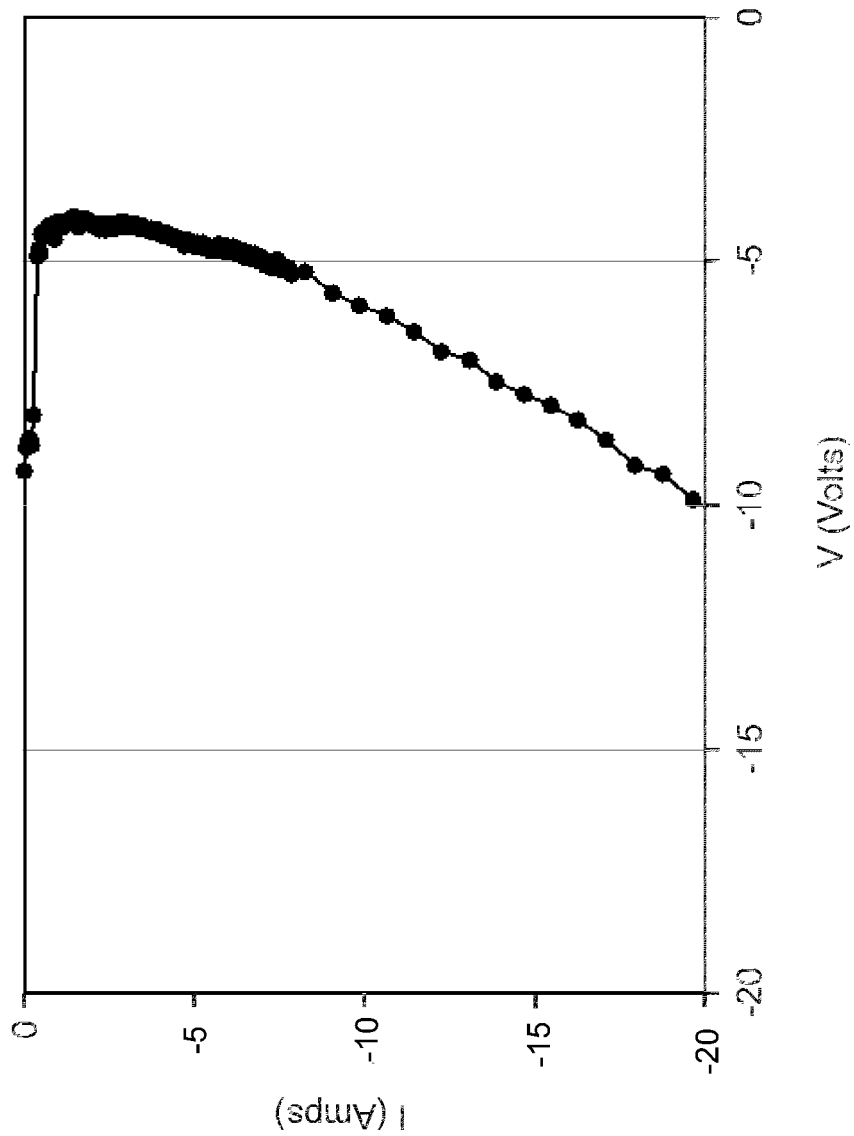
FIG. 14C is a current-voltage measurement of a bidirectional protection device for transceiver signal isolation illustrating the transition from high to low impedance states in negative voltage sweep according to one embodiment.

FIGS. 14B and 14C illustrate a current-voltage (IV) sweep made across first and second pads 61 and 62 of one embodiment of a bidirectional protection circuit similar to the bidirectional protection circuit 200 of FIG. 10. In these embodiments, the sweep has been made through a triggering event into a low positive impedance state, (i.e., post-trigger). X-axes of FIG. 14B and FIG. 14C represent the voltage difference between the first and second pads 61 and 62 in units of volts (V). Y-axes of FIGS. 14B and 14C represent values of the current measured in units of positive and negative amps (A), respectively. In the illustrated embodiment, at about +9V in FIG. 14B or at about −9V in FIG. 14C, the absolute voltages across first and second pads 61 and 62 have exceeded the +/−$V_{TR}$ of the bipolar PNPNP device assembly 210, which includes the NPN bi-directional bipolar transistor 63, the first PNP bipolar transistor 64, and the second PNP bipolar transistor 65, as indicated by current snap-back events. After triggering, the bidirectional protection circuit 200 enters the low impedance state and the absolute voltage across the PNPNP device assembly 210 snaps back to +/−$V_{H}$. Current in absolute value subsequently increases again at voltages in absolute values across first and second pads 61 and 62 exceeding +/−$V_{H}$. In the illustrated example, the device withstands +/−20 A without noticeable device degradation. In addition, throughout the transition of the bipolar PNPNP device assembly 210 from the high to low impedance states and subsequently to about +/−9V across the first and second pads 61 and 62 after triggering, the triggering voltage of the first and second parasitic PNPN device assemblies 220 and 230 have not been exceeded, as indicated by the absence of secondary snap back events.

Figure 15:
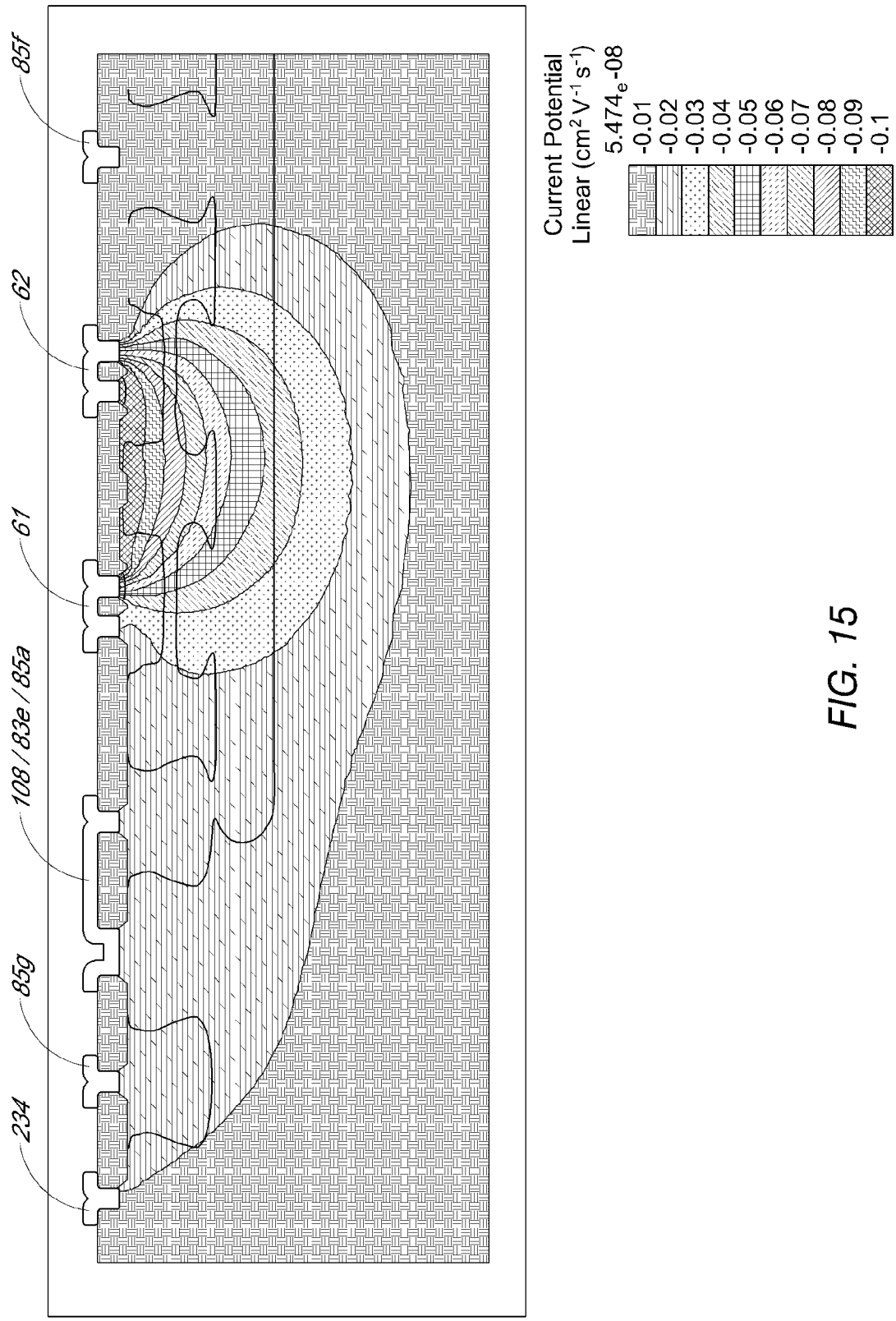
FIG. 15 is a cross section view of simulated equi-current potential contours of a bidirectional protection device for transceiver signal isolation according to one embodiment.

FIG. 15 shows a simulated current contour map of one embodiment of a bidirectional protection device similar to the bidirectional protection device 310 of FIG. 13A. In this embodiment, as in FIG. 13A, P+ region 83e and N+ region 85a are electrically connected through the twelfth resistor 108. N+ region 85f is electrically floating and N+ region 85g is connected to 5V. The contour map represents a cross-sectional view of spatial current density when a negative voltage sweep is performed on the second pad 62 while the first pad 61 and P+ region 83f are both connected to a substrate at ground potential. As discussed in connection with FIG. 10, in an embodiment, the HVPW 82f may be connected to the substrate of a transceiver at ground potential through a Kelvin connection 234 and the first pad 61 may be connected to the substrate of a transceiver at ground potential through a high current rail. The contour map shows the highest level of current potential at 0.1 between the first and second pads 61 and 62 near the surface region corresponding to the PNPNP device assembly, which includes the NPN bi-directional bipolar transistor 63, the first PNP bipolar transistor 64, and the second PNP bipolar transistor 65. In contrast, the contour map shows less than $10^{-9}$ of current potential between the second pad 62 and P+ region 83f connected to substrate at ground potential. It indicates that current conduction is substantially larger and dominant between pads 61 and 62.

Applications

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a p-type substrate;
   a first n-type well region, a second n-type well region, and a first p-type well region configured to form an NPN bi-directional transistor formed in the p-type substrate;
   a first p-type active region disposed in the first n-type well region and a second p-type active region disposed in the second n-type well region;
   a p-type tub surrounding the NPN bi-directional transistor and in physical contact with the first n-type well region, the second n-type well region and the first p-type well region;
   an n-type tub surrounding the p-type tub;
   a p-type epitaxial region surrounding the n-type tub;
   wherein the first n-type well region, the p-type tub, and the n-type tub are configured to form a first parasitic NPN bipolar transistor; and
   wherein the p-type epitaxial region, the n-type tub, and the p-type tub are configured to form a parasitic PNP bipolar transistor.

2. The apparatus of claim 1, wherein the p-type epitaxial region is configured to form an emitter of the parasitic PNP bipolar transistor, and wherein the n-type tub is configured to form a base of the parasitic PNP bipolar transistor.

3. The apparatus of claim 2, wherein the emitter and the base of the parasitic PNP bipolar transistor are connected through a first resistor formed in the p-type epitaxial region.

4. The apparatus of claim 3, wherein the p-type epitaxial region and the n-type tub of the parasitic PNP bipolar transistor are further electrically connected through a second resistor formed on the p-type substrate, the second resistor and the first resistor being connected electrically in series between the emitter and the base of the parasitic PNP bipolar transistor.

5. The apparatus of claim 1, wherein the p-type epitaxial region, the n-type tub, the p-type tub, and the first n-type well region are configured to form a first parasitic PNPN silicon-controlled rectifier.

6. The apparatus of claim 3, wherein the p-type tub comprises a p-type deep well layer disposed in the p-type substrate, a second p-type well region adjacent a first side of the first n-type well region, and a third p-type well region adjacent a first side of the second n-type well region, wherein the p-type deep well layer, the second p-type well region, and the third p-type well region are continuously electrically connected.

7. The apparatus of claim 6, wherein the p-type tub is configured to be electrically floating.

8. The apparatus of claim 1, wherein the second n-type region, the p-type tub, and the n-type tub are configured to form a second parasitic NPN bipolar transistor.

9. The apparatus of claim 1, wherein the p-type epitaxial region and the n-type tub, the p-type tub, and the second n-type well region are configured to form a second parasitic PNPN silicon-controlled rectifier.

10. The apparatus of claim 3, wherein the n-type tub comprises an n-type buried layer disposed in the p-type substrate, a third n-type well region adjacent a first side of the p-type tub, and a fourth n-type well region adjacent a second side of the p-type tub.

11. The apparatus of claim 10, further comprising a fourth p-type well region adjacent a first side of the third n-type well region, and a fifth p-type well region adjacent a first side of the fourth n-type well region.

12. The apparatus of claim 11, further comprising a second resistor formed on the p-type substrate adjacent the fourth n-type well region and the fifth p-type well region.

13. The apparatus of claim 1, further comprising a first n-type active region disposed in the first n-type well region and a second n-type active region disposed in the second n-type well region.

14. The apparatus of claim 13, further comprising a first pad and a second pad, wherein the first pad is electrically connected to the first n-type active region and the first p-type active region, and wherein the second pad is electrically connected to the second n-type active region and the second p-type active region.

15. The apparatus of claim 14, further comprising a first electrical connection between a third p-type active region electrically connected to the p-type substrate at a substrate potential and a second electrical connection between one of first or second pads and the p-type substrate at the substrate potential.

16. The apparatus of claim 15, wherein the first electrical connection has a first resistance and the second electrical connection has a second resistance, wherein the first resistance is higher than the second resistance.

17. The apparatus of claim 15, wherein the third p-type active region is electrically connected to the emitter of the parasitic PNP bipolar transistor.

18. An apparatus comprising:
   a p-type substrate;
   a first n-type well region, a second n-type well region, and a first p-type well region configured to form an NPN bi-directional transistor formed in the p-type substrate;
   a p-type tub surrounding the NPN bi-directional transistor and in physical contact with the first n-type well region, the second n-type well region and the first p-type well region;
   an n-type tub surrounding the p-type tub;
   a p-type epitaxial region surrounding the n-type tub;
   wherein the first n-type well region, the p-type tub, and the n-type tub are configured to form a first parasitic NPN bipolar transistor;

wherein the p-type epitaxial region, the n-type tub, and the p-type tub are configured to form a parasitic PNP bipolar transistor;

wherein the p-type epitaxial region is configured to form an emitter of the parasitic PNP bipolar transistor, and wherein the n-type tub is configured to form a base of the parasitic PNP bipolar transistor;

wherein the emitter and the base of the parasitic PNP bipolar transistor are connected through a first resistor formed in the p-type epitaxial region;

wherein the n-type tub comprises an n-type buried layer disposed in the p-type substrate, a third n-type well region adjacent a first side of the p-type tub, and a fourth n-type well region adjacent a second side of the p-type tub; and wherein the NPN bi-directional transistor is arranged in an annular configuration, wherein the first p-type well concentrically surrounds the first n-type well, and wherein the second n-type well concentrically surrounds the first p-type well.

19. The apparatus of claim 18, wherein a third p-type well of the p-type tub surrounds the NPN bi-directional transistor, the fourth n-type well of the n-type tub surrounds the third p-type well, and the p-type epitaxial region surrounds the fourth n-type well.

20. The apparatus of claim 1, wherein the p-type epitaxial region is electrically connected to the p-type substrate.

21. The apparatus of claim 11, further comprising a fifth n-type well region adjacent a first side of the fifth p-type well region, and a sixth p-type well region adjacent a first side of the fifth n-type well region, wherein the p-type epitaxial region is disposed below each of the fifth p-type well region, the fifth n-type well region, and the sixth p-type well region.

22. The apparatus of claim 21, wherein the first resistor has a first resistor resistance deriving at least in part from the p-type epitaxial region.

23. The apparatus of claim 22, wherein the first resistor has a first resistance further deriving from the fifth p-type well region and the sixth p-type well region.

24. An apparatus comprising:
a p-type substrate;
a first n-type well region, a second n-type well region, and a first p-type well region in the p-type substrate, wherein the first n-type well region, the second n-type well region, and the first p-type well region are configured to form an NPN bi-directional transistor in the p-type substrate;
a p-type tub surrounding the NPN bi-directional transistor and in physical contact with the first n-type well region, the second n-type well region and the first p-type well region;
an n-type tub surrounding the p-type tub;
a p-type epitaxial region surrounding the n-type tub;
a first p-type active region disposed in the first n-type well region, wherein the first p-type active region, the first n-type well region, and the p-type tub are configured to form a first PNP bipolar transistor;
a second p-type active region disposed in the second n-type well region, wherein the second p-type active region, the second n-type well region, and the p-type tub are configured to form a second PNP bipolar transistor; and
wherein the p-type epitaxial region, the n-type tub, and the p-type tub form a parasitic PNP bipolar transistor.

25. The apparatus of claim 24, wherein the p-type epitaxial region is electrically connected to the p-type substrate.

26. The apparatus of claim 24, wherein the NPN bi-directional transistor, the first PNP bipolar transistor, and the second PNP bipolar transistor form a first bipolar PNPNP bidirectional structure.

27. The apparatus of claim 24, wherein the p-type epitaxial region is configured to form an emitter of the parasitic PNP bipolar transistor, and wherein the n-type tub is configured to include a base of the parasitic PNP bipolar transistor.

28. The apparatus of claim 24, wherein the emitter and the base of the parasitic PNP bipolar transistor are connected through a first resistor of the p-type epitaxial region.

29. The apparatus of claim 28, wherein the p-type epitaxial region and the n-type tub of the parasitic PNP bipolar transistor are further electrically connected through a second resistor formed on the p-type substrate, the second resistor and the first resistor being connected electrically in series between the emitter and the base.

30. The apparatus of claim 24, wherein the p-type tub is configured to be electrically floating.

31. The apparatus of claim 24, wherein the n-type tub comprises an n-type buried layer disposed in the p-type substrate, a third n-type well region adjacent a first side of the p-type tub, and a fourth n-type well region adjacent a second side of the p-type tub.

32. The apparatus of claim 24, wherein the NPN bi-directional transistor is arranged in an annular configuration, wherein the first p-type well concentrically surrounds the first n-type well, and wherein the second n-type well concentrically surrounds the first p-type well.

33. The apparatus of claim 32, wherein a third p-type well of the p-type tub surrounds the NPN bi-directional transistor, the fourth n-type well of the n-type tub surrounds the third p-type well, and the p-type epitaxial region surrounds the fourth n-type well.

* * * * *